(12) United States Patent
Wang et al.

(10) Patent No.: US 12,133,184 B2
(45) Date of Patent: Oct. 29, 2024

(54) CANCELLATION OF SIDELINK AUTOMATIC GAIN CONTROL SYMBOL

(71) Applicant: QUALCOMM Incorporated, San Diego, CA (US)

(72) Inventors: Xiaojie Wang, Hillsborough, NJ (US); Xiaoxia Zhang, San Diego, CA (US); Piyush Gupta, Bridgewater, NJ (US); Junyi Li, Fairless Hills, PA (US); Jing Sun, San Diego, CA (US); Sony Akkarakaran, Poway, CA (US); Peter Gaal, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 586 days.

(21) Appl. No.: 17/371,003

(22) Filed: Jul. 8, 2021

(65) Prior Publication Data
US 2023/0007969 A1    Jan. 12, 2023

(51) Int. Cl.
*H04W 72/12*    (2023.01)
*H04W 52/52*    (2009.01)
*H04W 72/0446*    (2023.01)
*H04W 72/0453*    (2023.01)

(52) U.S. Cl.
CPC ....... *H04W 52/52* (2013.01); *H04W 72/0446* (2013.01); *H04W 72/0453* (2013.01); *H04W 72/12* (2013.01)

(58) Field of Classification Search
CPC ............................ H04W 72/12; H04W 72/0453
USPC ........................................................... 370/330
See application file for complete search history.

(56) References Cited

U.S. PATENT DOCUMENTS

| | | | | |
|---|---|---|---|---|
| 2021/0274470 A1* | 9/2021 | Ryu | ...................... | H04W 76/36 |
| 2021/0409993 A1* | 12/2021 | Fakoorian | .............. | H04B 17/24 |
| 2022/0256403 A1* | 8/2022 | Wang | .................... | H04W 28/26 |

* cited by examiner

*Primary Examiner* — Angel T Brockman
(74) *Attorney, Agent, or Firm* — Arun Swain

(57) ABSTRACT

Aspects relate to techniques for facilitating sidelink cancellation of an automatic gain control (AGC) symbol of a sidelink transmission. A network entity, such as a base station, may transmit sidelink scheduling information scheduling a sidelink transmission from a transmitting wireless communication device to a receiving wireless communication device. The network entity may further transmit a cancellation indication indicating an overlap between an AGC symbol of time resources allocated for the sidelink transmission and an additional transmission. Based on the cancellation indication, the transmitting wireless communication device may selectively transmit the sidelink transmission.

30 Claims, 20 Drawing Sheets

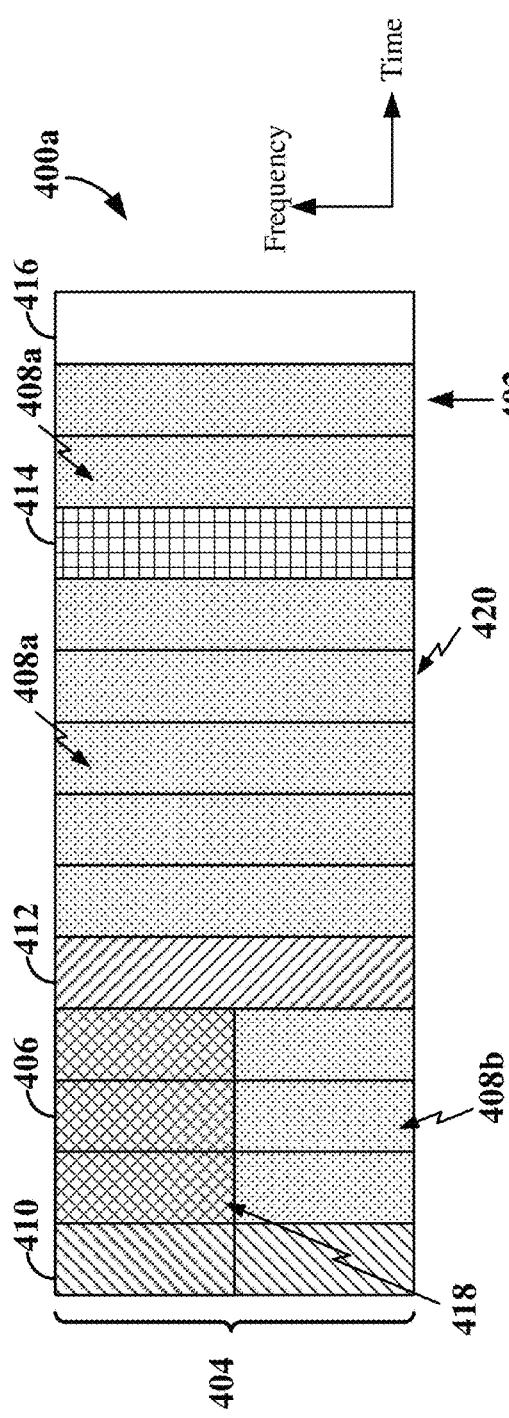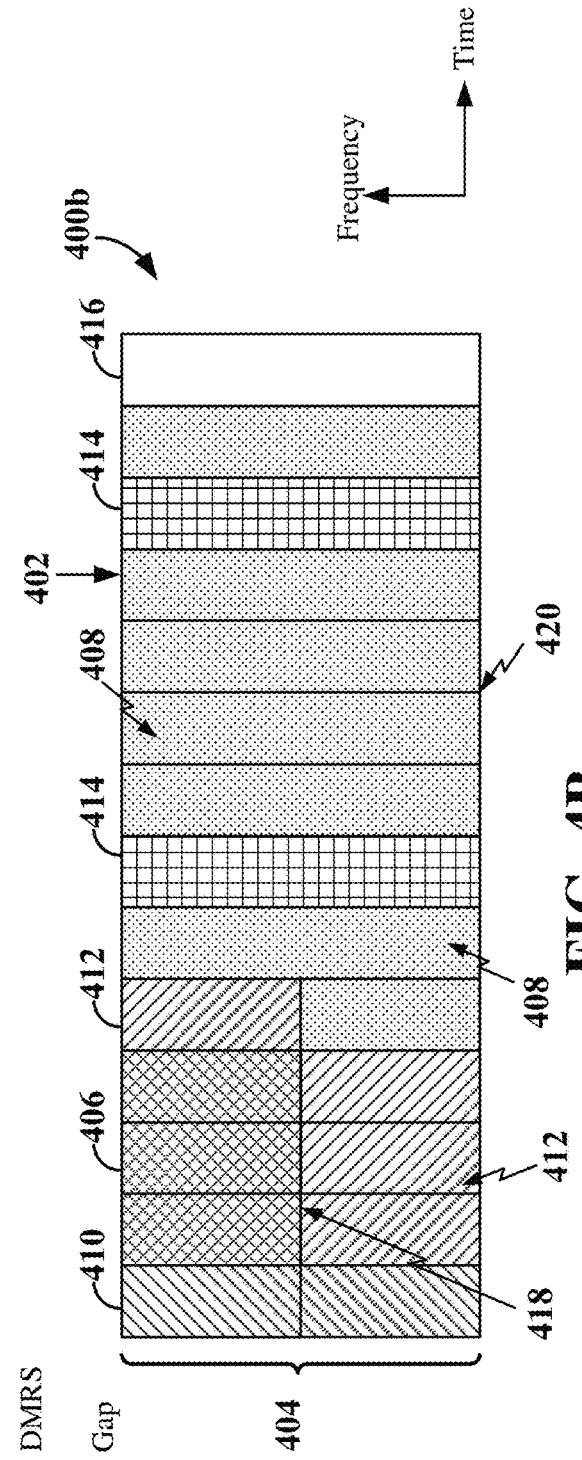
FIG. 4A
FIG. 4B

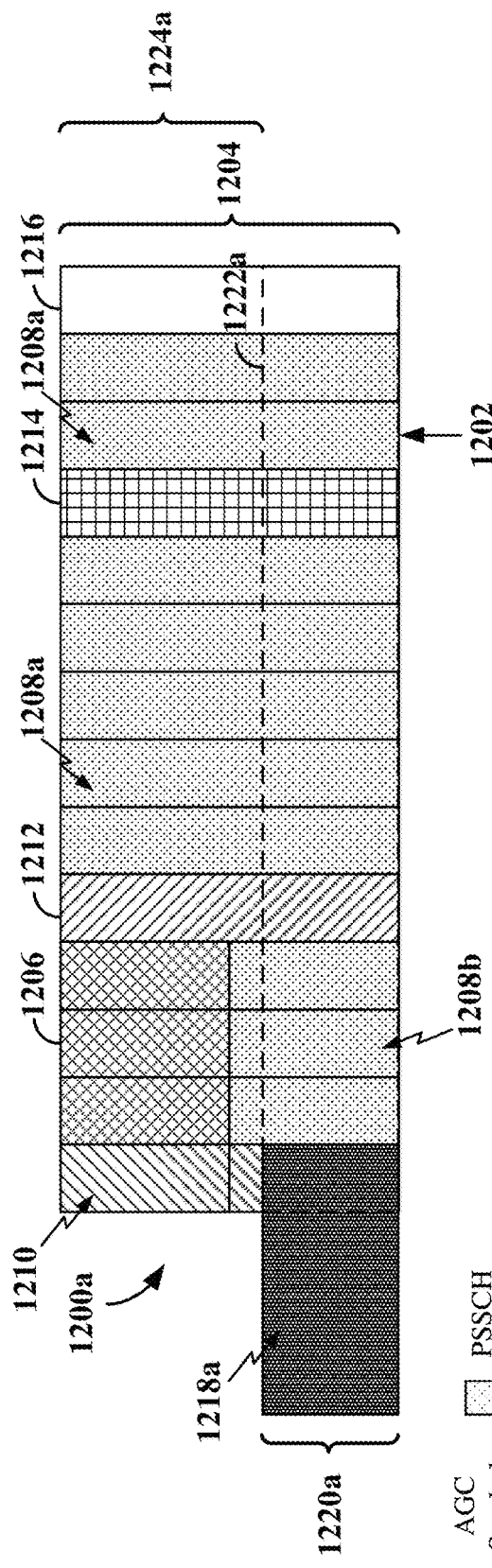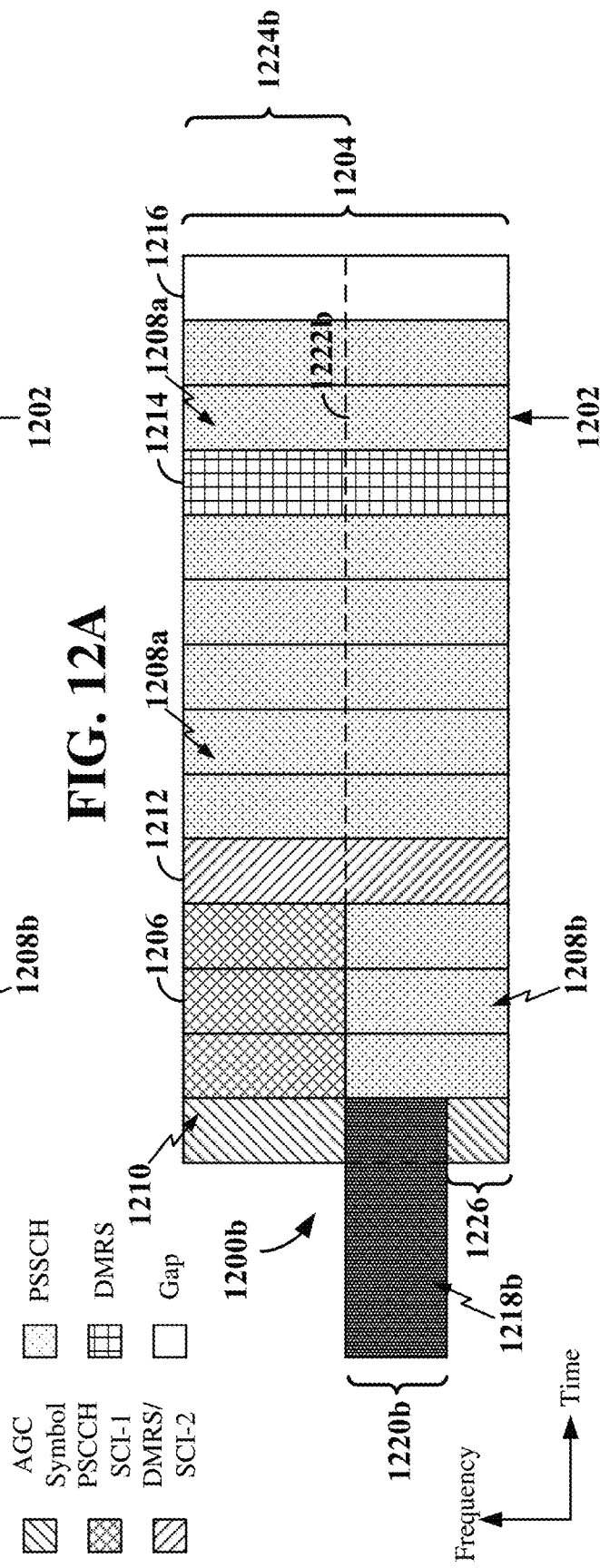
FIG. 12A
FIG. 12B

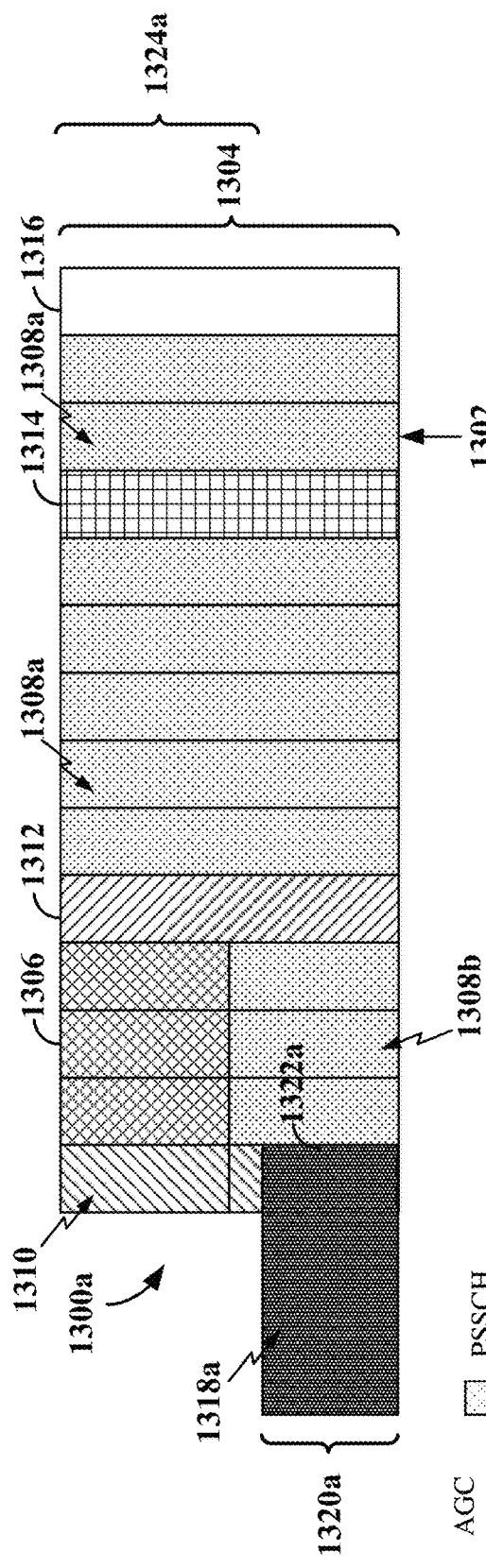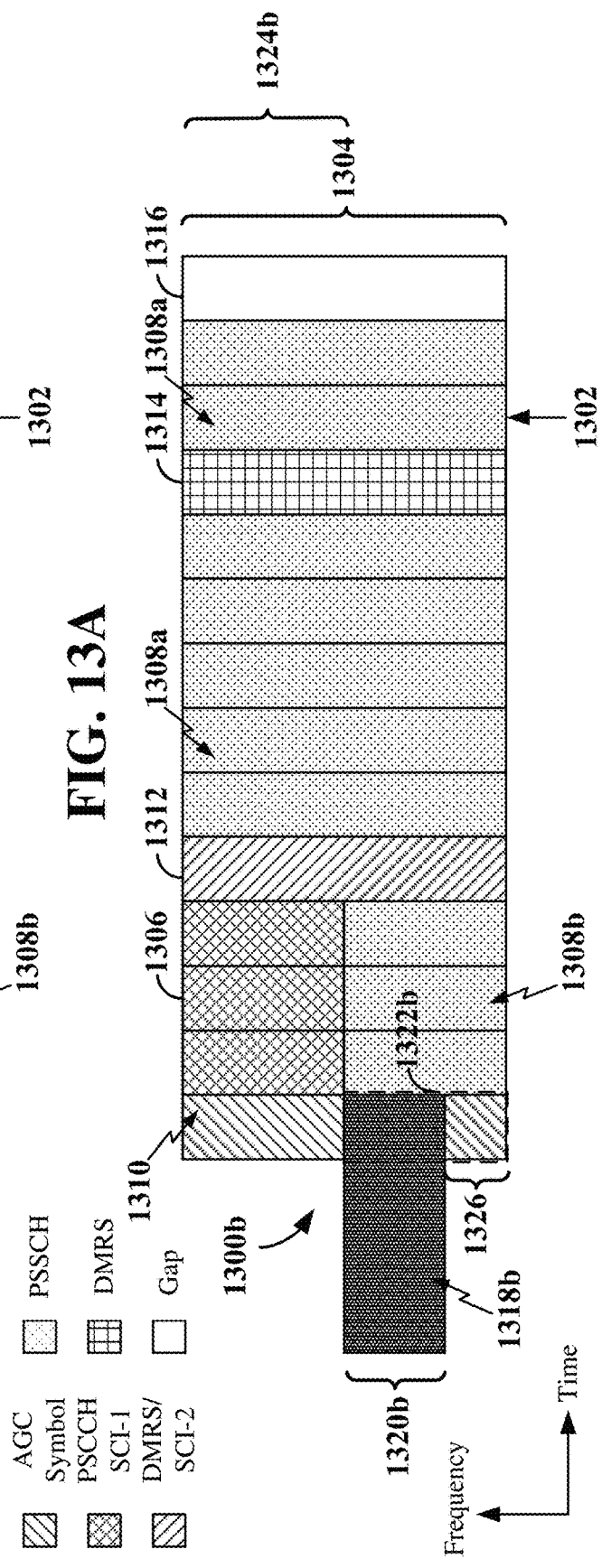
FIG. 13A
FIG. 13B

US 12,133,184 B2

CANCELLATION OF SIDELINK AUTOMATIC GAIN CONTROL SYMBOL

CROSS-REFERENCE TO RELATED APPLICATIONS

The present application is related to co-filed U.S. application Ser. No. 17/370,991 also filed on Jul. 8, 2021, co-filed U.S. application Ser. No. 17/370,993 also filed on Jul. 8, 2021, and co-filed U.S. application Ser. No. 17/370,997 also filed on Jul. 8, 2021.

TECHNICAL FIELD

The technology discussed below relates generally to wireless communication networks, and more particularly, to a sidelink cancellation indication for cancelling previously scheduled sidelink traffic.

BACKGROUND

Wireless communication between devices may be facilitated by various network configurations. In one configuration, a cellular network may enable user equipment (UEs) to communicate with one another through signaling with a nearby base station or cell. Another wireless communication network configuration is a device to device (D2D) network in which UEs may signal one another directly, rather than via an intermediary base station or cell. For example, D2D communication networks may utilize sidelink signaling to facilitate the direct communication between UEs over a proximity service (ProSe) PC5 interface. In some sidelink network configurations, UEs may further communicate in a cellular network, generally under the control of a base station. Thus, the UEs may be configured for uplink and downlink signaling via a base station and further for sidelink signaling directly between the UEs without transmissions passing through the base station.

Sidelink communication may be autonomously scheduled (e.g., self-scheduled) by the UEs or may be scheduled by the base station. For example, the base station may transmit sidelink scheduling information to schedule sidelink communication between UEs via downlink control information. In some examples, a common carrier may be shared between the sidelink network and the cellular network, such that the resources on the common carrier may be allocated for both sidelink communication and cellular communication (e.g., uplink and downlink communication). For example, the base station may schedule sidelink traffic on uplink resources utilized for both uplink transmissions and sidelink transmissions or on downlink resources utilized for both downlink transmissions and sidelink transmissions.

BRIEF SUMMARY OF SOME EXAMPLES

The following presents a summary of one or more aspects of the present disclosure, in order to provide a basic understanding of such aspects. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

In one example, a transmitting wireless communication device in a wireless communication network is disclosed. The transmitting wireless communication device includes a transceiver, a memory, and a processor coupled to the transceiver and the memory. The processor and the memory can be configured to receive sidelink scheduling information scheduling a sidelink transmission from the transmitting wireless communication device to a receiving wireless communication device from a network entity in the wireless communication network via the transceiver. The sidelink scheduling information can include frequency resources and time resources allocated for the sidelink transmission. The processor and the memory can further be configured to receive control information from the network entity via the transceiver. The control information can include a cancellation indication indicating an overlap between an automatic gain control symbol of the time resources allocated for the sidelink transmission and an additional transmission. The processor and the memory can further be configured to selectively transmit the sidelink transmission via the transceiver to the receiving wireless communication device based on the cancellation indication.

Another example provides method for wireless communication at a transmitting wireless communication device in a wireless communication network. The method can include receiving sidelink scheduling information scheduling a sidelink transmission from the transmitting wireless communication device to a receiving wireless communication device from a network entity in the wireless communication network. The sidelink sidelink scheduling information can include frequency resources and time resources allocated for the sidelink transmission. The method can further include receiving control information from the network entity. The control information can include a cancellation indication indicating an overlap between an automatic gain control symbol of the time resources allocated for the sidelink transmission and an additional transmission. The method can further include selectively transmitting the sidelink transmission to the receiving wireless communication device based on the cancellation indication.

Another example provides a transmitting wireless communication device in a wireless communication network. The transmitting wireless communication device can include means for receiving sidelink scheduling information scheduling a sidelink transmission from the transmitting wireless communication device to a receiving wireless communication device from a network entity in the wireless communication network. The sidelink sidelink scheduling information can include frequency resources and time resources allocated for the sidelink transmission. The transmitting wireless communication device can further include means for receiving control information from the network entity. The control information can include a cancellation indication indicating an overlap between an automatic gain control symbol of the time resources allocated for the sidelink transmission and an additional transmission. The transmitting wireless communication device can further include means for selectively transmitting the sidelink transmission to the receiving wireless communication device based on the cancellation indication.

These and other aspects will become more fully understood upon a review of the detailed description, which follows. Other aspects, features, and examples will become apparent to those of ordinary skill in the art, upon reviewing the following description of specific, exemplary examples of in conjunction with the accompanying figures. While features may be discussed relative to certain examples and figures below, all examples can include one or more of the advantageous features discussed herein. In other words, while one or more examples may be discussed as having certain advantageous features, one or more of such features may also be used in accordance with the various examples discussed herein. In similar fashion, while exemplary examples may be discussed below as device, system, or method examples such exemplary examples can be implemented in various devices, systems, and methods.

BRIEF DESCRIPTION OF THE DRAWINGS

FIGS. 4A and 4B are diagrams illustrating examples of sidelink slot structures according to some aspects.

FIGS. 12A and 12B are diagrams illustrating exemplary overlaps between an automatic gain control (AGC) symbol of a sidelink transmission and an additional transmission according to some aspects.

FIGS. 13A and 13B are diagrams illustrating other exemplary overlaps between an AGC symbol of a sidelink transmission and an additional transmission according to some aspects.

DETAILED DESCRIPTION

Figure 1:
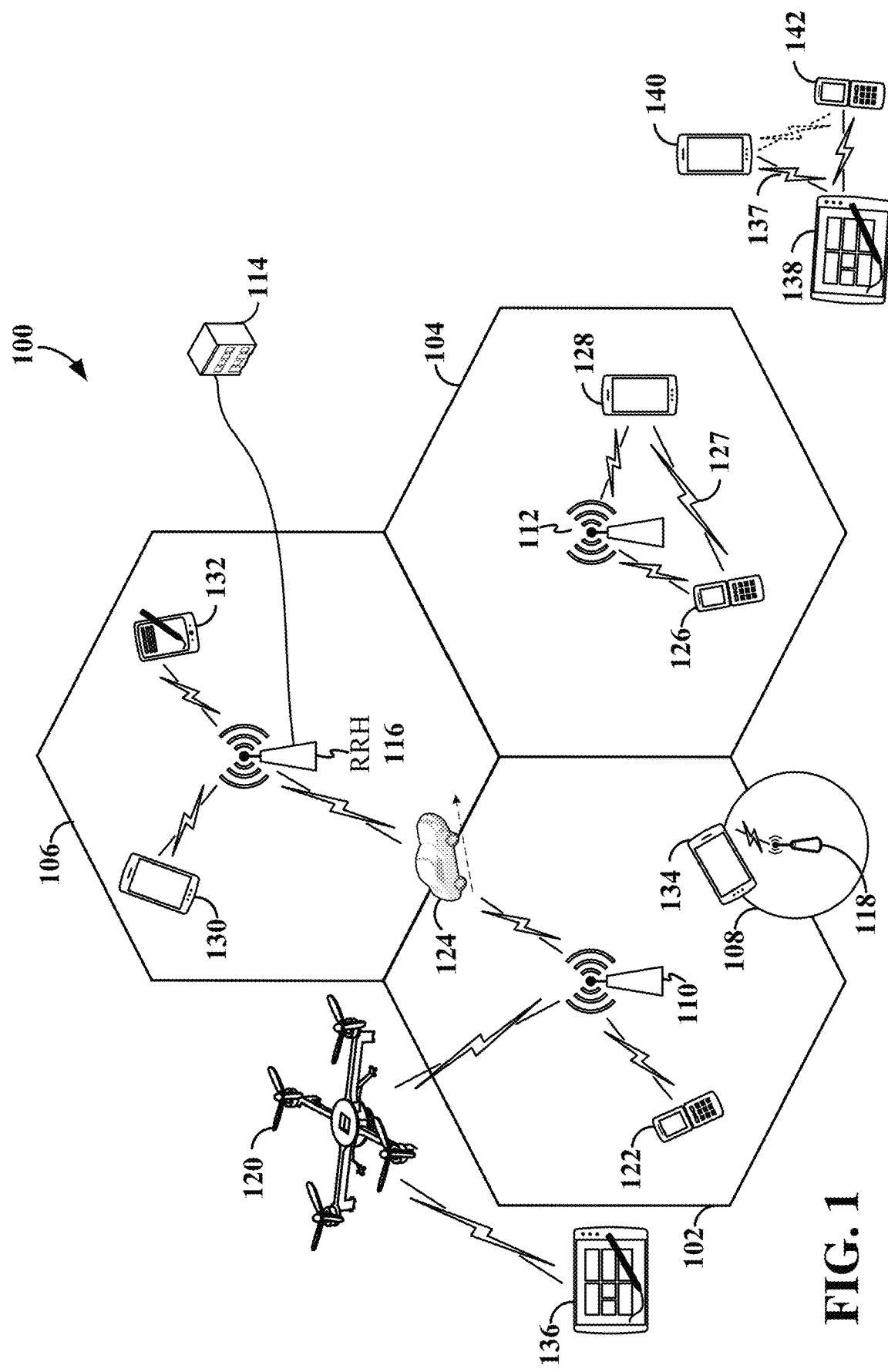
FIG. 1 is a diagram illustrating an example of a wireless radio access network according to some aspects.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Various aspects of the disclosure relate to techniques for consideration of the impact to automatic gain control (AGC) calibration based on the overlapping resources including at least a portion of the AGC symbol. For example, the transmitting UE may cancel the overlapping frequency resources across all symbols of the sidelink transmission (e.g., all symbols of a slot carrying the sidelink transmission) or in just the overlapping AGC symbol. As another example, the transmitting UE may not cancel any portion of the AGC symbol regardless of whether there is overlap with the AGC symbol. As yet another example, the transmitting UE may delay the sidelink transmission by one symbol.

While aspects and examples are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, aspects and/or uses may come about via integrated chip examples and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described examples. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. The RAN 100 may implement any suitable wireless communication technology or technologies to provide radio access. As one example, the RAN 100 may operate according to 3$^{rd}$ Generation Partnership Project (3GPP) New Radio (NR) specifications, often referred to as 5G. As another example, the RAN 100 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

The geographic region covered by the radio access network 100 may be divided into a number of cellular regions (cells) that can be uniquely identified by a user equipment (UE) based on an identification broadcasted over a geographical area from one access point or base station. FIG. 1 illustrates cells 102, 104, 106, and cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), a transmission and reception point (TRP), or some other suitable terminology. In some examples, a base station may include two or more TRPs that may be collocated or non-collocated. Each TRP may communicate on the same or different carrier frequency within the same or different frequency band. In examples where the RAN 100 operates according to both the LTE and 5G NR standards, one of the base stations may be an LTE base station, while another base station may be a 5G NR base station.

Various base station arrangements can be utilized. For example, in FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the cell 108 which may overlap with one or more macrocells. In this example, the cell 108 may be referred to as a small cell (e.g., a microcell, picocell, femtocell, home base station, home Node B, home eNode B, etc.), as the base station 118 supports a cell having a relatively small size. Cell sizing can be done according to system design as well as component constraints.

It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes an unmanned aerial vehicle (UAV) 120, which may be a drone or quadcopter. The UAV 120 may be configured to function as a base station, or more specifically as a mobile base station. That is, in some examples, a cell may not necessarily be stationary, and the geographic area of the cell may move according to the location of a mobile base station such as the UAV 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The RAN 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc., an industrial automation and enterprise device, a logistics controller, agricultural equipment, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the RAN 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells. In some examples, the UAV 120 (e.g., the quadcopter) can be a mobile network node and may be configured to function as a UE. For example, the UAV 120 may operate within cell 102 by communicating with base station 110.

Wireless communication between a RAN 100 and a UE (e.g., UE 122 or 124) may be described as utilizing an air interface. Transmissions over the air interface from a base station (e.g., base station 110) to one or more UEs (e.g., UE 122 and 124) may be referred to as downlink (DL) transmission. In accordance with certain aspects of the present disclosure, the term downlink may refer to a point-to-multipoint transmission originating at a scheduling entity (described further below; e.g., base station 110). Another way to describe this scheme may be to use the term broadcast channel multiplexing. Transmissions from a UE (e.g., UE 122) to a base station (e.g., base station 110) may be referred to as uplink (UL) transmissions. In accordance with further aspects of the present disclosure, the term uplink may refer to a point-to-point transmission originating at a scheduled entity (described further below; e.g., UE 122).

For example, DL transmissions may include unicast or broadcast transmissions of control information and/or traffic information (e.g., user data traffic) from a base station (e.g., base station 110) to one or more UEs (e.g., UEs 122 and 124), while UL transmissions may include transmissions of control information and/or traffic information originating at a UE (e.g., UE 122). In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Within the present disclosure, a frame may refer to a predetermined duration (e.g., 10 ms) for wireless transmissions, with each frame consisting of, for example, 10 subframes of 1 ms each. Of course, these definitions are not required, and any suitable scheme for organizing waveforms may be utilized, and various time divisions of the waveform may have any suitable duration.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). For example, two or more UEs (e.g., UEs 138, 140, and 142) may communicate with each other using sidelink signals 137 without relaying that communication through a base station. In some examples, the UEs 138, 140, and 142 may each function as a scheduling entity or transmitting sidelink device and/or a scheduled entity or a receiving sidelink device to schedule resources and communicate sidelink signals 137 therebetween without relying on scheduling or control information from a base station. In other examples, two or more UEs (e.g., UEs 126 and 128) within the coverage area of a base station (e.g., base station 112) may also communicate sidelink signals 127 over a direct link (sidelink) without conveying that communication through the base station 112. In this example, the base station 112 may allocate resources to the UEs 126 and 128 for the sidelink communication. In either case, such sidelink signaling 127 and 137 may be implemented in a peer-to-peer (P2P) network, a device-to-device (D2D) network, a vehicle-to-vehicle (V2V) network, a vehicle-to-everything (V2X) network, a mesh network, or other suitable direct link network.

In some examples, a D2D relay framework may be included within a cellular network to facilitate relaying of communication to/from the base station 112 via D2D links (e.g., sidelinks 127 or 137). For example, one or more UEs (e.g., UE 128) within the coverage area of the base station 112 may operate as relaying UEs to extend the coverage of the base station 112, improve the transmission reliability to one or more UEs (e.g., UE 126), and/or to allow the base station to recover from a failed UE link due to, for example, blockage or fading.

Two primary technologies that may be used by V2X networks include dedicated short range communication (DSRC) based on IEEE 802.11p standards and cellular V2X based on LTE and/or 5G (New Radio) standards. Various aspects of the present disclosure may relate to New Radio (NR) cellular V2X networks, referred to herein as V2X networks, for simplicity. However, it should be understood that the concepts disclosed herein may not be limited to a particular V2X standard or may be directed to sidelink networks other than V2X networks.

In order for transmissions over the air interface to obtain a low block error rate (BLER) while still achieving very high data rates, channel coding may be used. That is, wireless communication may generally utilize a suitable error correcting block code. In a typical block code, an information message or sequence is split up into code blocks (CBs), and an encoder (e.g., a CODEC) at the transmitting device then mathematically adds redundancy to the information message. Exploitation of this redundancy in the encoded information message can improve the reliability of the message, enabling correction for any bit errors that may occur due to the noise.

Data coding may be implemented in multiple manners. In early 5G NR specifications, user data is coded using quasi-cyclic low-density parity check (LDPC) with two different base graphs: one base graph is used for large code blocks and/or high code rates, while the other base graph is used otherwise. Control information and the physical broadcast channel (PBCH) are coded using Polar coding, based on nested sequences. For these channels, puncturing, shortening, and repetition are used for rate matching.

Aspects of the present disclosure may be implemented utilizing any suitable channel code. Various implementations of base stations and UEs may include suitable hardware and capabilities (e.g., an encoder, a decoder, and/or a CODEC) to utilize one or more of these channel codes for wireless communication.

In the RAN 100, the ability for a UE to communicate while moving, independent of their location, is referred to as mobility. The various physical channels between the UE and the RAN are generally set up, maintained, and released under the control of an access and mobility management function (AMF). In some scenarios, the AMF may include a security context management function (SCMF) and a security anchor function (SEAF) that performs authentication. The SCMF can manage, in whole or in part, the security context for both the control plane and the user plane functionality.

In some examples, a RAN 100 may enable mobility and handovers (i.e., the transfer of a UE's connection from one radio channel to another). For example, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In various implementations, the air interface in the RAN 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the RAN 100 may utilize one or more multiplexing and multiple access algorithms to enable simultaneous communication of the various devices. For example, 5G NR specifications provide multiple access for UL or reverse link transmissions from UEs 122 and 124 to base station 110, and for multiplexing DL or forward link transmissions from the base station 110 to UEs 122 and 124 utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

Further, the air interface in the RAN 100 may utilize one or more duplexing algorithms Duplex refers to a point-to-point communication link where both endpoints can communicate with one another in both directions. Full-duplex means both endpoints can simultaneously communicate with one another. Half-duplex means only one endpoint can send information to the other at a time. Half-duplex emulation is frequently implemented for wireless links utilizing time division duplex (TDD). In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot. In a wireless link, a full-duplex channel generally relies on physical isolation of a transmitter and receiver, and suitable interference cancellation technologies. Full-duplex emulation is frequently implemented for wireless links by utilizing frequency division duplex (FDD) or spatial division duplex (SDD). In FDD, transmissions in different directions may operate at different carrier frequencies (e.g., within paired spectrum). In SDD, transmissions in different directions on a given channel are separated from one another using spatial division multiplexing (SDM). In other examples, full duplex communication may be implemented within unpaired spectrum (e.g., within a single carrier bandwidth), where transmissions in different directions occur within different sub-bands of the carrier bandwidth. This type of full-duplex communication may be referred to herein as sub-band full duplex (SBFD), also known as flexible duplex.

Various aspects of the present disclosure will be described with reference to an OFDM waveform, schematically illustrated in FIG. 2. It should be understood by those of ordinary skill in the art that the various aspects of the present disclosure may be applied to an SC-FDMA waveform in substantially the same way as described herein below. That is, while some examples of the present disclosure may focus on an OFDM link for clarity, it should be understood that the same principles may be applied as well to SC-FDMA waveforms.

Figure 2:
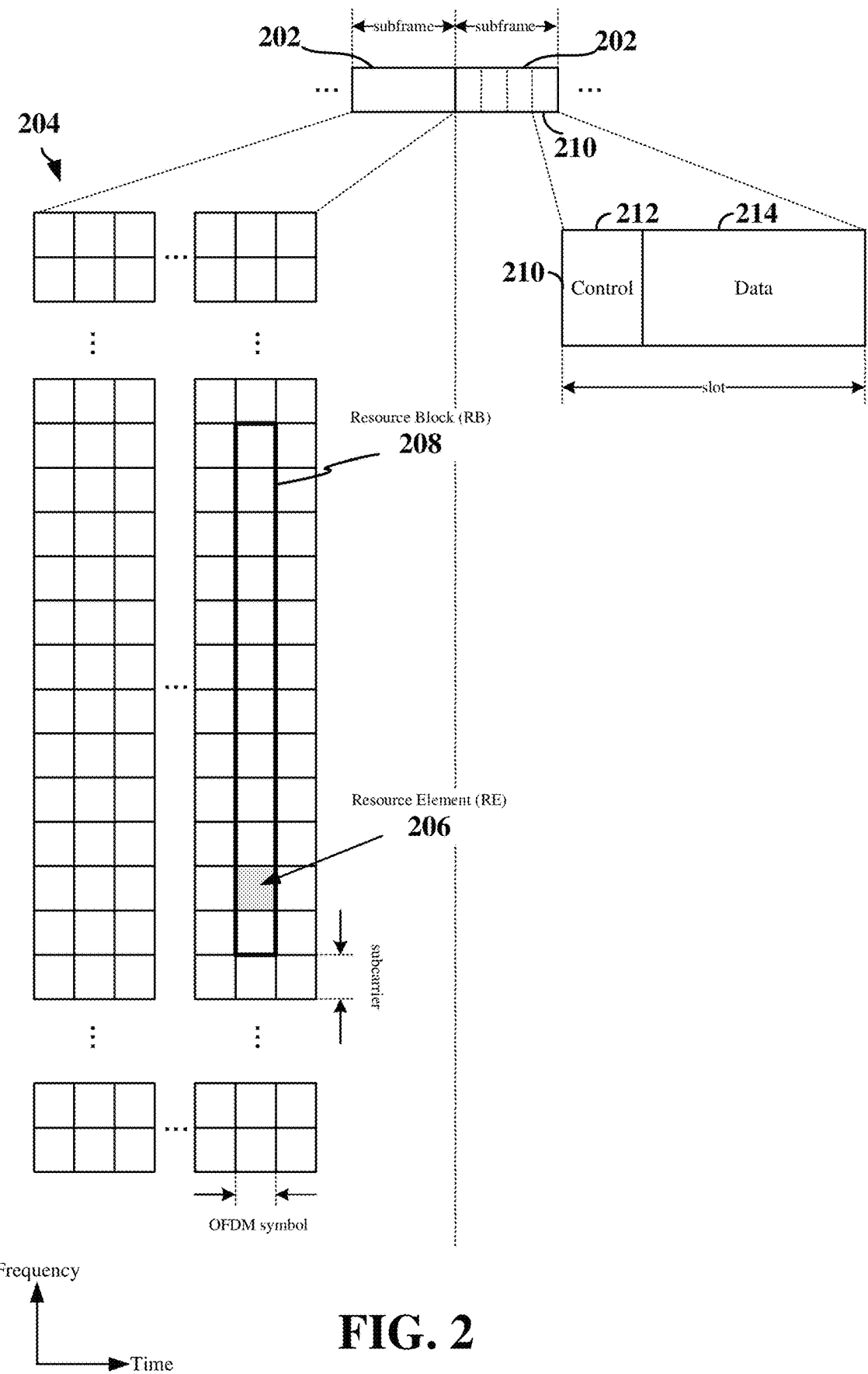
FIG. 2 is a diagram illustrating an example of a frame structure for use in a wireless communication network according to some aspects.

Referring now to FIG. 2, an expanded view of an exemplary subframe 202 is illustrated, showing an OFDM resource grid. However, as those skilled in the art will readily appreciate, the PHY transmission structure for any particular application may vary from the example described here, depending on any number of factors. Here, time is in the horizontal direction with units of OFDM symbols; and frequency is in the vertical direction with units of subcarriers of the carrier.

The resource grid 204 may be used to schematically represent time-frequency resources for a given antenna port. That is, in a multiple-input-multiple-output (MIMO) implementation with multiple antenna ports available, a corresponding multiple number of resource grids 204 may be available for communication. The resource grid 204 is divided into multiple resource elements (REs) 206. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or more simply a resource block (RB) 208, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain. Within the present disclosure, it is assumed that a single RB such as the RB 208 entirely corresponds to a single direction of communication (either transmission or reception for a given device).

A set of continuous or discontinuous resource blocks may be referred to herein as a Resource Block Group (RBG), sub-band, or bandwidth part (BWP). A set of sub-bands or BWPs may span the entire bandwidth. Scheduling of UEs or sidelink devices (hereinafter collectively referred to as UEs) for downlink, uplink, or sidelink transmissions typically involves scheduling one or more resource elements 206 within one or more sub-bands or bandwidth parts (BWPs). Thus, a UE generally utilizes only a subset of the resource grid 204. In some examples, an RB may be the smallest unit of resources that can be allocated to a UE. Thus, the more RBs scheduled for a UE, and the higher the modulation scheme chosen for the air interface, the higher the data rate for the UE. The RBs may be scheduled by a base station (e.g., gNB, eNB, etc.) or may be self-scheduled by a UE/sidelink device implementing D2D sidelink communication.

In this illustration, the RB 208 is shown as occupying less than the entire bandwidth of the subframe 202, with some subcarriers illustrated above and below the RB 208. In a given implementation, the subframe 202 may have a bandwidth corresponding to any number of one or more RBs 208. Further, in this illustration, the RB 208 is shown as occupying less than the entire duration of the subframe 202, although this is merely one possible example.

Each 1 ms subframe 202 may consist of one or multiple adjacent slots. In the example shown in FIG. 2, one subframe 202 includes four slots 210, as an illustrative example. In some examples, a slot may be defined according to a specified number of OFDM symbols with a given cyclic prefix (CP) length. For example, a slot may include 7 or 12 OFDM symbols with a nominal CP. Additional examples may include mini-slots, sometimes referred to as shortened transmission time intervals (TTIs), having a shorter duration (e.g., one to three OFDM symbols). These mini-slots or shortened transmission time intervals (TTIs) may in some cases be transmitted occupying resources scheduled for ongoing slot transmissions for the same or for different UEs. Any number of resource blocks may be utilized within a subframe or slot.

An expanded view of one of the slots 210 illustrates the slot 210 including a control region 212 and a data region 214. In general, the control region 212 may carry control channels, and the data region 214 may carry data channels. Of course, a slot may contain all DL, all UL, or at least one DL portion and at least one UL portion. The structure illustrated in FIG. 2 is merely exemplary in nature, and different slot structures may be utilized, and may include one or more of each of the control region(s) and data region(s).

Although not illustrated in FIG. 2, the various REs 206 within a RB 208 may be scheduled to carry one or more physical channels, including control channels, shared channels, data channels, etc. Other REs 206 within the RB 208 may also carry pilots or reference signals. These pilots or reference signals may provide for a receiving device to perform channel estimation of the corresponding channel, which may enable coherent demodulation/detection of the control and/or data channels within the RB 208.

In some examples, the slot 210 may be utilized for broadcast, multicast, groupcast, or unicast communication. For example, a broadcast, multicast, or groupcast communication may refer to a point-to-multipoint transmission by one device (e.g., a base station, UE, or other similar device) to other devices. Here, a broadcast communication is delivered to all devices, whereas a multicast or groupcast communication is delivered to multiple intended recipient devices. A unicast communication may refer to a point-to-point transmission by a one device to a single other device.

In an example of cellular communication over a cellular carrier via a Uu interface, for a DL transmission, the scheduling entity (e.g., a base station) may allocate one or more REs 206 (e.g., within the control region 212) to carry DL control information including one or more DL control channels, such as a physical downlink control channel (PDCCH), to one or more scheduled entities (e.g., UEs). The PDCCH carries downlink control information (DCI) including but not limited to power control commands (e.g., one or more open loop power control parameters and/or one or more closed loop power control parameters), scheduling information, a grant, and/or an assignment of REs for DL and UL transmissions. The PDCCH may further carry HARQ feedback transmissions such as an acknowledgment (ACK) or negative acknowledgment (NACK). HARQ is a technique well-known to those of ordinary skill in the art, wherein the integrity of packet transmissions may be checked at the receiving side for accuracy, e.g., utilizing any suitable integrity checking mechanism, such as a checksum or a cyclic redundancy check (CRC). If the integrity of the transmission is confirmed, an ACK may be transmitted, whereas if not confirmed, a NACK may be transmitted. In response to a NACK, the transmitting device may send a HARQ retransmission, which may implement chase combining, incremental redundancy, etc.

The base station may further allocate one or more REs 206 (e.g., in the control region 212 or the data region 214) to carry other DL signals, such as a demodulation reference signal (DMRS); a phase-tracking reference signal (PT-RS); a channel state information (CSI) reference signal (CSI-RS); and a synchronization signal block (SSB). SSBs may be broadcast at regular intervals based on a periodicity (e.g., 5, 10, 20, 20, 80, or 120 ms). An SSB includes a primary synchronization signal (PSS), a secondary synchronization signal (SSS), and a physical broadcast control channel (PBCH). A UE may utilize the PSS and SSS to achieve radio frame, subframe, slot, and symbol synchronization in the time domain, identify the center of the channel (system) bandwidth in the frequency domain, and identify the physical cell identity (PCI) of the cell.

The PBCH in the SSB may further include a master information block (MIB) that includes various system information, along with parameters for decoding a system information block (SIB). The SIB may be, for example, a SystemInformationType 1 (SIB1) that may include various additional system information. The MIB and SIB1 together provide the minimum system information (SI) for initial access. Examples of system information transmitted in the MIB may include, but are not limited to, a subcarrier spacing (e.g., default downlink numerology), system frame number, a configuration of a PDCCH control resource set (CORE-SET) (e.g., PDCCH CORESET0), a cell barred indicator, a cell reselection indicator, a raster offset, and a search space for SIB1. Examples of remaining minimum system information (RMSI) transmitted in the SIB1 may include, but are not limited to, a random access search space, a paging search space, downlink configuration information, and uplink configuration information.

In an UL transmission, the scheduled entity (e.g., UE) may utilize one or more REs 206 to carry UL control information (UCI) including one or more UL control channels, such as a physical uplink control channel (PUCCH), to the scheduling entity. UCI may include a variety of packet types and categories, including pilots, reference signals, and information configured to enable or assist in decoding uplink data transmissions. Examples of uplink reference signals may include a sounding reference signal (SRS) and an uplink DMRS. In some examples, the UCI may include a scheduling request (SR), i.e., request for the scheduling entity to schedule uplink transmissions. Here, in response to the SR transmitted on the UCI, the scheduling entity may transmit downlink control information (DCI) that may schedule resources for uplink packet transmissions. UCI may also include HARQ feedback, channel state feedback (CSF), such as a CSI report, or any other suitable UCI.

In addition to control information, one or more REs 206 (e.g., within the data region 214) may be allocated for data traffic. Such data traffic may be carried on one or more traffic channels, such as, for a DL transmission, a physical downlink shared channel (PDSCH); or for an UL transmission, a physical uplink shared channel (PUSCH). In some examples, one or more REs 206 within the data region 214 may be configured to carry other signals, such as one or more SIBs and DMRSs.

In an example of sidelink communication over a sidelink carrier via a PC5 interface, the control region 212 of the slot 210 may include a physical sidelink control channel (PSCCH) including sidelink control information (SCI) transmitted by an initiating (transmitting) sidelink device (e.g., Tx V2X device or other Tx UE) towards a set of one or more other receiving sidelink devices (e.g., Rx V2X device or other Rx UE). The data region 214 of the slot 210 may include a physical sidelink shared channel (PSSCH) including sidelink data traffic transmitted by the initiating (transmitting) sidelink device within resources reserved over the sidelink carrier by the transmitting sidelink device via the SCI. Other information may further be transmitted over various REs 206 within slot 210. For example, HARQ feedback information may be transmitted in a physical sidelink feedback channel (PSFCH) within the slot 210 from the receiving sidelink device to the transmitting sidelink device. In addition, one or more reference signals, such as a sidelink SSB, a sidelink CSI-RS, a sidelink SRS, and/or a sidelink positioning reference signal (PRS) may be transmitted within the slot 210.

These physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs in a given transmission.

The channels or carriers illustrated in FIG. 2 are not necessarily all of the channels or carriers that may be utilized between devices, and those of ordinary skill in the art will recognize that other channels or carriers may be utilized in addition to those illustrated, such as other traffic, control, and feedback channels.

Figure 3:
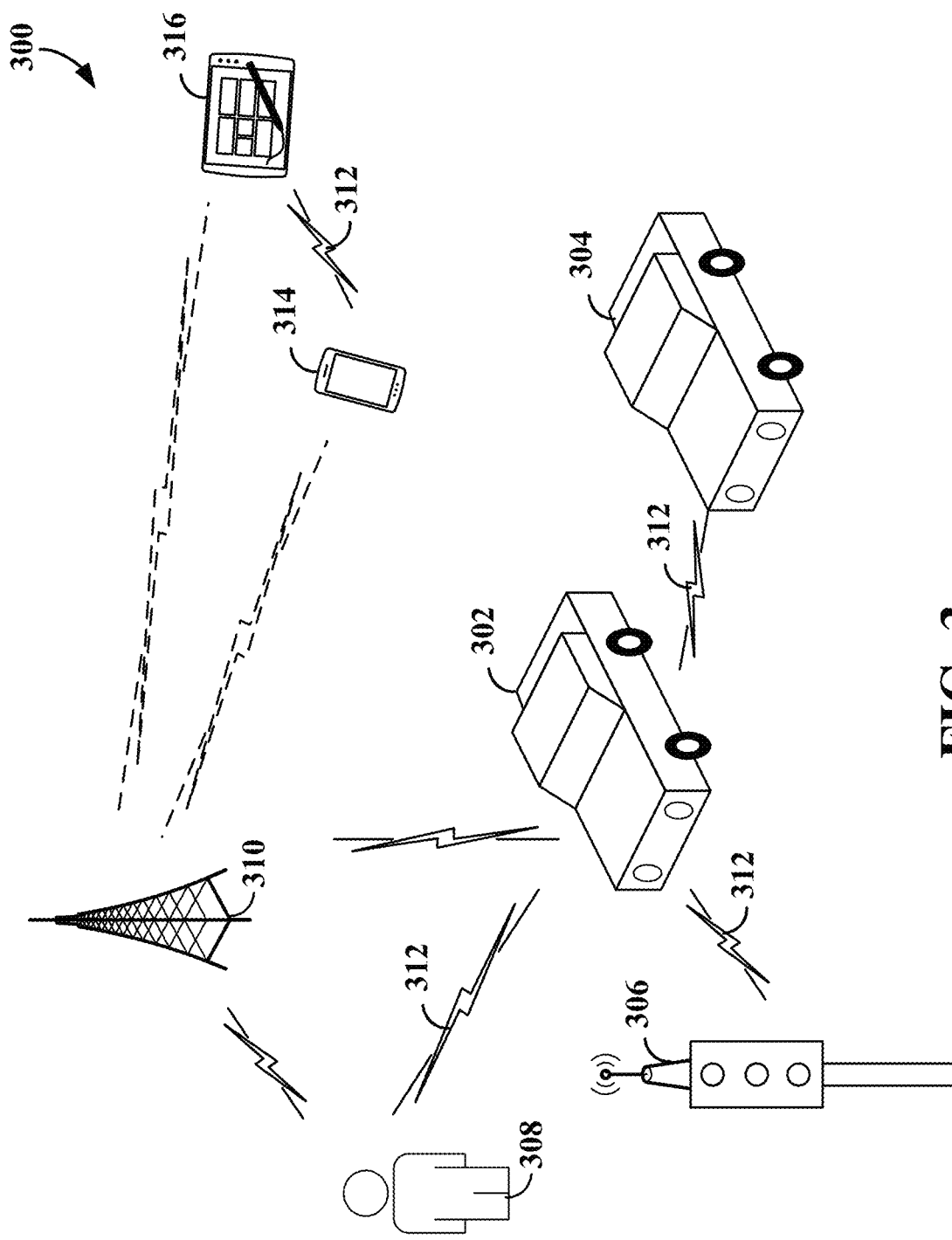
FIG. 3 is a diagram illustrating an example of a wireless communication network employing sidelink communication according to some aspects.

FIG. 3 illustrates an example of a wireless communication network 300 configured to support D2D or sidelink communication. In some examples, sidelink communication may include V2X communication. V2X communication involves the wireless exchange of information directly between not only vehicles (e.g., vehicles 302 and 304) themselves, but also directly between vehicles 302/304 and infrastructure (e.g., roadside units (RSUs) 306), such as streetlights, buildings, traffic cameras, tollbooths or other stationary objects, vehicles 302/304 and pedestrians 308, and vehicles 302/304 and wireless communication networks (e.g., base station 310). In some examples, V2X communication may be implemented in accordance with the New Radio (NR) cellular V2X standard defined by 3GPP, Release 16, or other suitable standard.

V2X communication enables vehicles 302 and 304 to obtain information related to the weather, nearby accidents, road conditions, activities of nearby vehicles and pedestrians, objects nearby the vehicle, and other pertinent information that may be utilized to improve the vehicle driving experience and increase vehicle safety. For example, such V2X data may enable autonomous driving and improve road safety and traffic efficiency. For example, the exchanged V2X data may be utilized by a V2X connected vehicle 302 and 304 to provide in-vehicle collision warnings, road hazard warnings, approaching emergency vehicle warnings, pre-/post-crash warnings and information, emergency brake warnings, traffic jam ahead warnings, lane change warnings, intelligent navigation services, and other similar information. In addition, V2X data received by a V2X connected mobile device of a pedestrian/cyclist 308 may be utilized to trigger a warning sound, vibration, flashing light, etc., in case of imminent danger.

The sidelink communication between vehicle-UEs (V-UEs) 302 and 304 or between a V-UE 302 or 304 and either an RSU 306 or a pedestrian-UE (P-UE) 308 may occur over a sidelink 312 utilizing a proximity service (ProSe) PC5 interface. In various aspects of the disclosure, the PC5 interface may further be utilized to support D2D sidelink 312 communication in other proximity use cases (e.g., other than V2X). Examples of other proximity use cases may include smart wearables, public safety, or commercial (e.g., entertainment, education, office, medical, and/or interactive) based proximity services. In the example shown in FIG. 3, ProSe communication may further occur between UEs 314 and 316.

ProSe communication may support different operational scenarios, such as in-coverage, out-of-coverage, and partial coverage. Out-of-coverage refers to a scenario in which UEs (e.g., UEs 314 and 316) are outside of the coverage area of a base station (e.g., base station 310), but each are still configured for ProSe communication. Partial coverage refers to a scenario in which some of the UEs (e.g., V-UE 304) are outside of the coverage area of the base station 310, while other UEs (e.g., V-UE 302 and P-UE 308) are in communication with the base station 310. In-coverage refers to a scenario in which UEs (e.g., V-UE 302 and P-UE 308) are in communication with the base station 310 (e.g., gNB) via a Uu (e.g., cellular interface) connection to receive ProSe service authorization and provisioning information to support ProSe operations.

To facilitate D2D sidelink communication between, for example, UEs 314 and 316 over the sidelink 312, the UEs 314 and 316 may transmit discovery signals therebetween. In some examples, each discovery signal may include a synchronization signal, such as a primary synchronization signal (PSS) and/or a secondary synchronization signal (SSS) that facilitates device discovery and enables synchronization of communication on the sidelink 312. For example, the discovery signal may be utilized by the UE 316 to measure the signal strength and channel status of a potential sidelink (e.g., sidelink 312) with another UE (e.g., UE 314). The UE 316 may utilize the measurement results to select a UE (e.g., UE 314) for sidelink communication or relay communication.

In 5G NR sidelink, sidelink communication may utilize transmission or reception resource pools. For example, the minimum resource allocation unit in frequency may be a sub-channel (e.g., which may include, for example, 10, 15, 20, 25, 50, 75, or 100 consecutive resource blocks) and the minimum resource allocation unit in time may be one slot. The number of sub-channels in a resource pool may include between one and twenty-seven sub-channels. A radio resource control (RRC) configuration of the resource pools may be either pre-configured (e.g., a factory setting on the UE determined, for example, by sidelink standards or specifications) or configured by a base station (e.g., base station 310).

In addition, there may be two main resource allocation modes of operation for sidelink (e.g., PC5) communications. In a first mode, Mode 1, a base station (e.g., gNB) 310 may allocate resources to sidelink devices (e.g., V2X devices or other sidelink devices) for sidelink communication between the sidelink devices in various manners. For example, the base station 310 may allocate sidelink resources dynamically (e.g., a dynamic grant) to sidelink devices, in response to requests for sidelink resources from the sidelink devices. For example, the base station 310 may schedule the sidelink communication via DCI 3_0. In some examples, the base station 310 may schedule the PSCCH/PSSCH within uplink resources indicated in DCI 3_0. The base station 310 may further activate preconfigured sidelink grants (e.g., configured grants) for sidelink communication among the sidelink devices. In some examples, the base station 310 may activate a configured grant (CG) via RRC signaling. In Mode 1, sidelink feedback may be reported back to the base station 310 by a transmitting sidelink device.

In a second mode, Mode 2, the sidelink devices may autonomously select sidelink resources for sidelink communication therebetween. In some examples, a transmitting sidelink device may perform resource/channel sensing to select resources (e.g., sub-channels) on the sidelink channel that are unoccupied. Signaling on the sidelink is the same between the two modes. Therefore, from a receiver's point of view, there is no difference between the modes.

In some examples, sidelink (e.g., PC5) communication may be scheduled by use of sidelink control information (SCI). SCI may include two SCI stages. Stage 1 sidelink control information (first stage SCI) may be referred to herein as SCI-1. Stage 2 sidelink control information (second stage SCI) may be referred to herein as SCI-2.

SCI-1 may be transmitted on a physical sidelink control channel (PSCCH). SCI-1 may include information for resource allocation of a sidelink resource and for decoding of the second stage of sidelink control information (i.e., SCI-2). For example, SCI-1 may include a physical sidelink shared channel (PSSCH) resource assignment and a resource reservation period (if enabled). SCI-1 may further identify a priority level (e.g., Quality of Service (QoS)) of a PSSCH. For example, ultra-reliable-low-latency communication (URLLC) traffic may have a higher priority than text message traffic (e.g., short message service (SMS) traffic). Additionally, SCI-1 may include a PSSCH demodulation reference signal (DMRS) pattern (if more than one pattern is configured). The DMRS may be used by a receiver for radio channel estimation for demodulation of the associated physical channel. As indicated, SCI-1 may also include information about the SCI-2, for example, SCI-1 may disclose the format of the SCI-2. Here, the format indicates the resource size of SCI-2 (e.g., a number of REs that are allotted for SCI-2), a number of a PSSCH DMRS port(s), and a modulation and coding scheme (MCS) index. In some examples, SCI-1 may use two bits to indicate the SCI-2 format. Thus, in this example, four different SCI-2 formats may be supported. SCI-1 may include other information that is useful for establishing and decoding a PSSCH resource.

SCI-2 may also be transmitted on the PSCCH and may contain information for decoding the PSSCH. According to some aspects, SCI-2 includes a 16-bit layer 1 (L1) destination identifier (ID), an 8-bit L1 source ID, a hybrid automatic repeat request (HARQ) process ID, a new data indicator (NDI), and a redundancy version (RV). For unicast communications, SCI-2 may further include a CSI report trigger. For groupcast communications, SCI-2 may further include a zone identifier and a maximum communication range for NACK. SCI-2 may include other information that is useful for establishing and decoding a PSSCH resource.

In some examples, the SCI (e.g., SCI-1 and/or SCI-2) may further include a resource assignment of retransmission resources reserved for one or more retransmissions of the sidelink transmission (e.g., the sidelink traffic/data). Thus, the SCI may include a respective PSSCH resource reservation and assignment for one or more retransmissions of the PSSCH. For example, the SCI may include a reservation message indicating the PSSCH resource reservation for the initial sidelink transmission (initial PSSCH) and one or more additional PSSCH resource reservations for one or more retransmissions of the PSSCH.

FIGS. 4A and 4B are diagrams illustrating examples of sidelink slot structures according to some aspects. The sidelink slot structures may be utilized, for example, in a V2X or other D2D network implementing sidelink. In the examples shown in FIGS. 4A and 4B, time is in the horizontal direction with units of symbols 402 (e.g., OFDM symbols); and frequency is in the vertical direction. Here, a carrier bandwidth 404 allocated for sidelink wireless communication is illustrated along the frequency axis. The carrier bandwidth 404 may include a plurality of sub-channels, where each sub-channel may include a configurable number of PRBs (e.g., 10, 15, 20, 25, 50, 75, or 100 PRBs).

Each of FIGS. 4A and 4B illustrate an example of a respective slot 400a or 400b including fourteen symbols 402 that may be used for sidelink communication. However, it should be understood that sidelink communication can be configured to occupy fewer than fourteen symbols in a slot 400a or 400b, and the disclosure is not limited to any particular number of symbols 402. Each sidelink slot 400a and 400b includes a physical sidelink control channel (PSCCH) 406 occupying a control region 418 of the slot 400a and 400b and a physical sidelink shared channel (PSSCH) 408 occupying a data region 420 of the slot 400a and 400*b*. The PSCCH 406 and PSSCH 408 are each transmitted on one or more symbols 402 of the slot 400*a*. The PSCCH 406 includes, for example, SCI-1 that schedules transmission of data traffic on time-frequency resources of the corresponding PSSCH 408. As shown in FIGS. 4A and 4B, the PSCCH 406 and corresponding PSSCH 408 are transmitted in the same slot 400*a* and 400*b*. In other examples, the PSCCH 406 may schedule a PSSCH in a subsequent slot.

In some examples, the PSCCH 406 duration is configured to be two or three symbols. In addition, the PSCCH 406 may be configured to span a configurable number of PRBs, limited to a single sub-channel. The PSSCH resource size may be fixed for a resource pool (e.g., 10% to 100% of one sub-channel in the first two or three symbols). For example, the PSCCH 406 may occupy 10, 12, 15, 20, or 25 RBs of a single sub-channel A DMRS may further be present in every PSCCH symbol. In some examples, the DMRS may be placed on every fourth RE of the PSCCH 406. A frequency domain orthogonal cover code (FD-OCC) may further be applied to the PSCCH DMRS to reduce the impact of colliding PSCCH transmissions on the sidelink channel. For example, a transmitting UE may randomly select the FD-OCC from a set of pre-defined FD-OCCs. In each of the examples shown in FIGS. 4A and 4B, the starting symbol for the PSCCH 406 is the second symbol of the corresponding slot 400*a* or 400*b* and the PSCCH 406 spans three symbols 402.

The PSSCH 408 may be time-division multiplexed (TDMed) with the PSCCH 406 and/or frequency-division multiplexed (FDMed) with the PSCCH 406. In the example shown in FIG. 4A, the PSSCH 408 includes a first portion 408*a* that is TDMed with the PSCCH 406 and a second portion 408*b* that is FDMed with the PSCCH 406. In the example shown in FIG. 4B, the PSSCH 408 is TDMed with the PSCCH 406.

One and two layer transmissions of the PSSCH 408 may be supported with various modulation orders (e.g., QPSK, 16-QAM, 64-QAM and 246-QAM). In addition, the PSSCH 408 may include DMRSs 414 configured in a two, three, or four symbol DMRS pattern. For example, slot 400*a* shown in FIG. 4A illustrates a two symbol DMRS pattern, while slot 400*b* shown in FIG. 4B illustrates a three symbol DMRS pattern. In some examples, the transmitting UE can select the DMRS pattern and indicate the selected DMRS pattern in SCI-1, according to channel conditions. The DMRS pattern may be selected, for example, based on the number of PSSCH 408 symbols in the slot 400*a* or 400*b*. In addition, a gap symbol 416 is present after the PSSCH 408 in each slot 400*a* and 400*b*.

Each slot 400*a* and 400*b* further includes SCI-2 412 mapped to contiguous RBs in the PSSCH 408 starting from the first symbol containing a PSSCH DMRS. In the example shown in FIG. 4A, the first symbol containing a PSSCH DMRS is the fifth symbol occurring immediately after the last symbol carrying the PSCCH 406. Therefore, the SCI-2 412 is mapped to RBs within the fifth symbol. In the example shown in FIG. 4B, the first symbol containing a PSSCH DMRS is the second symbol, which also includes the PSCCH 406. In addition, the SCI-2/PSSCH DMRS 412 are shown spanning symbols two through five. As a result, the SCI-2/PSSCH DMRS 412 may be FDMed with the PSCCH 406 in symbols two through four and TDMed with the PSCCH 406 in symbol five.

The SCI-2 may be scrambled separately from the sidelink shared channel. In addition, the SCI-2 may utilize QPSK. When the PSSCH transmission spans two layers, the SCI-2 modulation symbols may be copied on (e.g., repeated on) both layers. The SCI-1 in the PSCCH 406 may be blind decoded at the receiving wireless communication device. However, since the format, starting location, and number of REs of the SCI-2 412 may be derived from the SCI-1, blind decoding of SCI-2 is not needed at the receiver (receiving UE).

In each of FIGS. 4A and 4B, the second symbol of each slot 400*a* and 400*b* is copied onto (repeated on) a first symbol 410 thereof for automatic gain control (AGC) settling. For example, in FIG. 4A, the second symbol containing the PSCCH 406 FDMed with the PSSCH 408*b* may be transmitted on both the first symbol and the second symbol. In the example shown in FIG. 4B, the second symbol containing the PSCCH 406 FDMed with the SCI-2/PSSCH DMRS 412 may be transmitted on both the first symbol and the second symbol.

Figure 5:
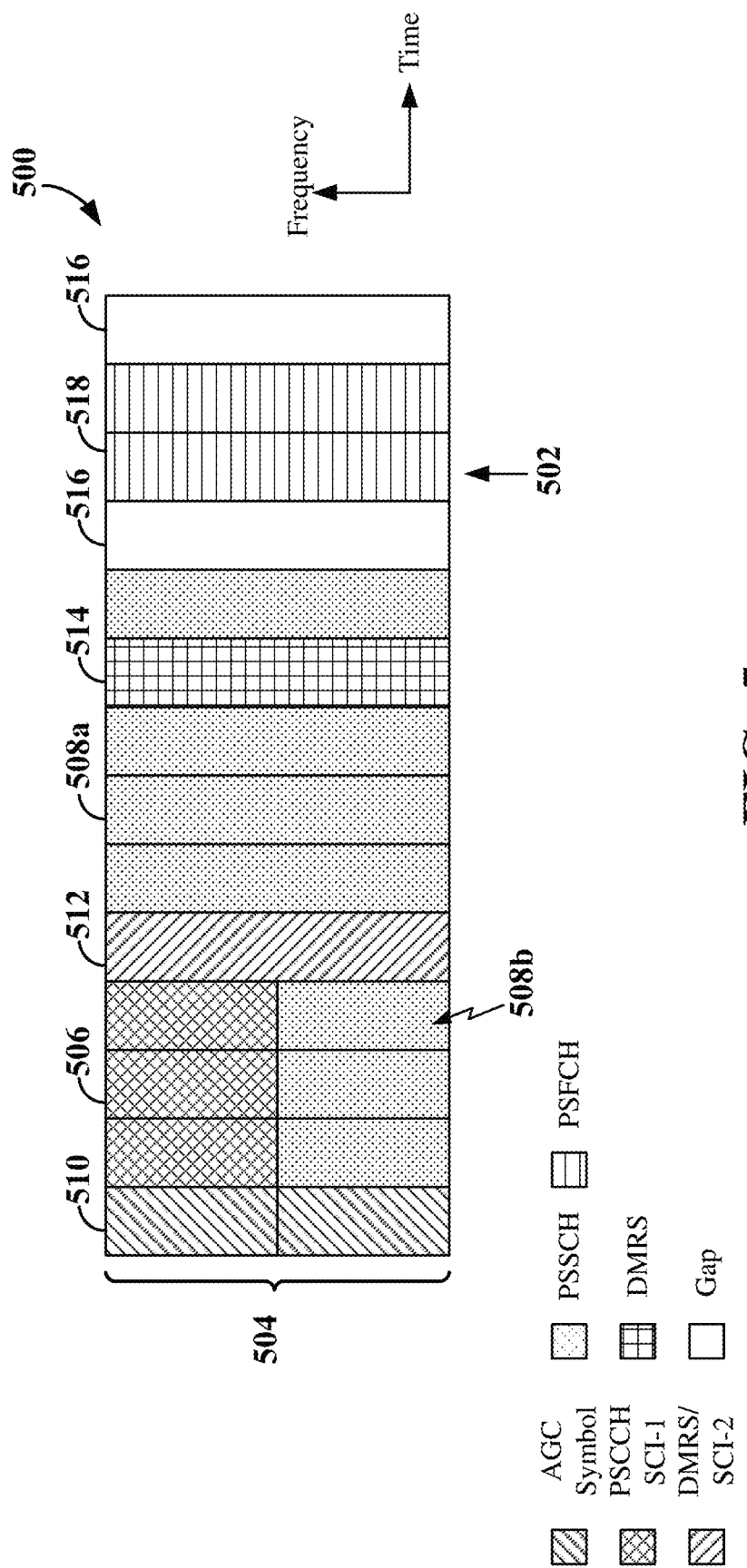
FIG. 5 is a diagram illustrating an example of sidelink transmissions between wireless communication devices according to some aspects.

FIG. 5 is a diagram illustrating an example of a sidelink slot structure with feedback resources according to some aspects. The sidelink slot structure may be utilized, for example, in a V2X or other D2D network implementing sidelink. In the example shown in FIG. 5, time is in the horizontal direction with units of symbols 502 (e.g., OFDM symbols); and frequency is in the vertical direction. Here, a carrier bandwidth 504 allocated for sidelink wireless communication is illustrated along the frequency axis. A slot 500 having the slot structure shown in FIG. 5 includes fourteen symbols 502 that may be used for sidelink communication. However, it should be understood that sidelink communication can be configured to occupy fewer than fourteen symbols in a slot 500, and the disclosure is not limited to any particular number of symbols 502.

As in the examples shown in FIGS. 4A and 4B, the sidelink slot 500 includes a PSCCH 506 occupying a control region of the slot 500 and a PSSCH 508 occupying a data region of the slot 500. The PSCCH 506 and PSSCH 508 are each transmitted on one or more symbols 502 of the slot 500. The PSCCH 506 includes, for example, SCI-1 that schedules transmission of data traffic on time-frequency resources of the corresponding PSSCH 508. As shown in FIG. 5, the starting symbol for the PSCCH 506 is the second symbol of the slot 500 and the PSCCH 506 spans three symbols 502. The PSSCH 508 may be time-division multiplexed (TDMed) with the PSCCH 506 and/or frequency-division multiplexed (FDMed) with the PSCCH 506. In the example shown in FIG. 5, the PSSCH 508 includes a first portion 508*a* that is TDMed with the PSCCH 506 and a second portion 508*b* that is FDMed with the PSCCH 506.

The PSSCH 508 may further include a DMRSs 514 configured in a two, three, or four symbol DMRS pattern. For example, slot 500 shown in FIG. 5 illustrates a two symbol DMRS pattern. In some examples, the transmitting UE can select the DMRS pattern and indicate the selected DMRS pattern in SCI-1, according to channel conditions. The DMRS pattern may be selected, for example, based on the number of PSSCH 508 symbols in the slot 500. In addition, a gap symbol 516 is present after the PSSCH 508 in the slot 500.

The slot 500 further includes SCI-2 512 mapped to contiguous RBs in the PSSCH 508 starting from the first symbol containing a PSSCH DMRS. In the example shown in FIG. 5, the first symbol containing a PSSCH DMRS is the fifth symbol occurring immediately after the last symbol carrying the PSCCH 506. Therefore, the SCI-2 512 is mapped to RBs within the fifth symbol.

In addition, as shown in FIG. 5, the second symbol of the slot 500 is copied onto (repeated on) a first symbol 510 thereof for automatic gain control (AGC) settling. For example, in FIG. 5, the second symbol containing the PSCCH 506 FDMed with the PSSCH 508b may be transmitted on both the first symbol and the second symbol.

HARQ feedback may further be transmitted on a physical sidelink feedback channel (PSFCH) 518 in a configurable resource period of 0, 1, 2, or 4 slots. In sidelink slots (e.g., slot 500) containing the PSFCH 518, one symbol 502 may be allocated to the PSFCH 518, and the PSFCH 518 may be copied onto (repeated on) a previous symbol for AGC settling. In the example shown in FIG. 5, the PSFCH 518 is transmitted on the thirteenth symbol and copied onto the twelfth symbol in the slot 500. A gap symbol 516 may further be placed after the PSFCH symbols 518.

In some examples, there is a mapping between the PSSCH 508 and the corresponding PSFCH resource. The mapping may be based on, for example, the starting sub-channel of the PSSCH 508, the slot containing the PSSCH 508, the source ID and the destination ID. In addition, the PSFCH can be enabled for unicast and groupcast communication. For unicast, the PSFCH may include one ACK/NACK bit. For groupcast, there may be two feedback modes for the PSFCH. In a first groupcast PSFCH mode, the receiving UE transmits only NACK, whereas in a second groupcast PSFCH mode, the receiving UE may transmit either ACK or NACK. The number of available PSFCH resources may be equal to or greater than the number of UEs in the second groupcast PSFCH mode.

Figure 6:
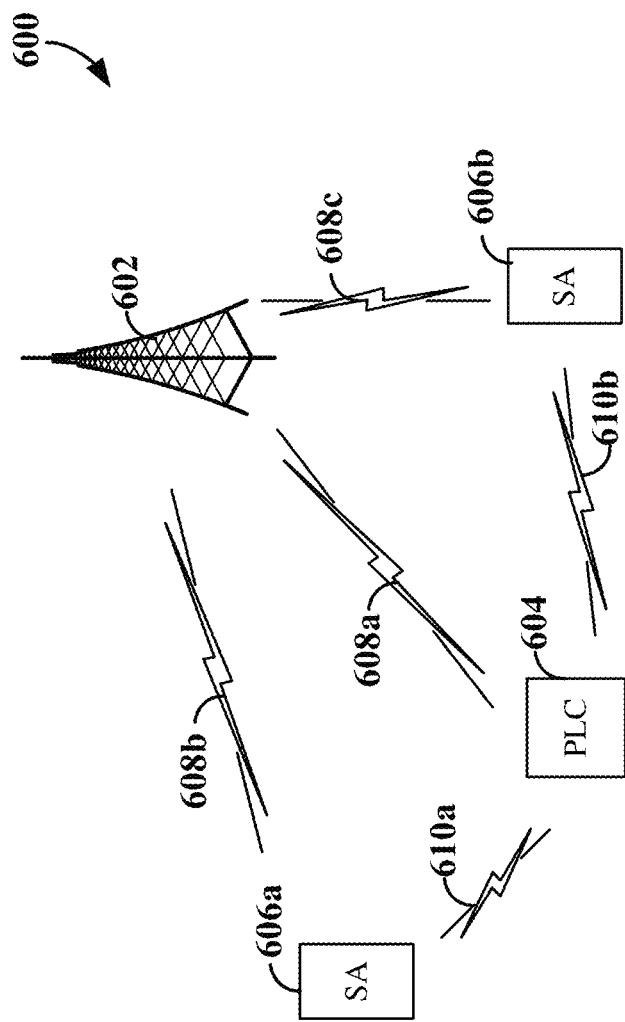
FIG. 6 illustrates an example of a wireless communication network configured to support industrial internet of things (IIoT) according to some aspects.

FIG. 6 illustrates an example of a wireless communication network 600 configured to support industrial internet of things (IIoT). The IIoT network 600 may include a base station (e.g., gNB) 602 and a plurality of IIoT devices, such as a programmable logic controller (PLC) 604 and other IIoT devices 606a and 606b. In the example shown in FIG. 6, the other IIoT devices 606a and 606b may include sensors/actuators (SAs). In some examples, the PLC 604 may be configured to control between approximately twenty to fifty SAs (two of which 606a and 606b are illustrated, for simplicity). The base station 602 and IIoT devices 604, 606a, and 606b may communicate, for example, via respective cellular (Uu) links 608a, 608b, and 608c.

Traffic between the PLC 604 and SAs 606a and 606b may have a tight latency (e.g., 1~2 ms) and an ultra-reliability requirement of a $10^{-6}$ error rate. Communication between the PLC 604 and SAs 606a and 606b through the base station 602 (e.g., via Uu links 608a-608c) results in multiple over the air (OTA) transmissions, thus affecting latency and reliability. Therefore, the PLC 604 and SAs 606a and 606b can further be configured for sidelink communication via sidelinks 610a and 610b to enable direct communication between the PLC 604 and each of the SAs 606a and 606b. In some examples, the sidelink communication may be scheduled by the base station 602 (e.g., in a Mode 1 sidelink configuration). For example, the base station 602 may schedule sidelink communication between the PLC 604 and one or more of the SAs 606a and 606b via DCI 3_0.

In some examples, the base station 602 may receive a scheduling request from the PLC 604 or one of the SAs 606a or 606b requesting the base station 602 schedule high priority traffic (e.g., URLLC traffic) to be transmitted via a sidelink 610a or 610b or a Uu link 608a-608c. However, the base station 602 may have previously scheduled a lower priority PSSCH (or PSSCH retransmission) on one of the sidelinks 610a or 610b that may prevent the higher priority transmission (e.g., uplink or sidelink transmission) from meeting the URLLC requirements.

Therefore, a lower priority sidelink transmission may be modified to enable scheduling of a higher priority sidelink or uplink transmission on resources (e.g., time-frequency resources) that overlap with the lower priority sidelink transmission. The lower priority sidelink transmission may be modified, for example, by cancelling the sidelink transmission within at least the overlapping resources or reducing the transmission power of the sidelink transmission within at least the overlapping resources. This may result in improved scheduling flexibility and interference coordination within the wireless communication network.

In some examples, a base station (e.g., base station 310 or 602) may schedule resources for a sidelink transmission (e.g., an initial sidelink transmission or a sidelink retransmission) from a transmitting wireless communication device (e.g., a transmitting UE, such as a V2X or D2D device shown in FIG. 3 or an IIoT device shown in FIG. 6) to a receiving UE. The base station may then transmit a cancellation indication (e.g., a sidelink cancellation indication (SLCI)) to at least the transmitting UE indicating an overlap between at least a portion of the resources scheduled for the sidelink transmission and an additional transmission (e.g., an uplink or sidelink transmission). The transmitting UE may then modify the sidelink transmission based on the cancellation indication.

Figure 7:
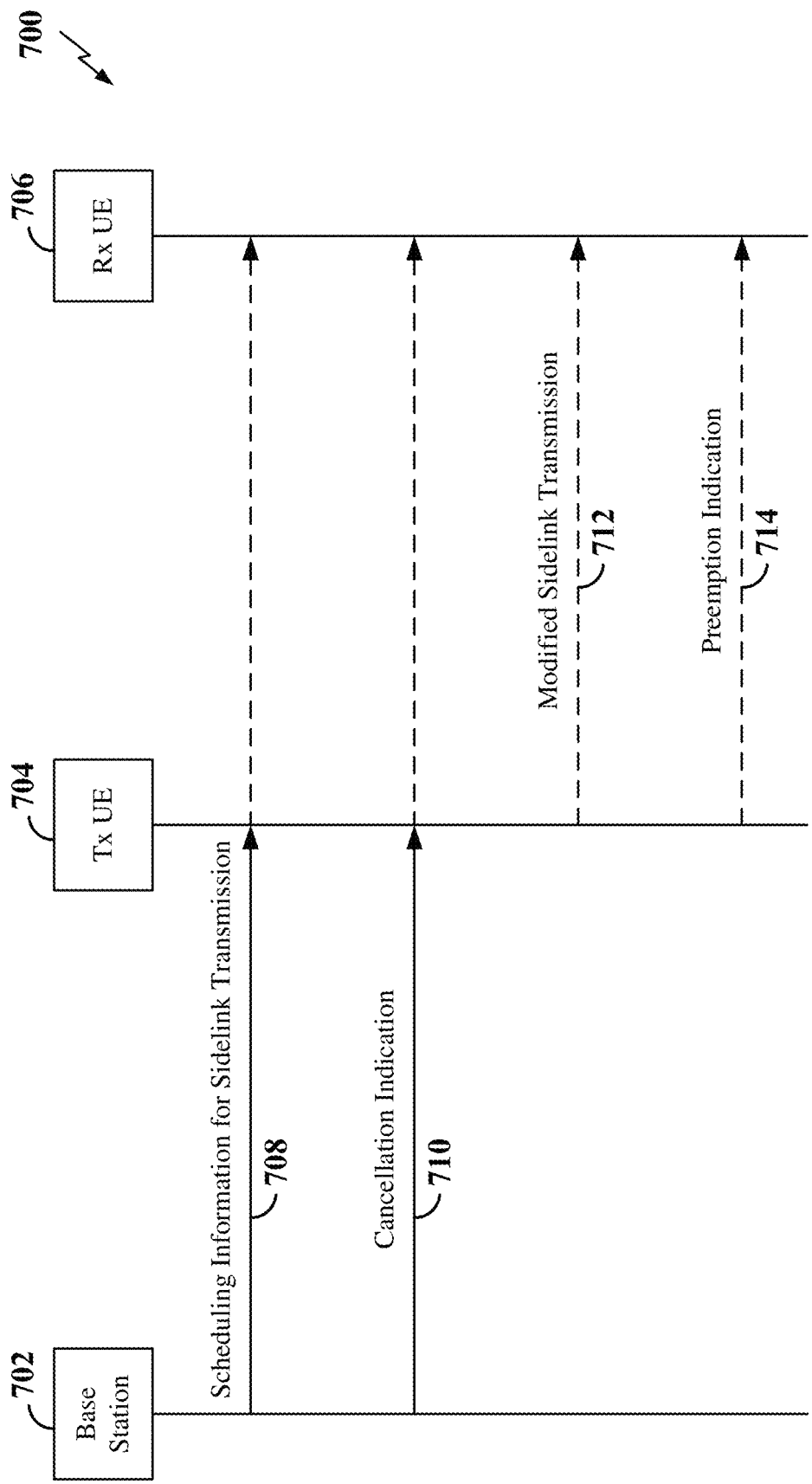
FIG. 7 is a signaling diagram illustrating exemplary signaling for sidelink cancellation according to some aspects.

FIG. 7 is a signaling diagram illustrating exemplary signaling 700 for sidelink cancellation between a base station (e.g., gNB) 702, a transmitting (Tx) UE 704, and a receiving (Rx) UE 706 according to some aspects. The base station 702 may correspond to any of the base stations or other scheduling entities illustrated in any of FIGS. 1, 3, and/or 6. In addition, the Tx UE 704 and Rx UE 706 may correspond to any of the UEs, sidelink devices, V2X devices, D2D devices, IIoT devices, or other scheduled entities illustrated in any of FIGS. 1, 3, and/or 6.

At 708, the base station 702 may transmit scheduling information scheduling a sidelink transmission to the Tx UE 704. In some examples, the base station 702 may transmit the scheduling information to both the Tx UE 704 and the Rx UE 706. The scheduling information may be transmitted within, for example, DCI, such as DCI 3_0. The scheduling information may include resources (e.g., time-frequency resources) allocated to the sidelink transmission. For example, the resources allocated to the sidelink transmission may include one or more sub-channels and one or more slots. In some examples, the scheduling information may further include a priority indicator indicating a priority of the sidelink transmission. In addition, the scheduling information may further include a power control parameter associated with the priority indicator and indicating a transmission power of the sidelink transmission based on the priority.

At 710, the base station 702 may transmit a cancellation indication to the Tx UE 704. The cancellation indication may be transmitted within control information, such as DCI. For example, the DCI may include a DCI 2_4 format or a new or enhanced DCI format. In some examples, the base station 702 may select between multiple DCI formats. For example, a first format may be the DCI 2_4 format, which may be utilized for cancellation of uplink transmissions, a second format may be another DCI format, which may be utilized for cancellation of sidelink transmissions, and a third format may be a different DCI format, which may be utilized for cancellation of both uplink and sidelink transmissions. In some examples, the base station 702 may transmit the same DCI carrying the cancellation indication (e.g., a sidelink cancellation indication (SLCI)) to both the Tx UE 704 and the Rx UE 706. In some examples, the base station 702 may transmit separate DCI, each carrying the SLCI, to the Tx UE 704 and the Rx UE 706.

In some examples, the DCI may be associated with a cancellation application indicator indicating whether the cancellation indication is applicable to only uplink transmissions, only sidelink transmissions, or both uplink and sidelink transmissions. For example, the DCI may include a dedicated field including the cancellation application indicator. In other examples, the cancellation application indicator may be configured via RRC signaling. In yet other examples, the cancellation application indicator may include a cancellation indication radio network temporary identifier (CI-RNTI) utilized to scramble a cyclic redundancy check (CRC) of the control information. In still other examples, the cancellation application indicator may include a search space configuration of the DCI. For example, the search space configuration may configure respective search spaces and/or respective monitoring occasions within a search space for cancellation of uplink transmissions, sidelink transmissions, and/or both uplink and sidelink transmissions. Thus, each search space or monitoring occasion may be associated with cancellation of a specific type of transmission (e.g., uplink, sidelink, or both uplink and sidelink). In some examples, the search space configuration may associate search spaces or monitoring occasions utilized to schedule uplink transmissions or sidelink transmissions with search spaces or monitoring occasions utilized for uplink cancellation indications or sidelink cancellation indications, respectively. For example, upon blind decoding a DCI 3_0 scheduling a sidelink transmission within a particular search space or monitoring occasion, a receiving UE may be able to identify a search space or monitoring occasion to monitor for a DCI 2_4 or other new DCI format cancelling the sidelink transmission. The mapping between scheduling DCI and corresponding cancellation DCI may be configured, for example, via RRC signaling.

The cancellation indication (e.g., SLCI) may indicate, for example, at least an overlap between a portion of the resources allocated to the sidelink transmission and an additional transmission. For example, the cancellation indication may include resource information identifying at least the portion of the resources that overlap with the additional transmission (e.g., the overlapping resources). In some examples, the resource information may include a plurality of bits, each corresponding to a resource block group (RBG) and a symbol of a sidelink resource region (e.g., a sidelink resource pool). Each RBG may include, for example, two or more RBs of a sub-channel. The sidelink resource region (e.g., TimeFrequencyRegionSL parameter) for sidelink cancellation may be configured via RRC signaling or as a codepoint (e.g., bitmap) in the DCI. In some examples, the sidelink resource region may include both uplink symbols and flexible symbols of a semi-static time division duplex (TDD) pattern. In this example, the DCI may include the DCI 2_4 format, which may be used for both uplink cancellation and sidelink cancellation without any modification to the DCI 2_4 format. Thus, upon receiving the DCI 2_4, the Tx UE 704 may cancel any scheduled transmission (uplink and/or sidelink) within the overlapping resources. In other examples, the sidelink resource region may include only uplink symbols of the semi-static TDD pattern. This sidelink resource region configuration may be utilized in examples in which sidelink transmissions may only be transmitted on uplink symbols (and not flexible symbols).

In some examples, the cancellation indication (e.g., SLCI) may include cancellation behavior information. The cancellation behavior information may include the resource information defining the overlapping resources, as described above. In examples in which the DCI include a new or enhanced DCI format, the cancellation behavior information may further indicate a cancellation behavior to be applied by the transmitting UE. The cancellation behavior applied by the Tx UE 704 may include, for example, modifying the sidelink transmission within at least the overlapping resources. Such modification may include cancellation of the sidelink transmission within at least the overlapping resources, reduction of the transmission power of the sidelink transmission within at least the overlapping resources or other suitable modification behavior. For example, the cancellation behavior information may include a cancellation type of the cancellation indication. The cancellation type may include a hard cancellation indicator or a soft cancellation indicator. The hard cancellation indicator may indicate that the Tx UE 704 should cancel the sidelink transmission within at least the overlapping resources. The soft cancellation indicator may indicate that Tx UE 704 should reduce the transmission power of the sidelink transmission within at least the overlapping resources or engage in other cancellation behavior to minimize interference and/or improve the signal properties of the sidelink transmission. For example, the soft cancellation indicator may indicate that the Tx UE 704 should utilize the overlapping resources for another purpose, such as active interference cancellation (AIC) to facilitate inter-client interference (ICI) cancellation or tone reservation (TR) to modulate the signal in the overlapping resources in order to reduce the peak-to-average-power (PAPR) ratio of the sidelink transmission.

In some examples, the cancellation behavior information may indicate the cancellation behavior to be applied based on the priority of the sidelink transmission and/or a cast type (e.g., unicast, groupcast, or broadcast) of the sidelink transmission. In an example, the cancellation behavior information may indicate that the Tx UE 704 should apply either hard cancellation behavior or soft cancellation behavior based on the priority of the sidelink transmission or the cast type of the sidelink transmission. As another example, the cancellation behavior information may indicate the cancellation behavior to be applied based on the respective priorities and/or respective cast types of the sidelink transmission and the additional transmission. For example, the cancellation behavior information may include a priority indicator indicating the priority of the additional transmission and/or a cast type indicator indicating the cast type of the additional transmission. In an example, the Tx UE 704 may apply a hard cancellation to the sidelink transmission in response to the priority of the sidelink transmission being lower than the priority of the additional transmission. The Tx UE 704 may further apply a soft cancellation to the sidelink transmission in response to the priority of the sidelink transmission being higher than the priority of the additional transmission.

In some examples, the cancellation indication may only be applicable to sidelink transmissions associated with a particular priority (e.g., a low priority PSSCH). In other examples, the cancellation indication may be applicable to the sidelink transmission regardless of the priority of the sidelink transmission. In this example, the base station 702 may transmit an RRC message to the Tx UE 704 indicating to cancel both high priority and low priority PSSCHs in response to receiving a cancellation indication.

The control information carrying the cancellation indication (e.g., SLCI) may further include preemption scheduling information scheduling a preemption indication to be sent from the Tx UE 704 to the Rx UE 706. The Tx UE 704 may transmit the preemption indication (PI) to the Rx UE 706 to indicate preemption information associated with the cancellation indication (e.g., cancellation behavior information, such as resource information, cancellation type, etc.). The Rx UE 706 may process (e.g., re(attempt) decoding of the sidelink transmission) based on the preemption indication.

At 712, the Tx UE 704 may optionally modify the sidelink transmission based on the cancellation indication. In some examples, the Tx UE 704 may modify the sidelink transmission based on the priority of the sidelink transmission. The priority of the sidelink transmission may be indicated, for example, in the DCI scheduling the sidelink transmission. For example, the Tx UE 704 may modify the sidelink transmission based on the sidelink transmission being a low priority sidelink transmission. In this example, the Tx UE 704 may not modify the sidelink transmission and may transmit the sidelink transmission based on the original scheduling information (e.g., scheduled resources, etc.) included in the scheduling DCI. As another example, the Tx UE 704 may modify the sidelink transmission based on the sidelink transmission being a low priority or a high priority sidelink transmission, as indicated via RRC signaling. As yet another example, the Tx UE 704 may modify the sidelink transmission based on a comparison between the priority and a threshold. For example, the priority indicator may indicate a priority level between 0 and 3, where 0 indicates a high priority and 3 indicates a low priority. In an example, the threshold may correspond to a priority level of 2. The Tx UE 704 may then modify the sidelink transmission in response to the priority level being greater than (or greater than or equal to) the threshold. In some examples, the threshold may be configured via RRC signaling.

In some examples, modification of the sidelink transmission may include cancelling the entire sidelink transmission (e.g., not transmitting the sidelink transmission). For example, the Tx UE 704 may cancel the sidelink transmission in all scheduled resources based on an amount of overlapping or non-overlapping resources. In an example, the Tx UE 704 may cancel the sidelink transmission in all scheduled resources in response to a non-overlapping resource percentage (e.g., the percentage of non-overlapping resources of the scheduled resources) being less than a threshold.

In other examples, modification of the sidelink transmission includes generating a modified sidelink transmission and transmitting the modified sidelink transmission to the Rx UE 706. For example, the Tx UE 704 may cancel the sidelink transmission within at least the overlapping resources and transmit the sidelink transmission within remaining resources of the scheduled resources. In this example, the Tx UE 704 may generate a new waveform for transmission of the sidelink transmission within the remaining resources, shift a DM-RS within the sidelink transmission (e.g., shift the DM-RS by an offset), delay the sidelink transmission (e.g., shift all symbols by an offset), puncture the sidelink transmission using a puncturing pattern (e.g., puncture the sidelink transmission in the cancelled resources), perform rate-matching of the sidelink transmission using a new rate matching pattern based on the remaining resources, and/or boost the transmission power of the sidelink transmission in the remaining resources. Here, the remaining resources may include the scheduled resources other than (outside of) the cancelled resources. As another example, the Tx UE 704 may reduce the transmission power of the sidelink transmission within at least the overlapping resources or utilize the overlapping resources for a different purpose (e.g., AIC or TR).

At 714, the Tx UE 704 may optionally transmit a preemption indication (PI) to the Rx UE 706. In examples in which the Rx UE 706 is in-coverage and the cancellation indication is sent to the Rx UE as well as the Tx UE, the Tx UE 704 may not transmit the PI to the Rx UE. However, if the Rx UE 706 is out-of-coverage or if the cancelled resources differ from those indicated in the cancellation indication or the Tx UE 704 performs other modifications to the sidelink transmission, the Tx UE 704 may transmit the PI to the Rx UE 706. The PI may inform the Rx UE 706 about the cancellation behavior of the modified sidelink transmission to facilitate decoding (or re-attempted decoding) of the modified sidelink transmission by the Rx UE 706. For example, the PI may include resource information identifying the cancelled or modified resources, a symbol index offset for a DMRS included within the sidelink transmission (e.g., based on the cancelled resources), a delayed transmission indication indicating that all symbols of the sidelink transmission are shifted by a symbol index offset, a puncturing pattern of the sidelink transmission, a rate matching pattern of the sidelink transmission, and/or a power parameter indicating a transmission power of at least one of the remaining resources or the overlapping resources.

In some examples, the control information carrying the cancellation indication may include the preemption scheduling information scheduling the PI, as indicated above. In other examples, the Tx UE 704 may select resources for the transmission of the PI without receiving a grant from the network entity. For example, the SLCI transmission may have a high priority, and based on the high priority, the Tx UE 704 may randomly select resources (e.g., from the sidelink resource pool) without a grant. In some examples, the PI may be transmitted within a retransmission resource for the sidelink transmission. For example, the scheduling information scheduling the sidelink transmission may further schedule one or more retransmissions of the sidelink transmission. The transmitting UE may include the PI in the next retransmission of the sidelink transmission following the transmission of the modified sidelink transmission at 712. In some examples, the PI may be transmitted within SCI-1, SCI-2, a sidelink medium access control (MAC) control element (MAC-CE), or a sidelink radio resource control (RRC) message.

Figure 8:
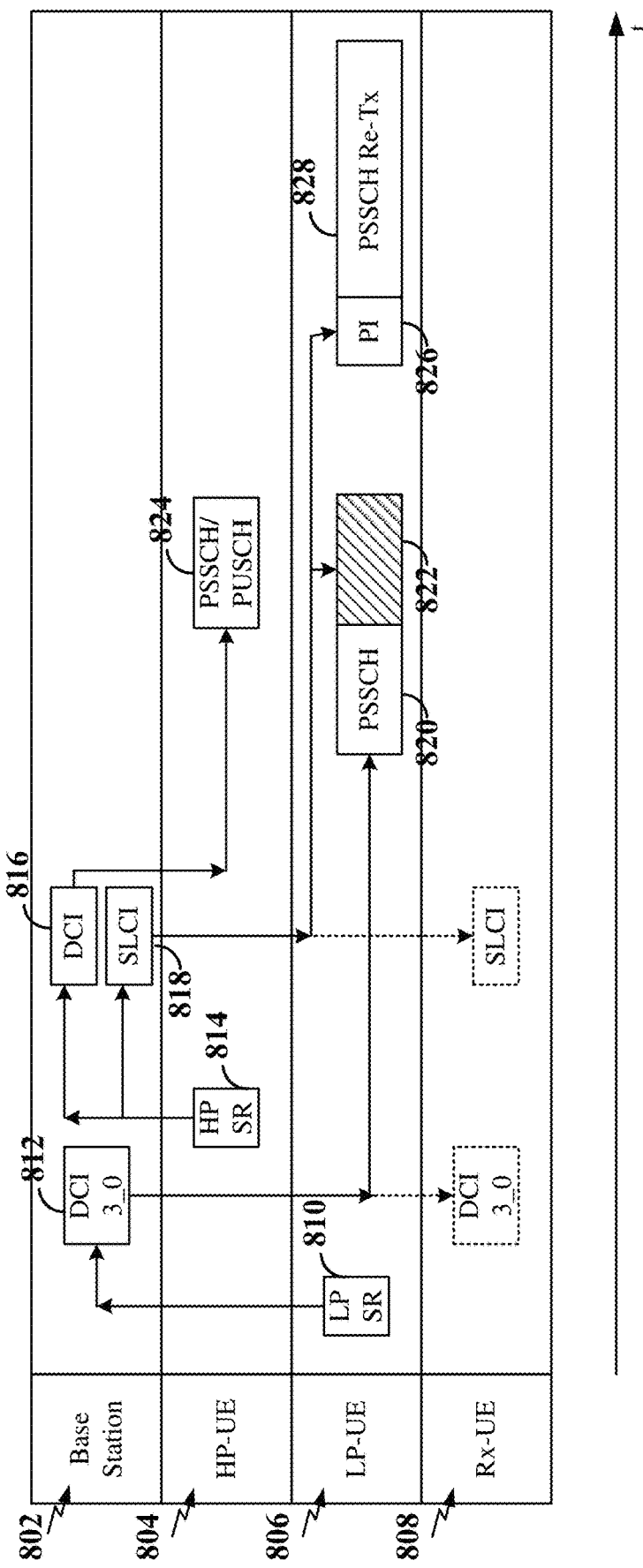
FIG. 8 is a diagram illustrating an example of sidelink cancellation according to some aspects.

FIG. 8 is a diagram illustrating an example of sidelink cancellation according to some aspects. In the example shown in FIG. 8, a base station 802 is shown in wireless communication with a high priority UE (HP-UE) 804 and a low priority UE (LP-UE) 806 via respective Uu links. The LP-UE 806 may further be in wireless communication with an Rx-UE 808 via a sidelink. The Rx-UE 808 may be within the coverage area of the base station 802 or outside of the coverage area of the base station 802. The base station (e.g., gNB) 802 may be any of the base stations or other scheduling entities illustrated in any of FIG. 1, 3, 6, or 7. In addition, each of the UEs 804, 806, and 808 may be any of the UEs, V2X devices, D2D devices, sidelink device, IIoT devices, or other scheduled entities illustrated in any of FIG. 1, 3, 6, or 7.

The diagram of FIG. 8 illustrates exemplary communication that may occur over time (t) between the base station 802 and each of the UEs 804, 806, and 808. For example, to schedule a sidelink transmission from the LP-UE 806 to the Rx-UE 808, the LP-UE 806 may generate and transmit a scheduling request (SR) 810 to the base station 802. The SR may be a low priority SR (LP SR) 810 for a low priority sidelink transmission. In some examples, the LP SR 810 may include a priority indicator indicating a priority (e.g., low priority) of the sidelink transmission. In other examples, the base station 802 may determine the priority of the sidelink transmission.

In response to receiving the LP SR 810, the base station may schedule the sidelink transmission and generate and transmit to the LP-UE 806 control information (e.g., DCI 3_0) 812 including scheduling information for the sidelink transmission. The scheduling information may include, for example, scheduled resources (e.g., time-frequency resources) for the sidelink transmission and other suitable information. For example, the resources allocated to the sidelink transmission may include one or more sub-channels and one or more slots. In some examples, the scheduling information may further include a priority indicator indicating a priority of the sidelink transmission and a power control parameter associated with the priority indicator and indicating a transmission power of the sidelink transmission based on the priority. In examples in which the Rx-UE 808 is within the coverage area of the base station, the base station 802 may further transmit the DCI 3_0 812 to the Rx-UE 808.

After scheduling the sidelink transmission, the base station 802 may receive another scheduling request 814 from the HP-UE 804. The SR may be a high priority SR (HP SR) 814 for a high priority sidelink or uplink transmission (e.g., URLCC transmission). In some examples, the HP SR 814 may include a priority indicator indicating a priority (e.g., high priority) of the sidelink or uplink transmission. In other examples, the base station 802 may determine the priority of the sidelink or uplink transmission.

The base station 802 may then schedule the high priority transmission for the HP-UE 804 and generate and transmit DCI 816 containing scheduling information for the high priority transmission to the HP-UE 804. In some examples, the base station 802 may schedule the high priority transmission (e.g., a high priority uplink transmission) for the HP-UE 804 without first receiving the HP SR 814 from the HP-UE 804. In examples in which the base station 802 schedules the high priority transmission on resources that overlap (e.g., in time and frequency) with the resources scheduled for the low priority sidelink transmission, the base station 802 may generate and transmit a sidelink cancellation indication (SLCI) 818 to the LP-UE 806. The SLCI 818 may be transmitted to the LP-UE 806 within DCI, such as DCI 2_4 or a new or enhanced DCI. In some examples, the base station 802 may further transmit the same SLCI 818 to the Rx-UE 808 or may transmit respective SLCIs to each of the LP-UE 806 and Rx-UE 808.

The SLCI 818 may indicate, for example, an overlap between at least a portion of the resources scheduled for (allocated to) the low priority sidelink transmission and the high priority transmission. For example, the SLCI 818 may include resource information identifying at least the portion of the resources that overlap with the additional transmission (e.g., the overlapping resources). The SLCI 818 may further include cancellation behavior information, which may include, for example, the resource information, a cancellation type (e.g., hard or soft) of the SLCI 818, and/or other information that may indicate a cancellation behavior to be applied by the LP-UE 806 to the low priority sidelink transmission. For example, the cancellation behavior information may indicate the cancellation behavior to be applied based on the priority of the low priority sidelink transmission and/or high priority transmission and/or a cast type (e.g., unicast, groupcast, or broadcast) of the low priority sidelink transmission and/or high priority transmission. In some examples, the DCI carrying the SLCI 818 may further include preemption scheduling information scheduling a preemption indication to be sent from the LP-UE 806 to the Rx-UE 808.

Based on the SLCI 818, the LP-UE 806 may modify the low priority sidelink transmission. In the example shown in FIG. 8, the LP-UE 806 may transmit the low priority sidelink transmission (PSSCH) 820 within remaining resources (e.g., the scheduled resources for the sidelink transmission that were not cancelled by the SLCI 818) and cancel the low priority sidelink transmission 822 within the overlapping resources allocated to the high priority transmission. For example, the LP-UE 806 may generate a new waveform for the low priority sidelink transmission 820 for the remaining resources, apply a new rate matching pattern to the sidelink transmission 820 based on the remaining resources, and/or boost the transmission power of the sidelink transmission 820 in the remaining resources. The LP-UE 806 may further puncture the sidelink transmission 822 in the cancelled resources. In other examples, instead of cancelling the low priority sidelink transmission, the SLCI 818 may indicate that the LP-UE 806 should reduce the transmission power of the sidelink transmission 822 within at least the overlapping resources or utilize the overlapping resources of the sidelink transmission 822 for a different purpose (e.g., AIC or TR). The HP-UE 804 may further transmit the high priority transmission (e.g., PSSCH or PUSCH) 824 within the overlapping resources.

To facilitate decoding of the low priority PSSCH at the Rx-UE 808, the LP-UE 806 may further transmit a preemption indication (PI) 826 to the Rx-UE 808. In the example shown in FIG. 8, the PI 826 may be transmitted within a next retransmission (PSSCH Re-Tx) 826 of the low priority sidelink transmission 820. In other examples, resources for the PI 826 may be included in the SLCI 818 or may be selected by the LP-UE 806. The PI 826 may be transmitted, for example, within SCI-1, SCI-2, a sidelink MAC-CE, or a sidelink RRC message.

Figure 9:
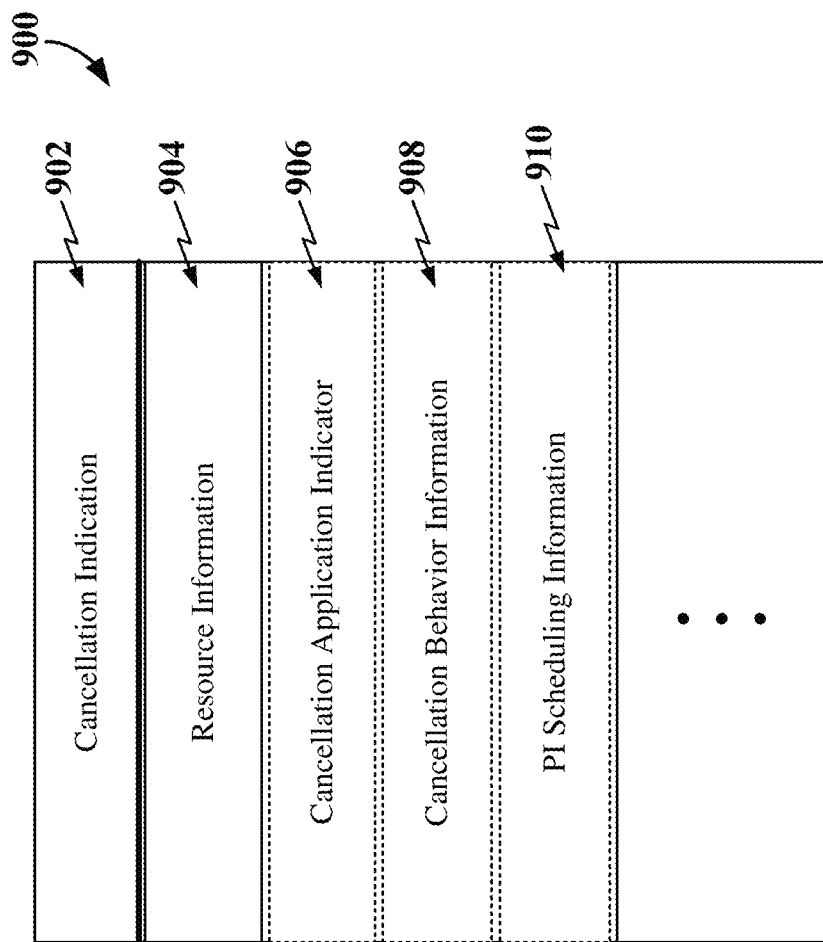
FIG. 9 is a diagram illustrating an example of downlink control information (DCI) carrying a cancellation indication according to some aspects.

FIG. 9 is a diagram illustrating an example of downlink control information (DCI) 900 carrying a cancellation indication 902 according to some aspects. The DCI 900 may include a DCI 2_4 format, an enhanced DCI 2_4 format, or a new format. The cancellation indication 902 includes resource information 904 identifying at least a portion of the resources allocated to a sidelink transmission that overlap with an additional transmission (e.g., an additional sidelink or uplink transmission). For example, the resource information 904 may include a plurality of bits, each corresponding to a resource block group (RBG) and symbol of a resource region (e.g., a sidelink resource pool).

In some examples, the cancellation indication 902 may be a sidelink cancellation indication (SLCI), an uplink cancellation indication (ULCI), or both an ULCI and SLCI. In some examples, dedicated DCI formats may be used for uplink cancellation (e.g., DCI 2_4), sidelink cancellation, and both uplink and sidelink cancellation. In other examples, the DCI 900 may be a DCI 2_4 and the cancellation indication 902 may be considered as both an ULCI and SLCI. In this example, the Tx UE may cancel any transmission (SL or UL) within the overlapping resources identified in the resource information 904. As another example, the DCI 900 may be an enhanced DCI (e.g., an enhanced DCI 2_4 or another/new DCI) that includes a cancellation application indicator 906, which may be a dedicated field of the cancellation indication 902. In other examples, instead of including a dedicated field, the cancellation application indicator may be transmitted within an RRC message that indicates to the UE whether the cancellation indication 902 received in the enhanced DCI is an SLCI, an ULCI, or both an SLCI and ULCI. In other examples, a CRC of the DCI 900 may be scrambled with one of a plurality of CI-RNTIs (e.g., a SLCI-RNTI, an ULCI-RNTI, or a SL/ULCI-RNTI) indicating whether the cancellation indication 902 is a SLCI, ULCI, or both SLCI and ULCI. In other examples, the DCI 900 may be transmitted within a specific search space or monitoring occasion that is associated with a particular cancellation type (e.g., sidelink, uplink, or both) based on a search space configuration of the PDCCH search space.

In examples in which the DCI 900 is a new or enhanced DCI format, the cancellation indication 902 may further include cancellation behavior information 908. In some examples, the resource information 904 may form a part of the cancellation behavior information 908. The cancellation behavior information 908 may further optionally include additional cancellation behavior information indicating a cancellation behavior applied to the sidelink transmission by the transmitting UE. For example, the cancellation behavior information 908 may include a cancellation type of the cancellation indication. The cancellation type may include a hard cancellation indicator or a soft cancellation indicator. The hard cancellation indicator cancels the sidelink transmission within at least the overlapping resources. The soft cancellation indicator may further indicate whether the transmitting UE should reduce the transmission power of the sidelink transmission within at least the overlapping resources or engage in other cancellation behavior to minimize interference and/or improve the signal properties of the sidelink transmission.

In some examples, the cancellation behavior information 908 may further indicate the cancellation behavior to be applied based on the priority of the sidelink transmission and/or a cast type (e.g., unicast, groupcast, or broadcast) of the sidelink transmission. In some examples, the cancellation behavior information 908 may further include a priority indicator and/or cast type of the additional transmission, and may indicate the cancellation behavior to be applied by the transmitting UE based on the respective priority types and/or cast types of the sidelink transmission and the additional transmission.

The DCI 900 carrying the cancellation indication 902 may further include PI scheduling information 910 indicating resources scheduled for a PI transmission by the transmitting UE. The PI resources may correspond to SCI-1 resources, SCI-2 resources, sidelink MAC-CE resources, or sidelink RRC resources.

Figure 10:
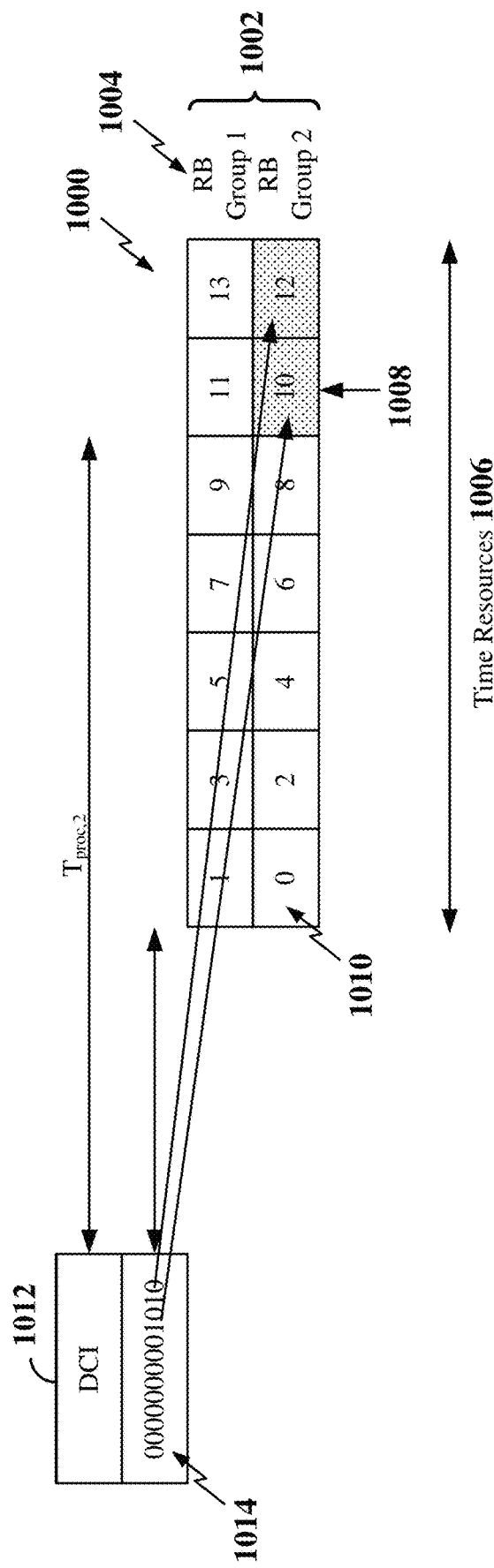
FIG. 10 is a diagram illustrating an example of a resource region configuration for indicating overlapping resources according to some aspects.

FIG. 10 is a diagram illustrating an example of a resource region configuration 1000 for indicating overlapping resources according to some aspects. The resource region configuration 1000 includes frequency resources 1002 divided into RB Groups 1004 and time resources 1006 divided into symbols 1008 of a slot. In the example shown in FIG. 10, two RB Groups (RB Group 1 and RB Group 2) are illustrated for simplicity. Each RB Group 1004 may include, for example, two or more RBs of a sub-channel. The symbols 1008 may be based on a semi-static TDD pattern of downlink, uplink, and flexible symbols in a cell. In some examples, the symbols 1008 may correspond to the uplink symbols and the flexible symbols in a slot (e.g., in examples in which the resource region configuration 1000 corresponds to an uplink and/or sidelink resource region). In other examples, the symbols 1008 may correspond to only the uplink symbols in a slot (e.g., in examples in which the resource region configuration 1000 corresponds to a sidelink resource region). Thus, the resource region configuration 1000 includes a plurality of resources 1010 (e.g., resources 0-12), each corresponding to an RB Group 1004 and a symbol 1008. The resource region configuration 1000 (e.g., TimeFrequencyRegionSL parameter) for sidelink cancellation may be configured via RRC signaling or as a codepoint (e.g., bitmap) in DCI.

The resource region configuration 1000 shown in FIG. 10 may be utilized to indicate overlapping resources between a low priority sidelink transmission and a higher priority additional transmission (e.g., uplink or sidelink transmission). For example, DCI 1012 carrying a cancellation indication may include resource information 1014 indicating the overlapping resources. The first symbol in the resource region configuration 1000 associated with the DCI 1012 may $T'_{proc,2}$ after the last symbol of the DCI 1012. In some examples, a UE may not expect to cancel a symbol 1008 starting earlier than $T_{proc,2}$ after the last symbol of a PDCCH control resource set (CORESET) detecting the DCI 1012.

As shown in FIG. 10, the resource information 1014 may include a plurality of bits, each mapping to one of the resources 1010 in the resource region configuration 1000. Each bit may be set to zero or one based on whether the corresponding resource 1010 is an overlapping resource. For example, a bit set to zero indicates there is no overlap between a sidelink transmission scheduled on the resource 1010 and an additional transmission, whereas a bit set to one indicates there is an overlap between a sidelink transmission scheduled on the resource 1010 and the additional transmission. In the example shown in FIG. 10, resources 10 and 12 are overlapping resources, and thus the bits in the resource information 1014 corresponding to resources 10 and 12 are set to one.

The DCI 1012 may correspond, for example, to a DCI 2_4 format, an enhanced format (e.g., an enhanced DCI 2_4) or a new format. In examples in which the DCI 1012 includes the DCI 2_4 format, the resource region configuration 1000 includes both uplink and flexible symbols 1008, since uplink transmissions may be scheduled on uplink and/or flexible symbols. In this example, the bits in the resource information 1014 that map to flexible symbols 1008 may be set to zero, as sidelink transmissions may not be scheduled on flexible symbols of a slot. In examples in which the DCI 1012 includes an enhanced or new DCI, the resource region configuration 1000 may include only uplink symbols 1008. In this example, each bit in the resource information 1014 may be set to zero or one, depending on the scheduled overlapping resources. In addition, the number of bits included in the resource information 1014 may be reduced, since sidelink transmissions may be scheduled on only uplink symbols, and therefore, flexible symbols may not be included in the resource region configuration 1000. For example, instead of including fourteen bits in the resource information 1014, the resource information 1014 may include only five or ten bits, depending on the number of uplink symbols in the semi-static TDD pattern.

Figure 11:
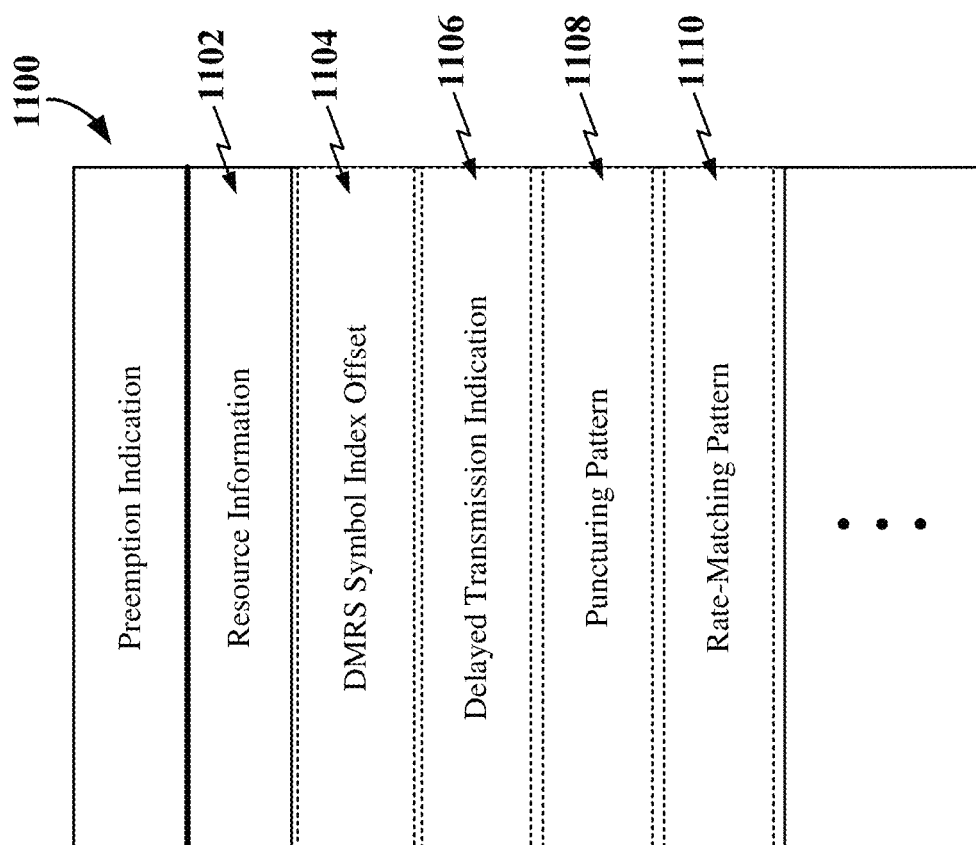
FIG. 11 is a diagram illustrating an example of a preemption indication according to some aspects.

FIG. 11 is a diagram illustrating an example of a preemption indication (PI) 1100 according to some aspects. The PI 1100 may be transmitted within, for example, a retransmission resource of a sidelink transmission or within SCI-1, SCI-2, a sidelink MAC-CE, or sidelink RRC message. The PI 1100 informs an Rx UE about the cancellation behavior applied to a sidelink transmission by the Tx UE to enable the Rx UE to attempt decoding or re-attempt decoding of the sidelink transmission.

The PI 1100 may include resource information 1102 indicating modified resources of a plurality of scheduled resources of a sidelink transmission. The resource information 1102 may further indicate whether the modified resources are cancelled resources or reduced power resources. In examples in which the modified resources are reduced power resources, the resource information 1102 may further indicate the transmission power of the sidelink transmission on the reduced power resources. In some examples, the resource information 1102 includes a cancellation pattern (e.g., a bitmap) for the modified resources. In some examples, the cancellation pattern may be the same as the resource information included in the cancellation indication (e.g., resource information 904/1014 shown in FIGS. 9/10). In other examples, the cancellation pattern may be different than the resource information included in the cancellation indication. As an example, the cancellation pattern may differ from the cancellation indication based on a minimum frequency resource size that may be cancelled. For example, if the cancellation indication cancels only a portion of a sub-channel, the Tx UE may cancel the entire sub-channel. Thus, the cancellation pattern indicates the actual modified resources of the sidelink transmission.

The PI 1100 may further optionally include a DMRS symbol index offset 1104, a delayed transmission indication 1106, a puncturing pattern 1108, and/or a rate-matching pattern 1110 for the sidelink transmission. The DMRS symbol index offset 1104 may indicate an offset between an original DMRS symbol of the sidelink transmission (e.g., based on the original scheduled sidelink transmission) and an actual DMRS symbol of the sidelink transmission (e.g., after modification of the sidelink transmission based on the cancellation indication). The delayed transmission indication 1106 may indicate that all symbols of the sidelink transmission are shifted by a certain offset (e.g., in symbols). Thus, the delayed transmission indication 1106 may indicate the first symbol of the modified sidelink transmission. The puncturing pattern 1108 may indicate a particular puncturing pattern applied to the sidelink transmission based on the cancellation indication. Similarly, the rate-matching pattern 1110 may indicate a particular rate-matching applied to the modified sidelink transmission based on the resources utilized for the sidelink transmission (e.g., the remaining resources of the scheduled resources that were not cancelled by the cancellation indication).

Various aspects of the disclosure provide for consideration of the impact to automatic gain control (AGC) calibration based on the overlapping resources including at least a portion of the AGC symbol. For example, the transmitting UE may cancel the overlapping frequency resources across all symbols of the sidelink transmission (e.g., all symbols of a slot carrying the sidelink transmission) or in just the overlapping AGC symbol. As another example, the transmitting UE may not cancel any portion of the AGC symbol regardless of whether there is overlap with the AGC symbol. As yet another example, the transmitting UE may delay the sidelink transmission by one symbol.

In some examples, the overlapping resources between a sidelink transmission and an additional transmission (e.g., another sidelink transmission or an uplink transmission) may include at least a portion of an automatic gain control (AGC) symbol in the sidelink transmission. In this example, the transmitting UE may be configured to selectively modify the sidelink transmission based on the impact to AGC calibration. For example, the transmitting UE may cancel the overlapping frequency resources across all symbols of the sidelink transmission (e.g., all symbols of a slot carrying the sidelink transmission) or in just the overlapping AGC symbol. As another example, the transmitting UE may not cancel any portion of the AGC symbol regardless of whether there is overlap between the AGC symbol and the additional transmission. As yet another example, the transmitting UE may delay the sidelink transmission by one symbol. The cancellation behavior of the transmitting UE may be configured by the base station (e.g., within the cancellation indication or via RRC signaling) or pre-configured on the UE based on 3GPP standards or specifications. In addition, the cancellation behavior of the transmitting UE may be based on the resource allocation mode (e.g., Mode 1 or Mode 2) of the receiving wireless communication device or a cast type (e.g., unicast, groupcast, broadcast) of the sidelink transmission.

FIGS. 12A and 12B are diagrams illustrating exemplary overlaps between an automatic gain control (AGC) symbol of a sidelink transmission and an additional transmission according to some aspects. In the examples shown in FIGS. 12A and 12B, time is in the horizontal direction with units of symbols 1202 (e.g., OFDM symbols); and frequency is in the vertical direction. Here, frequency resources (e.g., a carrier bandwidth) 1204 allocated for sidelink wireless communication are illustrated along the frequency axis. The carrier bandwidth 1204 may include a plurality of sub-channels, where each sub-channel may include a configurable number of PRBs (e.g., 10, 15, 20, 25, 50, 75, or 100 PRBs).

Each of FIGS. 12A and 12B illustrate an example of a respective slot 1200a or 1200b including fourteen symbols 1202 that may be used for a sidelink transmission. The slot structures of FIGS. 12A and 12B are similar to those illustrated in FIG. 4A, and therefore, various features of the sidelink slots 1200a and 1200b may be discerned by reference to FIG. 4A. For example, each sidelink slot 1200a and 1200b includes a physical sidelink control channel (PSCCH) 1206 and a physical sidelink shared channel (PSSCH) 1208 of a sidelink transmission, as shown and described above in connection with FIG. 4A. The PSSCH 1208 includes a first portion 1208a that is time division multiplexed (TDMed) with the PSCCH 1206 and a second portion 1208b that is FDMed with the PSCCH 1206. The PSSCH 1208 may further include a DMRS 1214. Each slot 1200a and 1200b further includes SCI-2 1212 mapped to RBs within the fifth symbol containing a PSSCH DMRS. In addition, a gap symbol 1216 is present after the PSSCH 1208 in each slot 1200a and 1200b. In each of FIGS. 12A and 12B, the second symbol of each slot 1200a and 1200b is further copied onto (repeated on) a first symbol 1210 thereof for automatic gain control (AGC) settling.

FIGS. 12A and 12B further illustrate a respective additional transmission 1218a and 1218b scheduled on resources that overlap with the AGC symbol 1210. For example, each additional transmission 1218a and 1218b is shown scheduled on time resources corresponding to the AGC symbol 1210 of slots 1200a and 1200b (e.g., the additional transmissions 1218a and 1218b are scheduled on the same time resources as the AGC symbols 1210 of slots 1200a and 1200b). In addition, the additional transmissions 1218a and 1218b are shown scheduled on frequency resources 1220a and 1220b that partially overlap the frequency resources scheduled for the sidelink transmission.

A UE (e.g., a transmitting UE) scheduled to transmit the sidelink transmission in slot 1200a or 1200b may receive a cancellation indication indicating the overlap in resources scheduled for the additional transmission 1218a or 1218b and the AGC symbol 1210 of the sidelink transmission. In response to receiving the cancellation indication, the transmitting UE may selectively transmit the sidelink transmission in slot 1200a or 1200b. In some examples, the transmitting UE may selectively transmit the sidelink transmission based on at least one of a resource allocation mode (e.g., Mode 1 or Mode 2) of a receiving UE or a cast type (e.g., unicast, groupcast, or broadcast) of the sidelink transmission. The transmitting UE may further selectively transmit the sidelink transmission based on a cancellation behavior of the transmitting UE, which may be configured by the network (e.g., via the cancellation indication or RRC signaling) or pre-configured on the transmitting UE (e.g., by the original equipment manufacturer (OEM) based on, for example, 3GPP standards or specifications). For example, the control information including the cancellation indication may further include cancellation behavior information providing the cancellation behavior to be applied to the sidelink transmission.

In some examples, the transmitting UE may not allow cancellation of the AGC symbol 1210. In this example, the transmitting UE may transmit the sidelink transmission, including the AGC symbol 1210, on all of the frequency resources 1204 allocated for the sidelink transmission within the slot 1200a or 1200b.

In other examples, the transmitting UE may cancel the sidelink transmission in at least the overlapping frequency resources 1220a or 1220b on all of the time resources, including the AGC symbol 1210. The transmitting UE may then transmit the sidelink transmission on the remaining (e.g., non-cancelled) frequency resources on all of the time resources, including the AGC symbol 1210. This example enables AGC calibration for the sidelink transmission on the remaining frequency resources.

For example, as shown in FIG. 12A, the transmitting UE may cancel the sidelink transmission within frequency resources 1222a on each of the symbols 1202 in the slot 1200a. The transmitting UE may then transmit the sidelink transmission via remaining (e.g., non-cancelled) frequency resources 1224a allocated for the sidelink transmission. In the example shown in FIG. 12A, the cancelled frequency resources 1222a correspond to the frequency resources 1220a scheduled for the additional transmission 1218a, as indicated in the cancellation indication. Therefore, the remaining frequency resources 1224a correspond to the non-overlapping resources between the sidelink transmission and the additional transmission. However, in some examples, the granularity of the frequency resources 1220a indicated in the cancellation indication may be different than the granularity of the sidelink transmission at the transmitting UE. For example, the cancellation indication may have a granularity of resource blocks (RBs), whereas the sidelink transmission may be allocated in terms of sub-channels (e.g., which may include multiple RBs). In this example, if only one RB of a sub-channel overlaps with the scheduled sidelink transmission, the transmitting UE may cancel the sidelink transmission on the entire sub-channel. As a result, the remaining frequency resources 1224a utilized for the sidelink transmission may include only a portion of the non-overlapping resources (e.g., some of the non-overlapping resources may be cancelled).

The example shown in FIG. 12A maintains the peak-to-average-power ratio (PAPR) of the sidelink transmission since there is no frequency discontinuity between the overlapping resources 1220a and non-overlapping resources (e.g., the remaining resources 1224a). FIG. 12B illustrates an example of frequency discontinuity between the overlapping resources 1220b of the additional transmission and the non-overlapping frequency resources. In the example shown in FIG. 12B, the overlapping resources 1220b are located within the resources 1204 allocated for the sidelink transmission, such that the non-overlapping resources 1224b and 1226 are discontiguous.

In some examples, the transmitting UE may cancel the sidelink transmission in the overlapping resources 1220b on all symbols of the sidelink transmission and transmit the sidelink transmission via both of the non-overlapping resources 1224b and 1226 based on the respective frequency granularity of the cancellation indication and frequency resource allocation of the sidelink transmission (e.g., similar to that shown in FIG. 12A). In this example, the transmitting UE may further reduce a transmission power of the sidelink transmission due to the higher PAPR resulting from the discontinuity between frequency resources 1224b and 1226.

In some examples, the transmitting UE may transmit the sidelink transmission on each of the non-overlapping resources 1224b and 1226 based on a percentage of discontiguous frequency resources of the frequency resources 1204 allocated to the sidelink transmission. Here, the discontiguous frequency resources include the non-overlapping resources 1226 (e.g., the smaller discontiguous portion of non-overlapping resources). For example, the transmitting UE may determine a discontiguous resource percentage (e.g., number of RBs of the discontiguous frequency resources 1226/total number of RBs of the frequency resources 1204) and transmit the sidelink transmission on all of the non-overlapping resources 1224b and 1226 in response to the discontiguous resource percentage being less than a threshold.

In other examples, as shown in FIG. 12B, the transmitting UE may cancel the sidelink transmission within frequency resources 1222b corresponding to both the overlapping resources 1220b and the discontiguous frequency resources 1226 and transmit the sidelink transmission on the remaining non-overlapping resources 1224b (e.g., based on the frequency granularities). Thus, in this example, the transmitting UE cancels the sidelink transmission in a portion of the non-overlapping frequency resources 1226 that is contiguous with the overlapping frequency resources 1220b. For example, if the sidelink transmission is allocated to sub-channels 1-4, and the overlapping resources include sub-channel 3, the transmitting UE may cancel the sidelink transmission in sub-channels 3 and 4 to maintain a contiguous frequency for the sidelink transmission via sub-channels 1 and 2, thus improving the PAPR.

In either the example of FIG. 12A or 12B, the transmitting UE may boost the transmission power of the sidelink transmission transmitted on the remaining contiguous non-overlapping frequency resources (e.g., 1224a or 1224b) to improve the signal-to-noise ratio (SNR) of the sidelink transmission. In addition, the transmitting UE may re-generate a waveform of the sidelink transmission based on the non-overlapping frequency resources (e.g., 1224a, 1224b, or both 1224b and 1226) utilized for the sidelink transmission. However, if the processing time after receipt of the cancellation indication does not allow for re-computation of the waveform, the transmitting UE may instead cancel the entire sidelink transmission (e.g., not transmit the sidelink transmission). For example, the transmitting UE may cancel the entire sidelink transmission (e.g., cancel transmission on all frequency resources and time resources) based on a time difference between a control symbol carrying the cancellation indication and the AGC symbol 1210 of the sidelink transmission. The transmitting UE may cancel the entire sidelink transmission in response to the time difference being less than a threshold set based on the processing time for re-generation of the waveform. In this example, the transmitting UE may utilize retransmission resources allocated for the sidelink transmission to initially transmit the sidelink transmission.

Instead of modifying the entire sidelink transmission based on a cancellation indication indicating an overlap between the AGC symbol 1210 and an additional transmission, the transmitting UE may selectively modify only the AGC symbol 1210, as shown in the examples of FIGS. 13A and 13B. As in FIGS. 12A and 12B, in the examples shown in FIGS. 13A and 13B, time is in the horizontal direction with units of symbols 1302 (e.g., OFDM symbols); and frequency is in the vertical direction. Here, frequency resources (e.g., a carrier bandwidth) 1304 allocated for sidelink wireless communication are illustrated along the frequency axis. The carrier bandwidth 1304 may include a plurality of sub-channels, where each sub-channel may include a configurable number of PRBs (e.g., 10, 15, 20, 25, 50, 75, or 100 PRBs).

Each of FIGS. 13A and 13B illustrate an example of a respective slot 1300a or 1300b including fourteen symbols 1302 that may be used for a sidelink transmission. The slot structures of FIGS. 13A and 13B are similar to those illustrated in FIGS. 4A, 12A and 12B, and therefore, various features of the sidelink slots 1300a and 1300b may be discerned by reference to FIGS. 4A, 12A, and 12B. For example, each sidelink slot 1300a and 1300b includes a physical sidelink control channel (PSCCH) 1306 and a physical sidelink shared channel (PSSCH) 1308 of a sidelink transmission, as shown and described above in connection with FIGS. 4A, 12A, and 12B. The PSSCH 1308 includes a first portion 1308a that is time division multiplexed (TDMed) with the PSCCH 1306 and a second portion 1308b that is FDMed with the PSCCH 1306. The PSSCH 1308 may further include a DMRS 1314. Each slot 1300a and 1300b further includes SCI-2 1312 mapped to RBs within the fifth symbol containing a PSSCH DMRS. In addition, a gap symbol 1313 is present after the PSSCH 1308 in each slot 1300a and 1300b. In each of FIGS. 13A and 13B, the second symbol of each slot 1300a and 1300b is further copied onto (repeated on) a first symbol 1310 thereof for automatic gain control (AGC) settling.

FIGS. 13A and 13B further illustrate a respective additional transmission 1318a and 1318b scheduled on resources that overlap with the AGC symbol 1310. For example, each additional transmission 1318a and 1318b is shown scheduled on time resources corresponding to the AGC symbol 1310 of slots 1300a and 1300b (e.g., the additional transmissions 1318a and 1318b are scheduled on the same time resources as the AGC symbols 1310 of slots 1300a and 1300b). In addition, the additional transmissions 1318a and 1318b are shown scheduled on frequency resources 1320a and 1320b that partially overlap the frequency resources scheduled for the sidelink transmission.

In response to receiving a cancellation indication indicating the overlap in resources scheduled for the additional transmission 1318a or 1318b and the AGC symbol 1310 of the sidelink transmission, the transmitting UE may selectively transmit the AGC symbol 1310 in slot 1300a or 1300b. In some examples, the transmitting UE may selectively transmit the AGC symbol 1310 based on at least one of a resource allocation mode (e.g., Mode 1 or Mode 2) of a receiving UE or a cast type (e.g., unicast, groupcast, or broadcast) of the sidelink transmission. The transmitting UE may further selectively transmit the AGC symbol 1310 based on a cancellation behavior of the transmitting UE, which may be configured by the network (e.g., via the cancellation indication or RRC signaling) or pre-configured on the transmitting UE (e.g., by the original equipment manufacturer (OEM) based on, for example, 3GPP standards or specifications). For example, the control information including the cancellation indication may further include cancellation behavior information providing the cancellation behavior to be applied to the AGC symbol of the sidelink transmission.

In some examples, the transmitting UE may cancel an automatic gain control transmission of the sidelink transmission on the AGC symbol 1310 (e.g., not transmit the AGC symbol). In some examples, the transmitting UE may cancel the automatic gain control transmission of the sidelink transmission on the AGC symbol 1310 in at least the overlapping frequency resources 1320a or 1320b. The transmitting UE may then transmit the automatic gain control transmission on the remaining (e.g., non-cancelled) frequency resources on the AGC symbol 1310. In some examples, the transmitting UE may utilize a pre-configured narrowband reference signal as the automatic gain control transmission for automatic gain control training. The pre-configured narrowband reference signal may be pre-generated and maintained at the transmitting UE to insert into the AGC symbol 1310 (e.g., instead of copying the second symbol into the AGC symbol 1310) in response to receiving a cancellation indication cancelling a portion of the frequency resources in the AGC symbol 1310. The transmitting UE may then further transmit the remainder of the sidelink transmission (e.g., PSCCH 1306/PSSCH 1308) via all of the frequency resources 1304 allocated for the sidelink transmission on a remainder of the time resources (e.g., all symbols of the slot 1300a outside of the AGC symbol 1310). This example enables AGC calibration for the sidelink transmission on the remaining frequency resources 1324a, but does not provide for AGC calibration on the cancelled resources 1320a.

For example, as shown in FIG. 13A, the transmitting UE may cancel the automatic gain control transmission within frequency resources 1322a on the AGC symbol 1310. The transmitting UE may then transmit the automatic gain control transmission via remaining (e.g., non-cancelled) frequency resources 1324a allocated for the sidelink transmission on the AGC symbol 1310. In the example shown in FIG. 13A, the cancelled frequency resources 1322a correspond to the frequency resources 1320a scheduled for the additional transmission 1318a, as indicated in the cancellation indication. Therefore, the remaining frequency resources 1324a correspond to the non-overlapping resources between the sidelink transmission and the additional transmission. However, in some examples, the granularity of the frequency resources 1320a indicated in the cancellation indication may be different than the granularity of the sidelink transmission at the transmitting UE. For example, the cancellation indication may have a granularity of resource blocks (RBs), whereas the sidelink transmission may be allocated in terms of sub-channels (e.g., which may include multiple RBs). In this example, if only one RB of a sub-channel overlaps with the scheduled sidelink transmission, the transmitting UE may cancel the automatic gain control transmission on the entire sub-channel of the AGC symbol 1310. As a result, the remaining frequency resources 1324a utilized for the automatic gain control transmission on the AGC symbol 1310 may include only a portion of the non-overlapping resources (e.g., some of the non-overlapping resources may be cancelled).

In the example shown in FIG. 13B, the overlapping resources 1320b are located within the resources 1304 allocated for the sidelink transmission, such that the non-overlapping resources 1324b and 1326 are discontiguous. In some examples, the transmitting UE may cancel the automatic gain control transmission in the overlapping resources 1320b on the AGC symbol 1310 and transmit the automatic gain control transmission via both of the non-overlapping resources 1324b and 1326 based on the respective frequency granularity of the cancellation indication and frequency resource allocation of the sidelink transmission (e.g., similar to that shown in FIG. 13A). In this example, the transmitting UE may puncture the automatic gain control transmission, such as a pre-configured narrowband reference signal, in the overlapping frequency resources 1320b. For example, the transmitting UE may utilize a fast frequency hopping (FFH) mechanism to generate the waveform for the punctured automatic gain control transmission.

In other examples, as shown in FIG. 13B, the transmitting UE may cancel the automatic gain control transmission within frequency resources 1322b corresponding to both the overlapping resources 1320b and the discontiguous frequency resources 1326 and transmit the automatic gain control transmission on the remaining non-overlapping resources 1324b (e.g., based on the frequency granularities). Thus, in this example, the transmitting UE cancels the automatic gain control transmission in a portion of the non-overlapping frequency resources 1326 that is contiguous with the overlapping frequency resources 1320b.

In either the example of FIG. 13A or 13B, the transmitting UE may boost the transmission power of the automatic gain control transmission transmitted on the remaining contiguous non-overlapping frequency resources (e.g., 1324a or 1324b) to maintain the same power across all symbols 1302.

Figure 14:
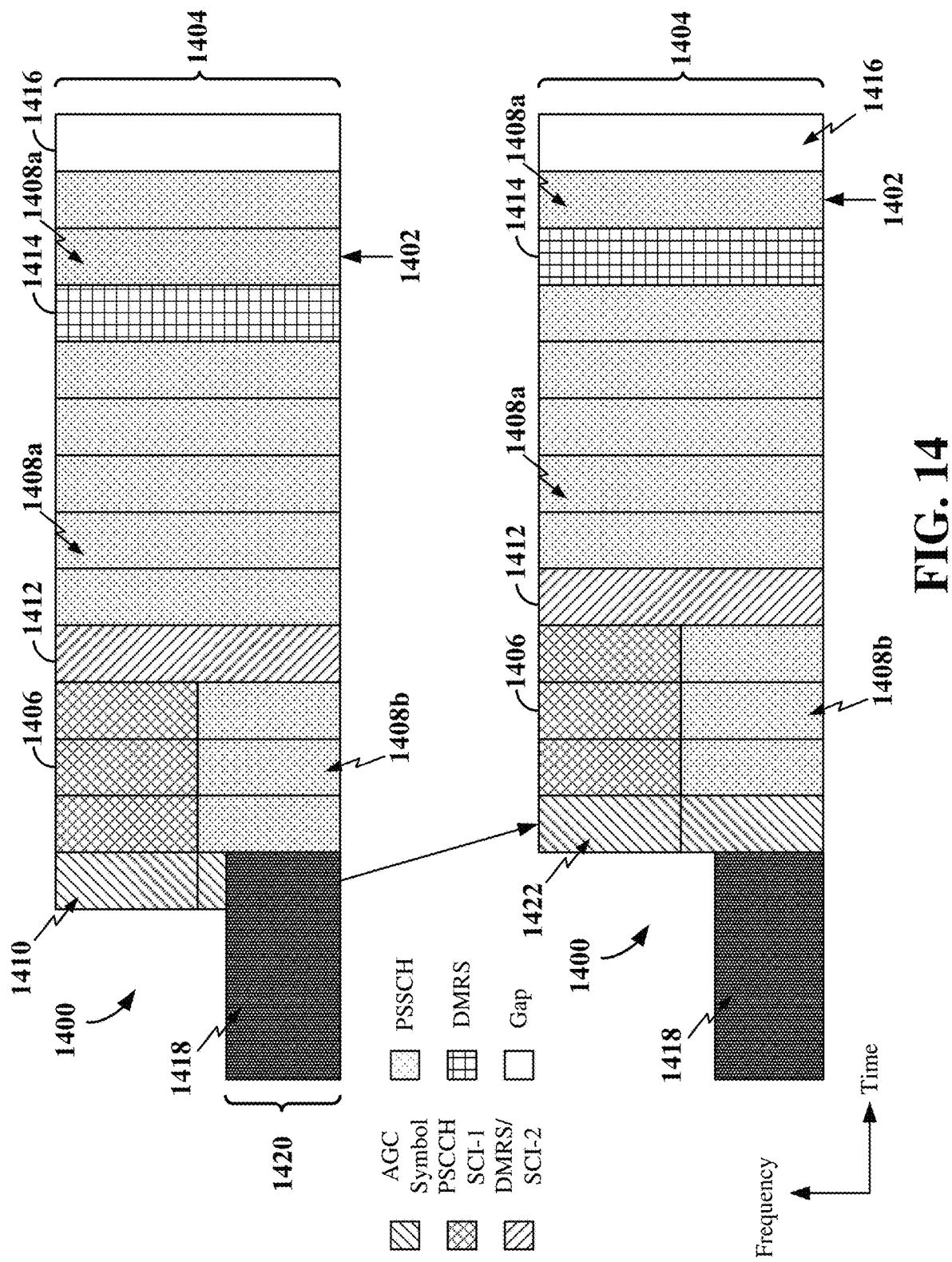
FIG. 14 is a diagram illustrating an exemplary modification of a sidelink transmission based on an overlap between an AGC symbol of a sidelink transmission and an additional transmission according to some aspects.

FIG. 14 is a diagram illustrating an exemplary modification of a sidelink transmission based on an overlap between an AGC symbol of a sidelink transmission and an additional transmission according to some aspects. As in FIGS. 4A, 4B, and 12A-13B, time is in the horizontal direction with units of symbols 1402 (e.g., OFDM symbols); and frequency is in the vertical direction. Here, frequency resources (e.g., a carrier bandwidth) 1404 allocated for sidelink wireless communication are illustrated along the frequency axis. The carrier bandwidth 1404 may include a plurality of sub-channels, where each sub-channel may include a configurable number of PRBs (e.g., 10, 15, 20, 25, 50, 75, or 100 PRBs).

FIG. 14 illustrates an example of a slot 1400 including fourteen symbols 1402 (e.g., symbols 0 through 13) that may be used for a sidelink transmission. The slot structure of FIG. 14 is similar to those illustrated in FIGS. 4A, 12A, 12B, 13A, and 13B, and therefore, various features of the sidelink slot 1400 may be discerned by reference to FIGS. 4A, 12A, 12B, 13A, and 13B. For example, the sidelink slot 1400 includes a physical sidelink control channel (PSCCH) 1406 and a physical sidelink shared channel (PSSCH) 1408 of a sidelink transmission. The PSSCH 1408 includes a first portion 1408a that is time division multiplexed (TDMed) with the PSCCH 1406 and a second portion 1408b that is FDMed with the PSCCH 1406. The PSSCH 1408 may further include a DMRS 1414. The slot 1400 further includes SCI-2 1412 mapped to RBs within the fifth symbol containing a PSSCH DMRS. In addition, a gap symbol 1416 is present after the PSSCH 1408 in the slot 1400. In FIG. 14, the second symbol of the slot 1400 is further copied onto (repeated on) a first symbol 1410 (e.g., symbol 0) thereof for automatic gain control (AGC) settling.

FIG. 14 further illustrates an additional transmission 1418 scheduled on resources that overlap with the AGC symbol 1410. For example, the additional transmission 1418 is shown scheduled on time resources corresponding to the AGC symbol 1410 of slot 1400 (e.g., the additional transmission 1418 is scheduled on the same time resources as the AGC symbol 1410 of the slot 1400). In addition, the additional transmission 1418 is shown scheduled on frequency resources 1420 that partially overlap the frequency resources scheduled for the sidelink transmission.

In response to receiving a cancellation indication indicating the overlap in resources scheduled for the additional transmission 1418 and the AGC symbol 1410 of the sidelink transmission, the transmitting UE may selectively transmit the sidelink transmission in the slot 1400. In some examples, the transmitting UE may selectively transmit the sidelink transmission based on at least one of a resource allocation mode (e.g., Mode 1 or Mode 2) of a receiving UE or a cast type (e.g., unicast, groupcast, or broadcast) of the sidelink transmission. The transmitting UE may further selectively transmit the sidelink transmission based on a cancellation behavior of the transmitting UE, which may be configured by the network (e.g., via the cancellation indication or RRC signaling) or pre-configured on the transmitting UE (e.g., by the original equipment manufacturer (OEM) based on, for example, 3GPP standards or specifications). For example, the control information including the cancellation indication may further include cancellation behavior information providing the cancellation behavior to be applied to the sidelink transmission.

In some examples, as shown in FIG. 14, the transmitting UE may delay the sidelink transmission to produce a delayed sidelink transmission for transmission on delayed time resources. For example, the delayed time resources may include all of the time resources excluding the AGC symbol 1410. Thus, the delayed sidelink transmission may include symbols 1 through 13, and exclude symbol 0. The delayed sidelink transmission may further be transmitted on all frequency resources allocated to the sidelink transmission.

In some examples, the delayed sidelink transmission may exclude an automatic gain control transmission. In this example, the transmitting UE may cancel the AGC symbol 1410 and continue transmitting the remainder of the sidelink transmission (e.g., PSCCH 1406/PSSCH 1408) on the remaining time resources (e.g., symbols 1 through 13).

In other examples, as shown in FIG. 14, the transmitting UE may delay all symbols of the sidelink transmission by one symbol. In this example, the delayed sidelink transmission may include an automatic gain control transmission 1422 on the second symbol (e.g., symbol 1) of the slot 1400 for AGC settling. In some examples, the automatic gain control transmission 1422 may correspond to a copied version of the next symbol (e.g., symbol 2) of the slot 1400. In some examples, the delayed sidelink transmission may be aligned with other sidelink transmissions transmitted via the delayed time resources in the sidelink network. For example, the base station may broadcast the cancellation indication in the sidelink network to enable each UE scheduled to transmit a sidelink transmission within slot 1400 to delay their respective sidelink transmissions based on the cancellation indication, thereby aligning the sidelink transmissions in the sidelink network.

The delayed sidelink transmission may further include a prepared reference signal (e.g., a DMRS 1412/1414 and/or CSI-RS). The prepared reference signal may be prepared prior to transmission of the sidelink transmission within the slot 1400 and may be generated based on an original symbol index of the reference signal in the time resources. For example, SCI-2/DMRS 1412 may be generated based on symbol index 4 of the original sidelink transmission and DMRS 1414 may be generated based on symbol index 10 of the original sidelink transmission. However, in the delayed sidelink transmission, SCI-2/DMRS 1412 may be transmitted in symbol 5 and DMRS 1414 may be transmitted in symbol 11. In this example, the transmitting UE may generate and transmit a notification message (e.g., preemption information) to the receiving UE notifying the receiving UE of the original symbol indexes associated with the reference signals 1412 and 1414.

In some examples, the transmitting UE may re-generate the reference signal(s) (e.g., DMRSs 1412/1414) based on a respective new symbol index of the reference signal(s) in the delayed time resources. For example, the transmitting UE may re-generate SCI-2/DMRS 1412 based on new symbol index 5 and DMRS 1414 based on new symbol index 11. In this example, the transmitting UE may generate and transmit a notification message (e.g., preemption information) to the receiving UE notifying the receiving UE of the new symbol indexes associated with the reference signals 1412 and 1414. The transmitting UE may re-generate the reference signal(s) based on a time difference between a control symbol carrying the cancellation indication and the new reference signal symbol index of the first reference signal (e.g., SCI-2/DMRS 1412) in the sidelink transmission. The transmitting UE may re-generate the reference signal in response to the time difference being less than a threshold set based on the processing time for re-generation of the reference signal. Otherwise, the transmitting UE may transmit the prepared reference signal(s) using the old symbol index(es).

The transmitting UE may further selectively puncture the delayed sidelink transmission for transmission within slot 1400. For example, the transmitting UE may puncture a portion of the sidelink transmission to produce the delayed sidelink transmission. The punctured portion of the sidelink transmission may include, for example, a last data symbol, as shown in FIG. 14. In other examples, the punctured portion may include a DMRS symbol, other reference signal symbol, or other data symbol.

Figure 15:
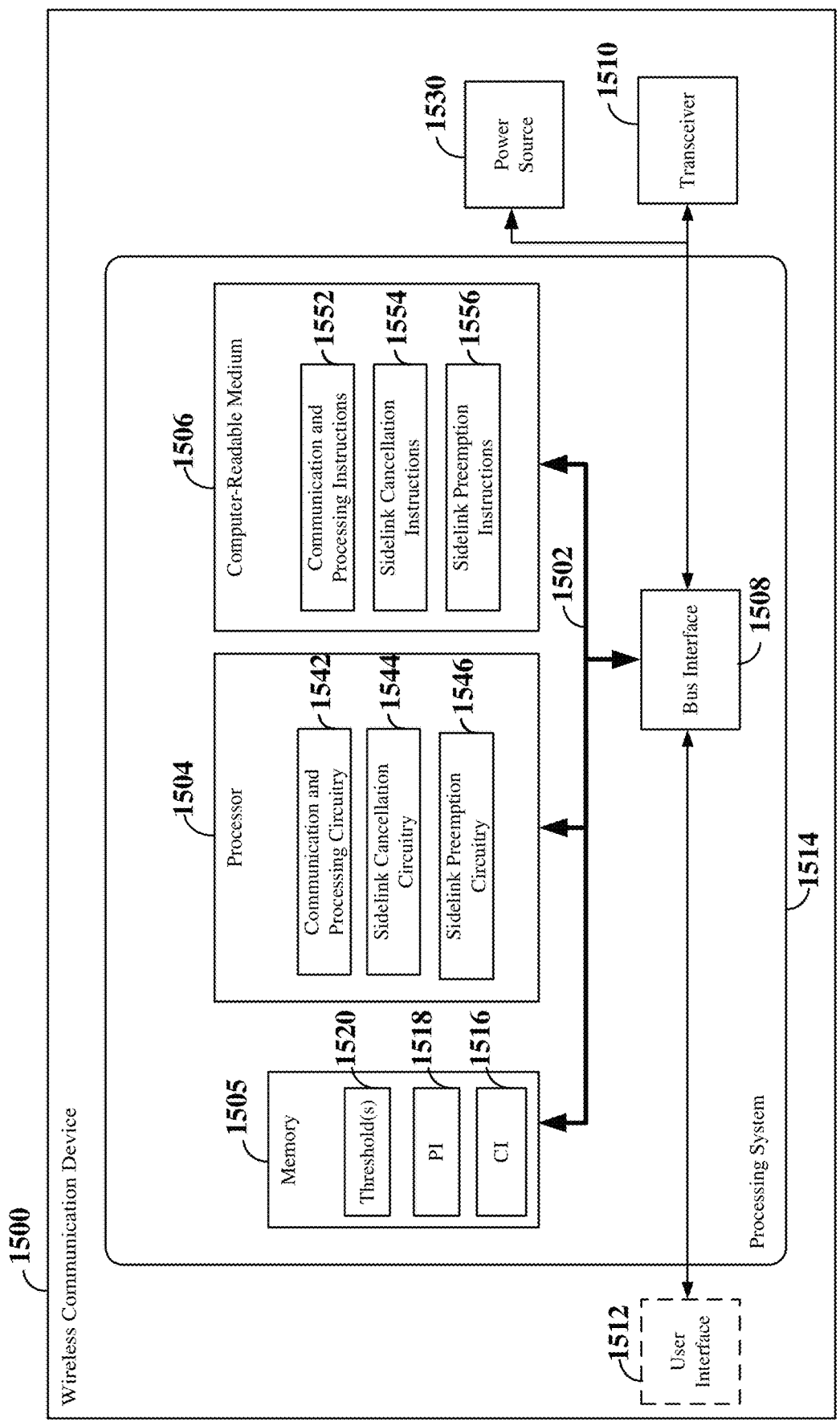
FIG. 15 is a block diagram illustrating an example of a hardware implementation for a wireless communication device employing a processing system according to some aspects.

FIG. 15 is a block diagram illustrating an example of a hardware implementation for a wireless communication device 1500 employing a processing system 1514. For example, the wireless communication device 1500 may correspond to a sidelink device, such as a V2X device, D2D device or other UE or wireless communication device configured for sidelink communication, as shown and described above in reference to FIGS. 1, 3, 6, and/or 7.

The wireless communication device 1500 may be implemented with a processing system 1514 that includes one or more processors 1504. Examples of processors 1504 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the wireless communication device 1500 may be configured to perform any one or more of the functions described herein. That is, the processor 1504, as utilized in the wireless communication device 1500, may be used to implement any one or more of the processes and procedures described below.

The processor 1504 may in some instances be implemented via a baseband or modem chip and in other implementations, the processor 1504 may include a number of devices distinct and different from a baseband or modem chip (e.g., in such scenarios as may work in concert to achieve examples discussed herein). And as mentioned above, various hardware arrangements and components outside of a baseband modem processor can be used in implementations, including RF-chains, power amplifiers, modulators, buffers, interleavers, adders/summers, etc.

In this example, the processing system 1514 may be implemented with a bus architecture, represented generally by the bus 1502. The bus 1502 may include any number of interconnecting buses and bridges depending on the specific application of the processing system 1514 and the overall design constraints. The bus 1502 links together various circuits including one or more processors (represented generally by the processor 1504), a memory 1505, and computer-readable media (represented generally by the computer-readable medium 1506). The bus 1502 may also link various other circuits such as timing sources, peripherals, voltage regulators, and power management circuits, which are well known in the art, and therefore, will not be described any further.

A bus interface 1508 provides an interface between the bus 1502, a transceiver 1510, and a power source 1530. The transceiver 1510 provides a communication interface or a means for communicating with various other apparatus over a transmission medium (e.g., air interface). Depending upon the nature of the apparatus, a user interface 1512 (e.g., keypad, display, touch screen, speaker, microphone, control knobs, etc.) may also be provided. Of course, such a user interface 1512 is optional, and may be omitted in some examples.

The processor 1504 is responsible for managing the bus 1502 and general processing, including the execution of software stored on the computer-readable medium 1506. The software, when executed by the processor 1504, causes the processing system 1514 to perform the various functions described below for any particular apparatus. The computer-readable medium 1506 and the memory 1505 may also be used for storing data that is manipulated by the processor 1504 when executing software. For example, the memory 1505 may store one or more of a cancellation indication (CI) 1516, a preemption indication (PI) 1518, and/or one or more threshold(s) 1520 used by the processor 1504 in generating and/or processing sidelink transmissions.

One or more processors 1504 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 1506.

The computer-readable medium 1506 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 1506 may reside in the processing system 1514, external to the processing system 1514, or distributed across multiple entities including the processing system 1514. The computer-readable medium 1506 may be embodied in a computer program product. By way of example, a computer program product may include a computer-readable medium in packaging materials. In some examples, the computer-readable medium 1506 may be part of the memory 1505. Those skilled in the art will recognize how best to implement the described functionality presented throughout this disclosure depending on the particular application and the overall design constraints imposed on the overall system.

In some aspects of the disclosure, the processor 1504 may include circuitry configured for various functions. For example, the processor 1504 may include communication and processing circuitry 1542, configured to communicate with one or more sidelink devices (e.g., other UEs) via respective sidelinks (e.g., PC5 interfaces). In addition, the communication and processing circuitry 1542 may be configured to communicate with a network entity (e.g., a base station, such as s gNB or eNB) via a Uu link. In some examples, the communication and processing circuitry 1542 may include one or more hardware components that provide the physical structure that performs processes related to wireless communication (e.g., signal reception and/or signal transmission) and signal processing (e.g., processing a received signal and/or processing a signal for transmission). For example, the communication and processing circuitry 1542 may include one or more transmit/receive chains.

In some implementations where the communication involves receiving information, the communication and processing circuitry 1542 may obtain information from a component of the wireless communication device 1500 (e.g., from the transceiver 1510 that receives the information via radio frequency signaling or some other type of signaling suitable for the applicable communication medium), process (e.g., decode) the information, and output the processed information. For example, the communication and processing circuitry 1542 may output the information to another component of the processor 1504, to the memory 1505, or to the bus interface 1508. In some examples, the communication and processing circuitry 1542 may receive one or more of signals, messages, other information, or any combination thereof. In some examples, the communication and processing circuitry 1542 may receive information via one or more channels. In some examples, the communication and processing circuitry 1542 may include functionality for a means for receiving. In some examples, the communication and processing circuitry 1542 may include functionality for a means for processing, including a means for demodulating, a means for decoding, etc.

In some implementations where the communication involves sending (e.g., transmitting) information, the communication and processing circuitry 1542 may obtain information (e.g., from another component of the processor 1504, the memory 1505, or the bus interface 1508), process (e.g., modulate, encode, etc.) the information, and output the processed information. For example, the communication and processing circuitry 1542 may output the information to the transceiver 1510 (e.g., that transmits the information via radio frequency signaling or some other type of signaling suitable for the applicable communication medium). In some examples, the communication and processing circuitry 1542 may send one or more of signals, messages, other information, or any combination thereof. In some examples, the communication and processing circuitry 1542 may send information via one or more channels. In some examples, the communication and processing circuitry 1542 may include functionality for a means for sending (e.g., a means for transmitting). In some examples, the communication and processing circuitry 1542 may include functionality for a means for generating, including a means for modulating, a means for encoding, etc.

In some examples, the communication and processing circuitry 1542 may be configured to receive sidelink scheduling information scheduling a sidelink transmission from a transmitting wireless communication device to a receiving wireless communication device. The scheduling information may include, for example, scheduled resources for the sidelink transmission and/or a cast type (e.g., unicast, groupcast, or broadcast) of the sidelink transmission. The scheduled resources may include, for example, frequency resources and time resources allocated for the sidelink transmission. The sidelink scheduling information may be received, for example, via downlink control information (DCI) format 3_0.

The communication and processing circuitry 1542 may further be configured to receive control information including a cancellation indication (CI) 1516 from a network entity. The cancellation indication 1516 may indicate at least an overlap between a portion of the resources allocated to the sidelink transmission and an additional transmission. In some examples, the portion of the resources may correspond to an automatic gain control (AGC) symbol of the time resources allocated for the sidelink transmission. Thus, the cancellation indication 1516 may indicate at least overlapping resources between the AGC symbol scheduled for the sidelink transmission and additional resources scheduled for the additional transmission. In some examples, the control information may further include cancellation behavior information associated with the cancellation indication 1516. For example, the cancellation behavior information may provide the cancellation behavior to be applied by the transmitting wireless communication device to the AGC symbol of the sidelink transmission. In some examples, the cancellation behavior may be based on the resource allocation mode (e.g., Mode 1 or Mode 2) of the receiving wireless communication device or a cast type (e.g., unicast, groupcast, broadcast) of the sidelink transmission. In some examples, the control information may include DCI format 2_4 or a new DCI format.

The communication and processing circuitry 1542 may further be configured to communicate (e.g., transmit or receive) a preemption indication 1518. For example, the preemption indication 1518 may be communicated from the transmitting wireless communication device transmitting the sidelink transmission to the receiving wireless communication device within a retransmission resource for the sidelink transmission, SCI-1, SCI-2, a sidelink MAC-CE, or a sidelink RRC message. In some examples, preemption scheduling information for the preemption indication 1518 may be included in the control information carrying the cancellation indication. The preemption indication 1518 may include preemption information associated with the overlapping resources. In some examples, a receiving wireless communication device may receive the preemption information within the control information carrying the cancellation indication 1516 from the network entity. In this example, the preemption indication 1518 may additionally optionally be sent from the transmitting wireless communication device to the receiving wireless communication device.

The communication and processing circuitry 1542 may further be configured to selectively communicate (e.g., transmit or receive) the sidelink transmission based on the cancellation indication 1516. In examples in which the wireless communication device is a transmitting wireless communication device, the communication and processing circuitry 1542 may be configured to transmit the sidelink transmission including the AGC symbol on all of the frequency resources and all of the time resources allocated for the sidelink transmission (e.g., without modification of the sidelink transmission). In other examples, the communication and processing circuitry 1542 may be configured to transmit the sidelink transmission via non-overlapping frequency resources and on all of the time resources allocated for the sidelink transmission. In other examples, the communication and processing circuitry 1542 may be configured to not transmit the sidelink transmission on the scheduled resources.

In other examples, the communication and processing circuitry 1542 may be configured to transmit an AGC transmission of the sidelink transmission via non-overlapping frequency resources on the AGC symbol. In this example, the communication and processing circuitry 1542 may be configured to puncture the AGC transmission in the overlapping frequency resources on the AGC symbol.

In other examples, the communication and processing circuitry 1542 may be configured to transmit a delayed sidelink transmission on all of the frequency resources and delayed time resources that include all of the time resources allocated to the sidelink transmission excluding the AGC symbol. In this example, the communication and processing circuitry 1542 may further be configured to align the sidelink transmission with other sidelink transmissions transmitted via the delayed time resource. In addition, the communication and processing circuitry 1542 may be configured to transmit a notification message (e.g., preemption indication 1518) to the receiving wireless communication device notifying the receiving wireless communication device of an original symbol index or a new symbol index associated with a reference signal included in the delayed sidelink transmission. The communication and processing circuitry 1542 may further be configured to puncture a portion of the sidelink transmission to produce the delayed sidelink transmission. The communication and processing circuitry 1542 may further be configured to execute communication and processing instructions (software) 1552 stored in the computer-readable medium 1506 to implement one or more of the functions described herein.

The processor 1504 may further include sidelink cancellation circuitry 1544, configured to receive the control information including the sidelink cancellation indication from the communication and processing circuitry 1542 and selectively transmit the sidelink transmission based on the cancellation indication 1516. In some examples, the sidelink cancellation circuitry 1544 may be configured to selectively transmit the scheduled sidelink transmission based on the cancellation indication 1516 and cancellation behavior defined for the wireless communication device (e.g., via the cancellation behavior information in the control information, via RRC signaling, or as pre-configured on the wireless communication device 1500). In some examples, the cancellation behavior of the sidelink cancellation circuitry 1544 may be based on the resource allocation mode (e.g., Mode 1 or Mode 2) of the receiving wireless communication device or a cast type (e.g., unicast, groupcast, broadcast) of the sidelink transmission.

For example, the sidelink cancellation circuitry 1544 may be configured to cancel the entire sidelink transmission (e.g., not transmit the sidelink transmission). For example, the sidelink cancellation circuitry 1544 may cancel the sidelink transmission on all of the frequency resources and all of the time resources based on a time difference between a control symbol including the cancellation indication and the AGC symbol of the sidelink transmission. In an example, the sidelink cancellation circuitry 1544 may cancel the entire sidelink transmission in response to the time difference being less than a time threshold 1520. For example, the time threshold 1520 may be set based on the processing time for re-generation of the waveform of the sidelink transmission based on the non-overlapping frequency resources utilized for the sidelink transmission.

In some examples, the sidelink cancellation circuitry 1544 may be configured to not cancel the sidelink transmission on any of the scheduled resources. In this example, the sidelink cancellation circuitry 1544 may operate together with the communication and processing circuitry 1542 to transmit the sidelink transmission including the AGC symbol on all of the frequency resources and all of the time resources allocated for the sidelink transmission.

In some examples, the overlap between the AGC symbol of the time resources allocated for the sidelink transmission and the additional transmission includes overlapping frequency resources of the frequency resources allocated for the sidelink transmission. In this example, the sidelink cancellation circuitry 1544 may be configured to cancel the sidelink transmission in the overlapping frequency resources on all of the time resources allocated to the sidelink transmission. In some examples, the sidelink cancellation circuitry 1544 may be configured to cancel the sidelink transmission in the overlapping frequency resources based on a frequency granularity associated with the sidelink transmission. For example, if the frequency granularity of the sidelink transmission differs from the frequency granularity of the cancellation indication, the sidelink cancellation circuitry 1544 may further cancel a portion of the non-overlapping resources based on the frequency granularity difference.

The sidelink cancellation circuitry 1544 may further be configured to operate together with the communication and processing circuitry 1542 to transmit the sidelink transmission via non-overlapping frequency resources on all of the time resources. In addition, the sidelink cancellation circuitry 1544 may further be configured to re-generate a waveform of the sidelink transmission based on the non-overlapping frequency resources.

In some examples, the non-overlapping frequency resources include discontiguous frequency resources that occupy a discontiguous resource percentage of the frequency resources. In this example, the sidelink cancellation circuitry 1544 may compare the discontiguous resource percentage (e.g., number of RBs of the discontiguous frequency resources/total number of RBs of the frequency resources) to a resource percentage threshold 1520. In examples in which the discontiguous resource percentage is less than the resource percentage threshold 1520, the sidelink cancellation circuitry 1544 may operate together with the communication and processing circuitry 1542 to transmit the sidelink transmission via all of the non-overlapping resources on all of the time resources allocated to the sidelink transmission. In some examples, the sidelink cancellation circuitry 1544 may further be configured to control the power source 1530 to reduce a transmission power of the sidelink transmission due to the higher PAPR resulting from the discontinuity between the non-overlapping frequency resources.

In other examples, the sidelink cancellation circuitry 1544 may further cancel the sidelink transmission in a portion of the non-overlapping frequency resources contiguous with the overlapping frequency resources (e.g., in response to the discontiguous resource percentage being greater than the resource percentage threshold 1520). In this example, the sidelink cancellation circuitry 1544 may operate together with the communication and processing circuitry 1542 to transmit the sidelink transmission via the contiguous non-overlapping frequency resources (e.g., non-cancelled frequency resources) on all of the time resources allocated to the sidelink transmission. In some examples, the sidelink cancellation circuitry 1544 may further be configured to control the power source 1530 to boost a transmission power of the sidelink transmission transmitted on the contiguous non-overlapping frequency resources to improve the SNR of the sidelink transmission.

In some examples, the sidelink cancellation circuitry 1544 may be configured to cancel an AGC transmission of the sidelink transmission on the AGC symbol of the sidelink transmission in the overlapping frequency resources. In this example, the sidelink cancellation circuitry 1544 may be configured to operate together with the communication and processing circuitry 1542 to transmit the AGC transmission via non-overlapping frequency resources on the AGC symbol and to transmit a remainder of the sidelink transmission via all of the frequency resources on a remainder of the time resources. In some examples, the sidelink cancellation circuitry 1544 may further be configured to control the power source 1530 to boost a transmission power of the AGC transmission transmitted on the non-overlapping frequency resources. In some examples, the sidelink cancellation circuitry 1544 may further be configured to cancel the AGC transmission in a portion of the non-overlapping frequency resources that are contiguous with the overlapping frequency resources such that the sidelink transmission is transmitted within contiguous non-overlapping resources. In some examples, the AGC transmission may include a pre-configured narrowband reference signal for AGC training. The sidelink cancellation circuitry 1544 may further be configured to operate together with the communication and processing circuitry 1542 to puncture the AGC transmission in the overlapping frequency resources.

In some examples, the sidelink cancellation circuitry 1544 may be configured to operate together with the communication and processing circuitry 1542 to delay the sidelink transmission and to transmit the delayed sidelink transmission on all of the frequency resources and delayed time resources of the time resources that include all of the time resources excluding the automatic gain control symbol. In some examples, the sidelink cancellation circuitry 1544 may be configured to cancel an AGC transmission of the sidelink transmission. In some examples, the delayed sidelink transmission includes a reference signal generated based on an original symbol index of the reference signal in the time resources. In other examples, the sidelink cancellation circuitry 1544 may be configured to re-generate a reference signal for the sidelink transmission based on a new symbol index of the reference signal in the delayed time resources. In some examples, the sidelink cancellation circuitry 1544 may operate together with the communication and processing circuitry 1542 to puncture a portion of the sidelink transmission to produce the delayed sidelink transmission. The sidelink cancellation circuitry 1544 may further be configured to execute sidelink cancellation instructions (software) 1554 stored in the computer-readable medium 1506 to implement one or more of the functions described herein.

The processor 1504 may further include sidelink preemption circuitry 1546, configured to either generate and transmit a preemption indication indicating preemption information to a receiving wireless communication device or process a received sidelink transmission based on the preemption information. The preemption information may include at least one of resource information identifying at least the portion of the resources, a symbol index offset for a demodulation reference signal, a delayed transmission indication, a puncturing pattern of the sidelink transmission, a rate matching pattern of the sidelink transmission, or a power control parameter. In some examples, the preemption information may include an original symbol index of a reference signal included in a delayed sidelink transmission or a new symbol index of a re-generated reference signal included in the delayed sidelink transmission.

In examples in which the wireless communication device 1500 is a receiving wireless communication device, the sidelink preemption circuitry 1546 may be configured to operate together with the communication and processing circuitry 1542 to receive the preemption indication including the preemption information from the transmitting wireless communication device and/or the cancellation indication indicating the preemption information (e.g., the resource information and cancellation behavior information) from a network entity (e.g., a base station). In examples in which the preemption information is received from the transmitting wireless communication device, the sidelink preemption circuitry 1546 may be configured to receive the preemption indication within a retransmission resource for the sidelink transmission, first stage sidelink control information, second stage sidelink control information, a sidelink medium access control (MAC) control element (MAC-CE), or a sidelink radio resource control (RRC) message. In addition, the sidelink preemption circuitry 1546 may be configured to re-attempt decoding of the sidelink transmission based on the preemption indication. In examples in which the preemption information is received from the network entity, the sidelink preemption circuitry 1546 may be configured to receive the control information (e.g., DCI 2_4 or a new DCI format) including the cancellation indication from the network entity. In this example, the sidelink preemption circuitry 1546 may be configured to initially attempt decoding of the sidelink transmission based on the preemption information. The sidelink preemption circuitry 1546 may further be configured to execute sidelink preemption instructions (software) 1556 stored in the computer-readable medium 1506 to implement one or more of the functions described herein.

Figure 16:
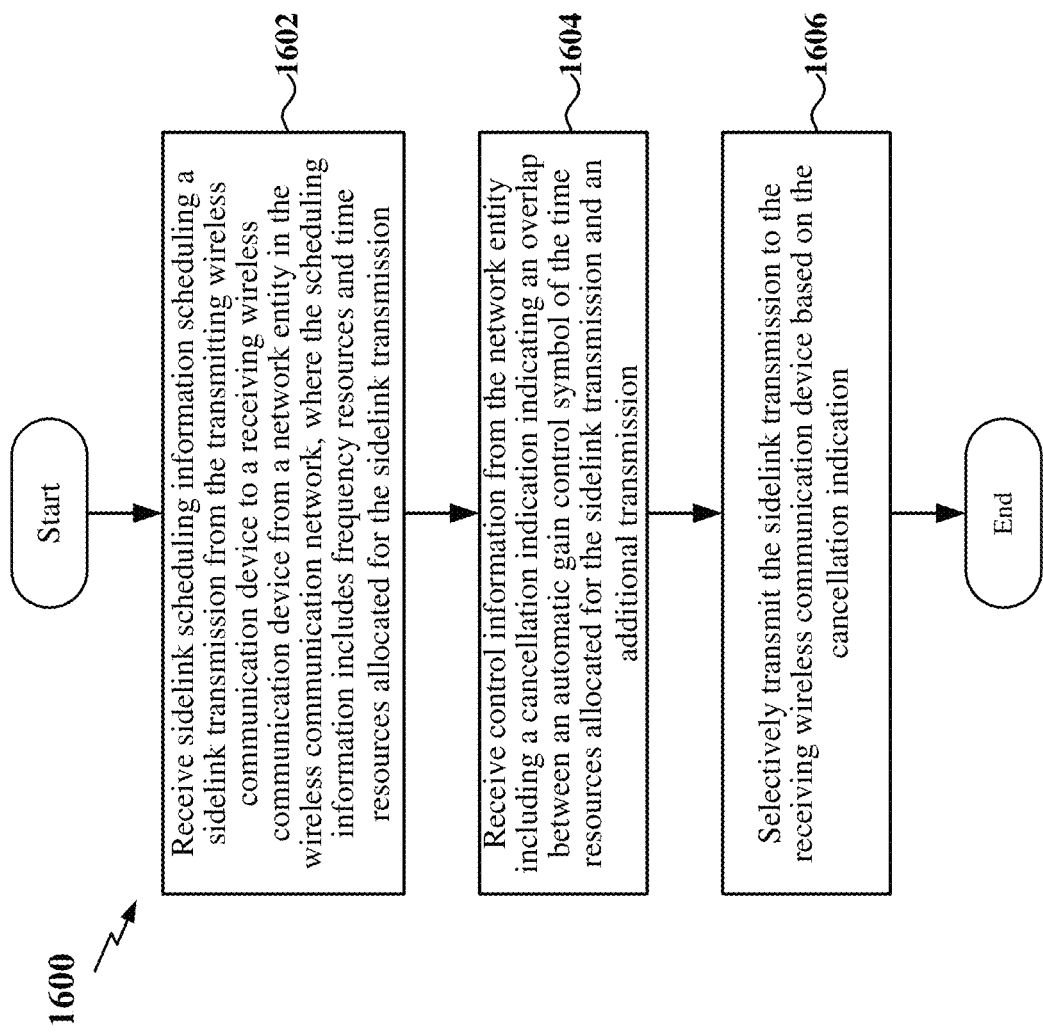
FIG. 16 is a flow chart of an exemplary method for sidelink cancellation of an automatic gain control symbol at a wireless communication device according to some aspects.

FIG. 16 is a flow chart of an exemplary method 1600 for sidelink cancellation of an automatic gain control symbol according to some aspects. As described below, some or all illustrated features may be omitted in a particular implementation within the scope of the present disclosure, and some illustrated features may not be required for implementation of all examples. In some examples, the method may be performed by the wireless communication device 1500, as described above and illustrated in FIG. 15, by a processor or processing system, or by any suitable means for carrying out the described functions.

At block 1602, the wireless communication device (e.g., a transmitting wireless communication device configured for sidelink communication) may receive sidelink scheduling information scheduling a sidelink transmission from the transmitting wireless communication device to a receiving wireless communication device from a network entity (e.g., a base station, such as a gNB) in the wireless communication network. The scheduling information can include frequency resources and time resources allocated for the sidelink transmission. In some examples, the sidelink scheduling information may be received within DCI 3_0. For example, the communication and processing circuitry 1542 and transceiver 1510, shown and described above in connection with FIG. 15, may provide a means to receive the sidelink scheduling information.

At block 1604, the transmitting wireless communication device may receive control information from the network entity including a cancellation indication indicating an overlap between an automatic gain control (AGC) symbol of the time resources allocated for the sidelink transmission and an additional transmission. In some examples, the control information includes downlink control information (DCI) format 2_4 or a new DCI format. In some examples, the control information further includes cancellation behavior information associated with the cancellation indication. For example, the communication and processing circuitry 1542 and transceiver 1510, shown and described above in connection with FIG. 15, may provide a means to receive the control information including the cancellation indication.

At block 1606, the transmitting wireless communication device may selectively transmit the sidelink transmission based on the cancellation indication. In some examples, the transmitting wireless communication device may transmit the sidelink transmission including the automatic gain control symbol on all of the frequency resources and all of the time resources allocated for the sidelink transmission. In some examples, the transmitting wireless communication device may cancel the sidelink transmission on all of the frequency resources and all of the time resources. For example, the transmitting wireless communication device may cancel the sidelink transmission on all of the frequency resources and all of the time resources based on a time difference between a control symbol comprising the cancellation indication and the automatic gain control symbol of the sidelink transmission. In some examples, the transmitting wireless communication device may selectively transmit the sidelink transmission based on at least one of a resource allocation mode of the receiving wireless communication device or a cast type of the sidelink transmission. In some examples, the transmitting wireless communication device may apply a cancellation behavior to at least the automatic gain control symbol based on the cancellation behavior information.

In some examples, the transmitting wireless communication device may cancel the sidelink transmission in overlapping frequency resources on all of the time resources and transmit the sidelink transmission via non-overlapping frequency resources on all of the time resources. For example, the transmitting wireless communication device may cancel the sidelink transmission in the overlapping frequency resources based on a frequency granularity associated with the sidelink transmission. In other examples, the non-overlapping frequency resource may include discontiguous frequency resources occupying a discontiguous resource percentage of the frequency resources. In this example, the transmitting wireless communication device may transmit the sidelink transmission via the non-overlapping frequency resource on all of the time resources in response to the discontiguous resource percentage being less than a threshold. In addition, the transmitting wireless communication device may reduce a transmission power of the sidelink transmission based on the discontiguous frequency resources. In some examples, the transmitting wireless communication device may cancel the sidelink transmission in a portion of the non-overlapping frequency resources contiguous with the overlapping frequency resources. In some examples, the transmitting wireless communication device may boost a transmission power of the sidelink transmission transmitted on the non-overlapping frequency resources. In some examples, the transmitting wireless communication device may re-generate a waveform of the sidelink transmission based on the non-overlapping frequency resources.

In some examples, the transmitting wireless communication device may cancel an automatic gain control transmission of the sidelink transmission on the automatic gain control symbol of the sidelink transmission in the overlapping frequency resources, transmit the automatic gain control transmission via non-overlapping frequency resources of the frequency resources on the automatic gain control symbol, and transmit a remainder of the sidelink transmission via all of the frequency resource on a remainder of the time resources. In some examples, the transmitting wireless communication device may puncture the automatic gain control transmission in the overlapping frequency resources. In some examples, the automatic gain control transmission includes a preconfigured narrowband reference signal for automatic gain control training. In some examples, the wireless communication device may cancel the automatic gain control transmission in a portion of the non-overlapping frequency resources contiguous with the overlapping frequency resources. In some examples, the transmitting wireless communication device may boost a transmission power of the automatic gain control transmission transmitted on the non-overlapping frequency resources.

In some examples, the transmitting wireless communication device may delay the sidelink transmission to produce a delayed sidelink transmission and transmit the delayed sidelink transmission on all of the frequency resources and delayed time resources of the time resources. The delayed time resources can include all of the time resources excluding the automatic gain control symbol. In some examples, the transmitting wireless communication device may cancel an automatic gain control transmission of the sidelink transmission. In some examples, the transmitting wireless communication device may align the sidelink transmission with other sidelink transmissions transmitted via the delayed time resources. In some examples, the delayed sidelink transmission includes a reference signal generated based on an original symbol index of the reference signal in the time resources. In this example, the transmitting wireless communication device may transmit a notification message to the receiving wireless communication device notifying the receiving wireless communication device of the original symbol index associated with the reference signal. In some examples, the transmitting wireless communication device may re-generate a reference signal for the sidelink transmission based on a new symbol index of the reference signal in the delayed time resources, and transmit a notification message to the receiving wireless communication device notifying the receiving wireless communication device of the new symbol index associated with the reference signal. In some examples, the wireless communication device may puncture a portion of the sidelink transmission to produce the delayed sidelink transmission. For example, the sidelink cancellation circuitry 1544, together with the communication and processing circuitry 1542 and transceiver 1510, shown and described above in connection with FIG. 15 may provide a means to selectively transmit the sidelink transmission.

Figure 17:
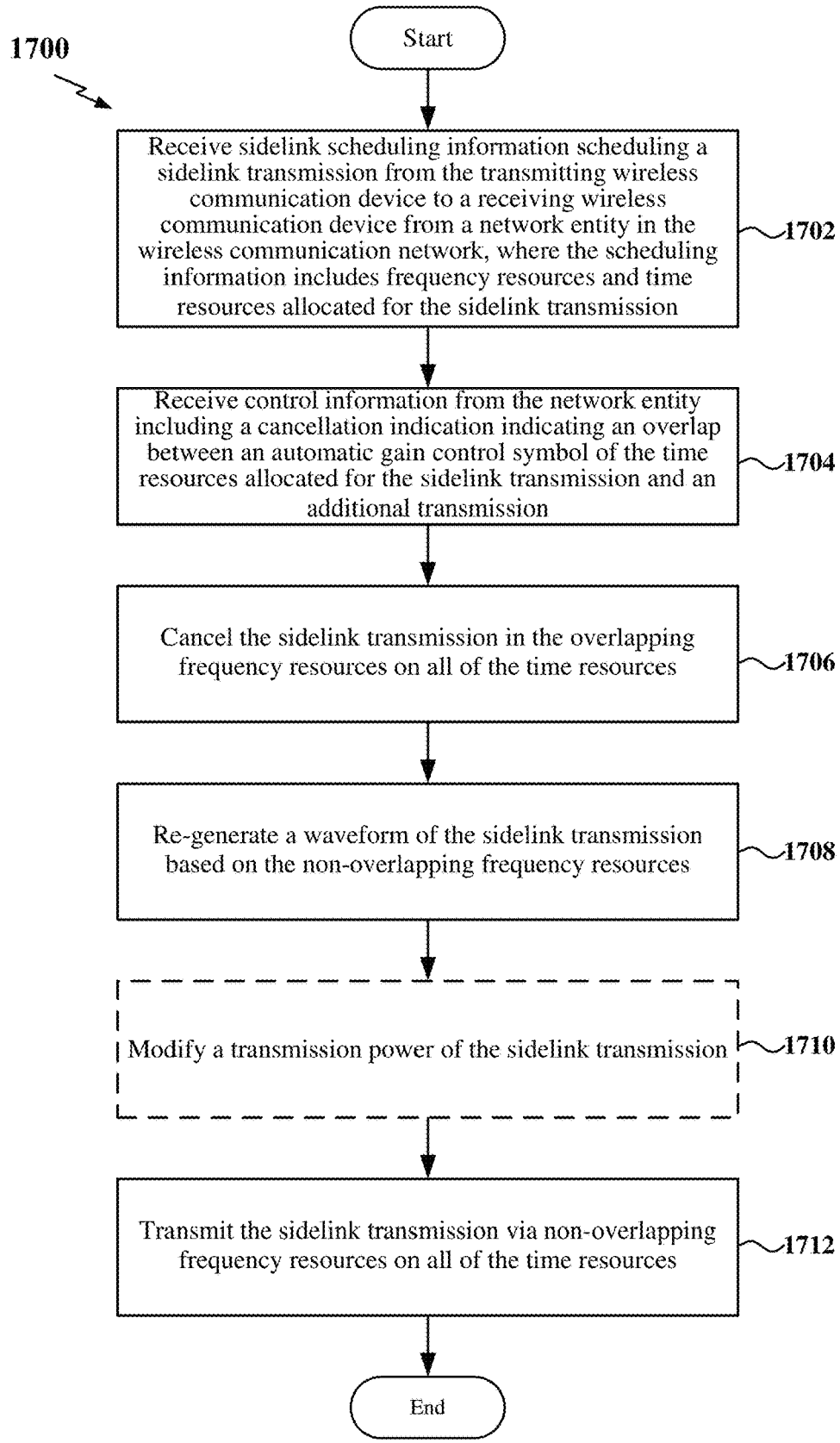
FIG. 17 is a flow chart of another exemplary method for sidelink cancellation of an automatic gain control symbol at a wireless communication device according to some aspects.

FIG. 17 is a flow chart of another exemplary method 1700 for sidelink cancellation of an automatic gain control symbol according to some aspects. As described below, some or all illustrated features may be omitted in a particular implementation within the scope of the present disclosure, and some illustrated features may not be required for implementation of all examples. In some examples, the method may be performed by the wireless communication device 1500, as described above and illustrated in FIG. 15, by a processor or processing system, or by any suitable means for carrying out the described functions.

At block 1702, the wireless communication device (e.g., a transmitting wireless communication device configured for sidelink communication) may receive sidelink scheduling information scheduling a sidelink transmission from the transmitting wireless communication device to a receiving wireless communication device from a network entity (e.g., a base station, such as a gNB) in the wireless communication network. The scheduling information can include frequency resources and time resources allocated for the sidelink transmission. In some examples, the sidelink scheduling information may be received within DCI 3_0. For example, the communication and processing circuitry 1542 and transceiver 1510, shown and described above in connection with FIG. 15, may provide a means to receive the sidelink scheduling information.

At block 1704, the transmitting wireless communication device may receive control information from the network entity including a cancellation indication indicating an overlap between an automatic gain control (AGC) symbol of the time resources allocated for the sidelink transmission and an additional transmission. In some examples, the control information includes downlink control information (DCI) format 2_4 or a new DCI format. In some examples, the control information further includes cancellation behavior information associated with the cancellation indication. In some examples, the overlap may include overlapping frequency resources of the frequency resources allocated for the sidelink transmission. For example, the communication and processing circuitry 1542 and transceiver 1510, shown and described above in connection with FIG. 15, may provide a means to receive the control information including the cancellation indication.

At block 1706, the transmitting wireless communication device may cancel the sidelink transmission in the overlapping frequency resources on all of the time resources. In some examples, the transmitting wireless communication device may cancel the sidelink transmission in the overlapping frequency resources based on a frequency granularity associated with the sidelink transmission. In some examples, the wireless communication device may further cancel the sidelink transmission in a portion of the non-overlapping frequency resources contiguous with the overlapping frequency resources. For example, the sidelink cancellation circuitry 1544, together with the communication and processing circuitry 1542 and transceiver 1510, shown and described above in connection with FIG. 15 may provide a means to cancel the sidelink transmission in the overlapping resources.

At block 1708, the transmitting wireless communication device may re-generate a waveform of the sidelink transmission based on the non-overlapping frequency resources. For example, the sidelink cancellation circuitry 1544, together with the communication and processing circuitry 1542 and transceiver 1510, shown and described above in connection with FIG. 15 may provide a means to re-generate the waveform of the sidelink transmission based on the non-overlapping frequency resources.

At block 1710, the transmitting wireless communication device may optionally modify a transmission power of the sidelink transmission. In some examples, the transmitting wireless communication device may reduce a transmission power of the sidelink transmission based on discontiguous frequency resources of the non-overlapping frequency resources. In other examples, the transmitting wireless communication device may boost a transmission power of the sidelink transmission transmitted on the non-overlapping frequency resources. For example, the sidelink cancellation circuitry 1544, together with the power source 1530, shown and described above in connection with FIG. 15 may modify the transmission power of the sidelink transmission.

At block 1712, the transmitting wireless communication device may transmit the sidelink transmission via non-overlapping frequency resources on all of the time resources. In some examples, the non-overlapping frequency resources include discontiguous frequency resources occupying a discontiguous resource percentage of the frequency resources. In this example, the transmitting wireless communication device may transmit the sidelink transmission via the non-overlapping frequency resources on all of the time resources in response to the discontiguous resource percentage being less than a threshold. For example, the sidelink cancellation circuitry 1544, together with the communication and processing circuitry 1542 and transceiver 1510, shown and described above in connection with FIG. 15 may provide a means to transmit the sidelink transmission via the non-overlapping frequency resources.

Figure 18:
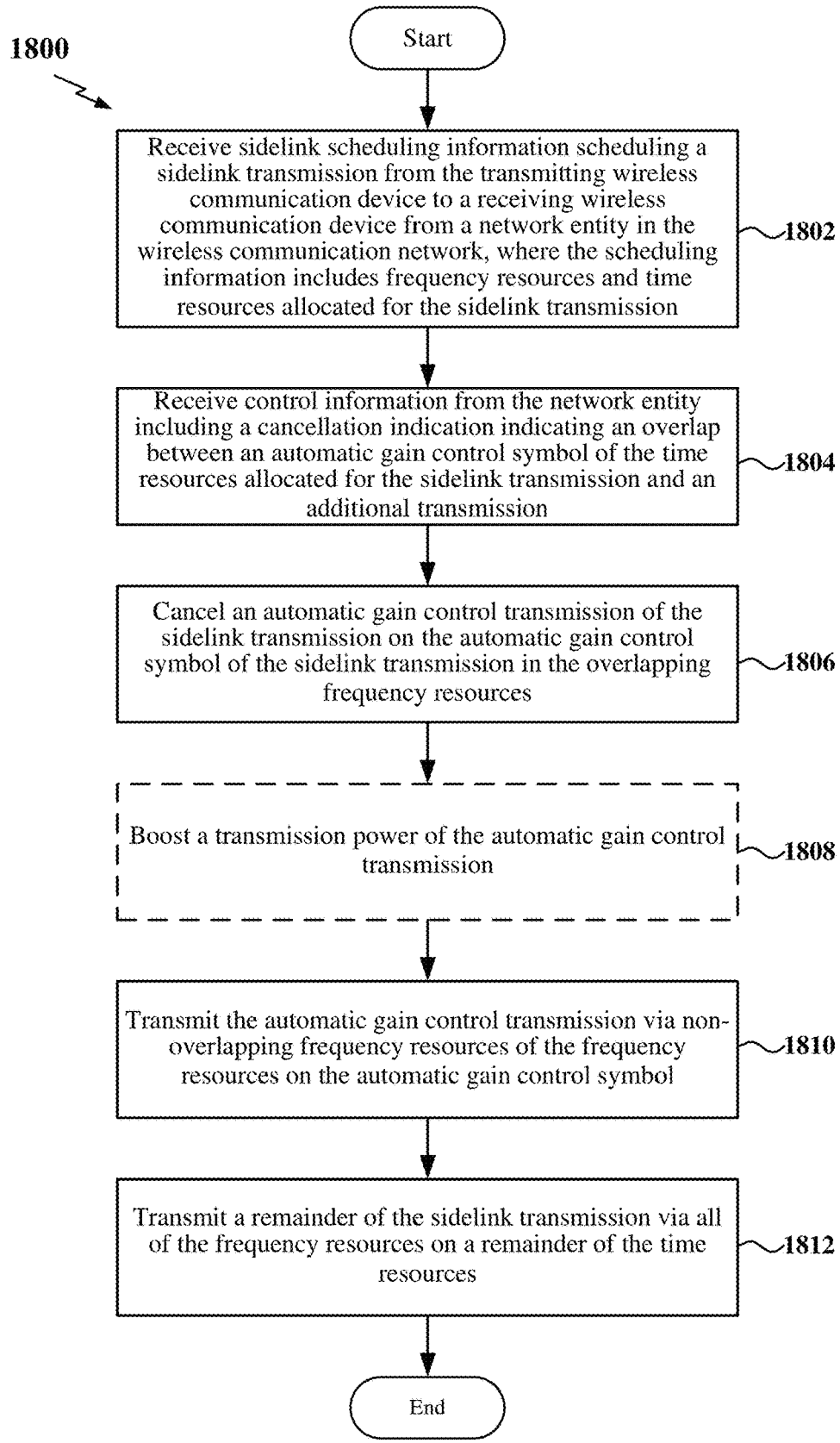
FIG. 18 is a flow chart of another exemplary method for sidelink cancellation of an automatic gain control symbol at a wireless communication device according to some aspects.

FIG. 18 is a flow chart of another exemplary method 1800 for sidelink cancellation of an automatic gain control symbol according to some aspects. As described below, some or all illustrated features may be omitted in a particular implementation within the scope of the present disclosure, and some illustrated features may not be required for implementation of all examples. In some examples, the method may be performed by the wireless communication device 1500, as described above and illustrated in FIG. 15, by a processor or processing system, or by any suitable means for carrying out the described functions.

At block 1802, the wireless communication device (e.g., a transmitting wireless communication device configured for sidelink communication) may receive sidelink scheduling information scheduling a sidelink transmission from the transmitting wireless communication device to a receiving wireless communication device from a network entity (e.g., a base station, such as a gNB) in the wireless communication network. The scheduling information can include frequency resources and time resources allocated for the sidelink transmission. In some examples, the sidelink scheduling information may be received within DCI 3_0. For example, the communication and processing circuitry 1542 and transceiver 1510, shown and described above in connection with FIG. 15, may provide a means to receive the sidelink scheduling information.

At block 1804, the transmitting wireless communication device may receive control information from the network entity including a cancellation indication indicating an overlap between an automatic gain control (AGC) symbol of the time resources allocated for the sidelink transmission and an additional transmission. In some examples, the control information includes downlink control information (DCI) format 2_4 or a new DCI format. In some examples, the control information further includes cancellation behavior information associated with the cancellation indication. In some examples, the overlap may include overlapping frequency resources of the frequency resources on the automatic gain control symbol. For example, the communication and processing circuitry 1542 and transceiver 1510, shown and described above in connection with FIG. 15, may provide a means to receive the control information including the cancellation indication.

At block 1806, the transmitting wireless communication device may cancel an automatic gain control transmission of the sidelink transmission on the automatic gain control symbol of the sidelink transmission in the overlapping frequency resources. In some examples, the transmitting wireless communication device may further cancel the sidelink transmission in a portion of the non-overlapping frequency resources contiguous with the overlapping frequency resources. In some examples, the wireless communication device may puncture the automatic gain control transmission in the overlapping frequency resources. For example, the sidelink cancellation circuitry 1544, together with the communication and processing circuitry 1542 and transceiver 1510, shown and described above in connection with FIG. 15 may provide a means to cancel an automatic gain control transmission of the sidelink transmission on the automatic gain control symbol in the overlapping frequency resources.

At block 1808, the transmitting wireless communication device may boost a transmission power of the automatic gain control transmission of the sidelink transmission transmitted on non-overlapping frequency resources of the frequency resources on the automatic gain control symbol. For example, the sidelink cancellation circuitry 1544, together with the power source 1530, shown and described above in connection with FIG. 15 may boost the transmission power of the sidelink transmission.

At block 1810, the transmitting wireless communication device may transmit the automatic gain control transmission via non-overlapping frequency resources of the frequency resources on the automatic gain control symbol. In some examples, the automatic gain control transmission includes a preconfigured narrowband reference signal for automatic gain control training. For example, the sidelink cancellation circuitry 1544, together with the communication and processing circuitry 1542 and transceiver 1510, shown and described above in connection with FIG. 15 may provide a means to transmit the automatic gain control transmission via the non-overlapping frequency resources on the automatic gain control symbol.

At block 1812, the transmitting wireless communication device may transmit a remainder of the sidelink transmission via all of the frequency resources on a remainder of the time resources. For example, the sidelink cancellation circuitry 1544, together with the communication and processing circuitry 1542 and transceiver 1510, shown and described above in connection with FIG. 15 may provide a means to transmit the remainder of the sidelink transmission.

Figure 19:
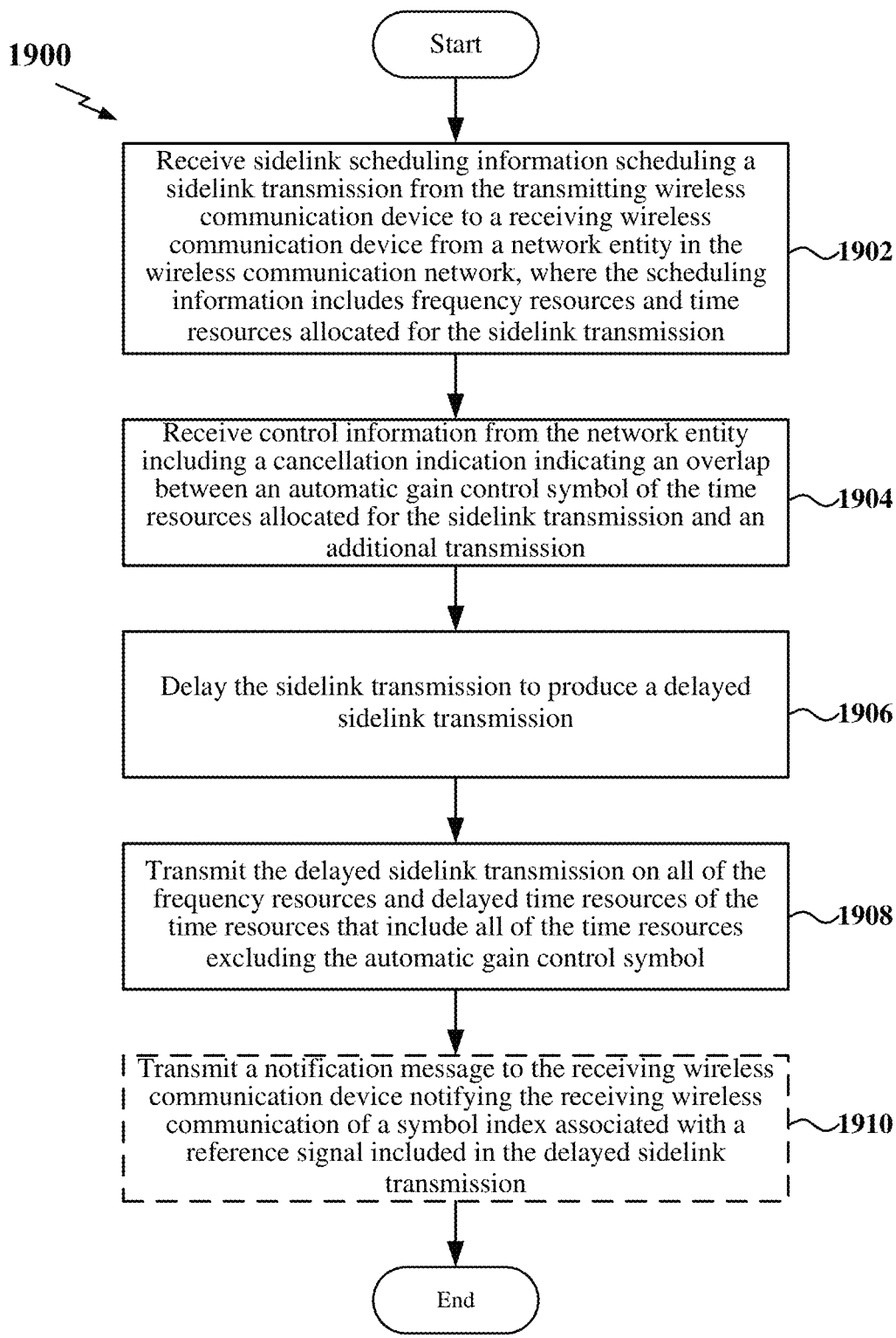
FIG. 19 is a flow chart of another exemplary method for sidelink cancellation of an automatic gain control symbol at a wireless communication device according to some aspects.

FIG. 19 is a flow chart of another exemplary method 1900 for sidelink cancellation of an automatic gain control symbol according to some aspects. As described below, some or all illustrated features may be omitted in a particular implementation within the scope of the present disclosure, and some illustrated features may not be required for implementation of all examples. In some examples, the method may be performed by the wireless communication device 1500, as described above and illustrated in FIG. 15, by a processor or processing system, or by any suitable means for carrying out the described functions.

At block 1902, the wireless communication device (e.g., a transmitting wireless communication device configured for sidelink communication) may receive sidelink scheduling information scheduling a sidelink transmission from the transmitting wireless communication device to a receiving wireless communication device from a network entity (e.g., a base station, such as a gNB) in the wireless communication network. The scheduling information can include frequency resources and time resources allocated for the sidelink transmission. In some examples, the sidelink scheduling information may be received within DCI 3_0. For example, the communication and processing circuitry 1542 and transceiver 1510, shown and described above in connection with FIG. 15, may provide a means to receive the sidelink scheduling information.

At block 1904, the transmitting wireless communication device may receive control information from the network entity including a cancellation indication indicating an overlap between an automatic gain control (AGC) symbol of the time resources allocated for the sidelink transmission and an additional transmission. In some examples, the control information includes downlink control information (DCI) format 2_4 or a new DCI format. In some examples, the control information further includes cancellation behavior information associated with the cancellation indication. For example, the communication and processing circuitry 1542 and transceiver 1510, shown and described above in connection with FIG. 15, may provide a means to receive the control information including the cancellation indication.

At block 1906, the transmitting wireless communication device may delay the sidelink transmission to produce a delayed sidelink transmission. In some examples, the transmitting wireless communication device may cancel an automatic gain control transmission of the sidelink transmission. In some examples, the transmitting wireless communication device may puncture a portion of the sidelink transmission to produce the delayed sidelink transmission. For example, the sidelink cancellation circuitry 1544, together with the communication and processing circuitry 1542, shown and described above in connection with FIG. 15 may provide a means to delay the sidelink transmission to produce the delayed sidelink transmission.

At block 1908, the transmitting wireless communication device may transmit the delayed sidelink transmission on all of the frequency resources and delayed time resources of the time resources that include all of the time resources excluding the automatic gain control symbol. In some examples, the transmitting wireless communication device may align the sidelink transmission with other sidelink transmissions transmitted via the delayed time resources. For example, the sidelink cancellation circuitry 1544, together with the communication and processing circuitry 1542 and transceiver 1510, shown and described above in connection with FIG. 15 may provide a means to transmit the delayed sidelink transmission.

At block 1910, the transmitting wireless communication device may optionally transmit a notification message to the receiving wireless communication device notifying the receiving wireless communication device of a symbol index associated with a reference signal included in the delayed sidelink transmission. In some examples, the delayed sidelink transmission includes a reference signal generated based on an original symbol index of the reference signal in the time resources. In this example, the notification message includes the original symbol index associated with the reference signal. In other examples, the transmitting wireless communication device may re-generate a reference signal for the delayed sidelink transmission based on a new symbol index of the reference signal in the delayed time resources. In this example, the notification message includes the new symbol index associated with the reference signal. For example, the sidelink cancellation circuitry 1544, together with the communication and processing circuitry 1542 and transceiver 1510, shown and described above in connection with FIG. 15 may provide a means to transmit the notification message.

In one configuration, the wireless communication device 1500 includes means for receiving sidelink scheduling information scheduling a sidelink transmission from the transmitting wireless communication device to a receiving wireless communication device from a network entity in the wireless communication network, wherein the scheduling information comprises frequency resources and time resources allocated for the sidelink transmission, as described in the present disclosure. The wireless communication device 1500 further includes means for receiving control information from the network entity, the control information comprising a cancellation indication indicating an overlap between an automatic gain control symbol of the time resources allocated for the sidelink transmission and an additional transmission and means for selectively transmitting the sidelink transmission based on the cancellation indication. In one aspect, the aforementioned means may be the processor 1504 shown in FIG. 15 configured to perform the functions recited by the aforementioned means. In another aspect, the aforementioned means may be a circuit or any apparatus configured to perform the functions recited by the aforementioned means.

Of course, in the above examples, the circuitry included in the processor 1504 is merely provided as an example, and other means for carrying out the described functions may be included within various aspects of the present disclosure, including but not limited to the instructions stored in the computer-readable storage medium 1506, or any other suitable apparatus or means described in any one of the FIGS. 1, 3, 6, and/or 7, and utilizing, for example, the processes and/or algorithms described herein in relation to FIG. 16-19.

Figure 20:
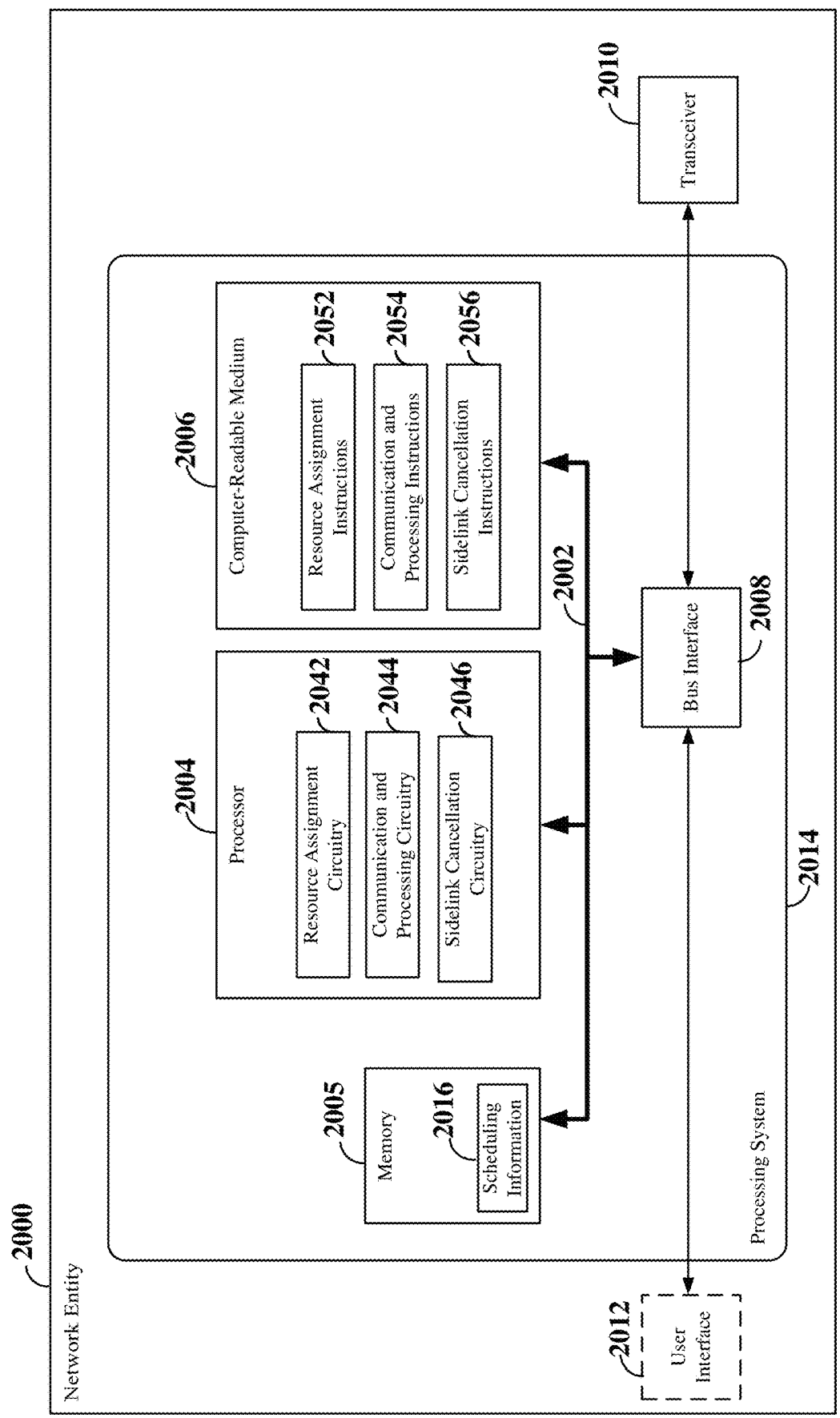
FIG. 20 is a block diagram illustrating an example of a hardware implementation for a network entity employing a processing system according to some aspects.

FIG. 20 is a conceptual diagram illustrating an example of a hardware implementation for an exemplary network entity 2000 employing a processing system 2014. For example, the network entity 2000 may correspond to any of the base stations (e.g., gNBs) or scheduling entities shown in any one or more of FIGS. 1, 3, 6, 7 and/or 13-15.

In accordance with various aspects of the disclosure, an element, or any portion of an element, or any combination of elements may be implemented with a processing system 2014 that includes one or more processors 2004. The processing system 2014 may be substantially the same as the processing system 1514 illustrated in FIG. 15, including a bus interface 2008, a bus 2002, memory 2005, a processor 2004, and a computer-readable medium 2006. Furthermore, the network entity 2000 may include an optional user interface 2012 and a transceiver 2010. The processor 2004, as utilized in a network entity 2000, may be used to implement any one or more of the processes described below.

The processor 2004 may include resource assignment and scheduling circuitry 2042, configured to generate, schedule, and modify a resource assignment or grant of time-frequency resources (e.g., a set of one or more resource elements). For example, the resource assignment and scheduling circuitry 2042 may be configured to allocate/schedule resources for a sidelink transmission from a transmitting wireless communication device to a receiving wireless communication device. The resource assignment and scheduling circuitry 2042 may further schedule resources for an additional transmission (e.g., an uplink transmission, such as a PUSCH or SRS, or an additional sidelink transmission). In some examples, at least a portion of the resources allocated to the sidelink transmission may overlap with the resources scheduled for the additional transmission. The resource assignment and scheduling circuitry 2042 may further schedule control information including a cancellation indication indicating an overlap between the portion of the resources allocated to the sidelink transmission and the additional transmission. In addition, the resource assignment and scheduling circuitry 2042 may further schedule resources for the transmission of a preemption indication from the transmitting wireless communication device to the receiving wireless communication device. The resource assignment and scheduling circuitry 2042 may further be configured to execute resource assignment and scheduling instructions (software) 2052 stored in the computer-readable medium 2006 to implement one or more of the functions described herein.

The processor 2004 may further include communication and processing circuitry 2044 configured to communicate with at least the transmitting wireless communication device via a Uu link. The communication and processing circuitry 2044 may further be configured to communicate with the receiving wireless communication device via a Uu link. In some examples, the communication and processing circuitry 2044 may include one or more hardware components that provide the physical structure that performs processes related to wireless communication (e.g., signal reception and/or signal transmission) and signal processing (e.g., processing a received signal and/or processing a signal for transmission). For example, the communication and processing circuitry 2044 may include one or more transmit/receive chains.

In some implementations where the communication involves receiving information, the communication and processing circuitry 2044 may obtain information from a component of the network entity 2000 (e.g., from the transceiver 2010 that receives the information via radio frequency signaling or some other type of signaling suitable for the applicable communication medium), process (e.g., decode) the information, and output the processed information. For example, the communication and processing circuitry 2044 may output the information to another component of the processor 2004, to the memory 2005, or to the bus interface 2008. In some examples, the communication and processing circuitry 2044 may receive one or more of signals, messages, other information, or any combination thereof. In some examples, the communication and processing circuitry 2044 may receive information via one or more channels. In some examples, the communication and processing circuitry 2044 may include functionality for a means for receiving. In some examples, the communication and processing circuitry 2044 may include functionality for a means for processing, including a means for demodulating, a means for decoding, etc.

In some implementations where the communication involves sending (e.g., transmitting) information, the communication and processing circuitry 2044 may obtain information (e.g., from another component of the processor 2004, the memory 2005, or the bus interface 2008), process (e.g., modulate, encode, etc.) the information, and output the processed information. For example, the communication and processing circuitry 2044 may output the information to the transceiver 2010 (e.g., that transmits the information via radio frequency signaling or some other type of signaling suitable for the applicable communication medium). In some examples, the communication and processing circuitry 2044 may send one or more of signals, messages, other information, or any combination thereof. In some examples, the communication and processing circuitry 2044 may send information via one or more channels. In some examples, the communication and processing circuitry 2044 may include functionality for a means for sending (e.g., a means for transmitting). In some examples, the communication and processing circuitry 2044 may include functionality for a means for generating, including a means for modulating, a means for encoding, etc.

The communication and processing circuitry 2044 may be configured to transmit sidelink scheduling information 2016 scheduling a sidelink transmission from a transmitting wireless communication device to a receiving wireless communication device to at least the transmitting wireless communication device. The scheduling information 2016 may include, for example, scheduled resources for the sidelink transmission and/or a cast type (e.g., unicast, groupcast, or broadcast) of the sidelink transmission. The sidelink scheduling information 2016 may be transmitted, for example, via downlink control information (DCI) format 3_0. In some examples, the communication and processing circuitry 2044 may store the scheduling information 2016 within, for example, memory 2005.

The communication and processing circuitry 2044 may further be configured to transmit control information including a cancellation indication to at least the transmitting wireless communication device. For example, the communication and processing circuitry 2044 may transmit the control information to only the transmitting wireless communication device or to both the transmitting wireless communication device and the receiving wireless communication device. In some examples, the communication and processing circuitry 2044 may transmit separate control information including the cancellation indication to the receiving wireless communication device. In some examples, each control information may include DCI format 2_4 or a new DCI format.

In some examples, the cancellation indication may indicate preemption information utilized by the receiving wireless communication device in processing the sidelink transmission. For example, the preemption information may include at least one of resource information identifying overlapping resources between the sidelink transmission and the additional transmission, a symbol index offset for a demodulation reference signal, a delayed transmission indication, a puncturing pattern of the sidelink transmission, a rate matching pattern of the sidelink transmission, or a power control parameter.

In some examples, the cancellation indication may indicate an overlap between an automatic gain control symbol of the time resources allocated for the sidelink transmission (e.g., based on the stored scheduling information 2016 for the sidelink transmission) and the additional transmission. Thus, the cancellation indication may indicate at least overlapping resources between the scheduled resources for the AGC symbol of the sidelink transmission and additional resources scheduled for the additional transmission. For example, the cancellation indication may include resource information identifying at least the portion of the resources (e.g., the overlapping resources). In some examples, the resource information may include a plurality of bits, each corresponding to a resource block group of a plurality of resource block groups and a symbol of a plurality of symbols. In some examples, each bit maps to either an uplink symbol or a flexible symbol. In other examples, each bit maps to only an uplink symbol.

In some examples, the control information may further include preemption scheduling information for the preemption indication to be transmitted from the transmitting wireless communication device to the receiving wireless communication device. In some examples, the preemption scheduling information may schedule transmission of the preemption indication within a retransmission resource for the sidelink transmission, first stage sidelink control information, second stage sidelink control information, a sidelink medium access control (MAC) control element (MAC-CE), or a sidelink radio resource control (RRC) message.

In some examples, the control information may further include cancellation behavior information associated with the cancellation indication that indicates a cancellation behavior that the transmitting wireless communication device should apply to at least the AGC symbol of the sidelink transmission. The communication and processing circuitry 2044 may further be configured to execute communication and processing instructions (software) 2054 stored in the computer-readable medium 2006 to implement one or more of the functions described herein.

The processor 2004 may further include sidelink cancellation circuitry 2046, configured to generate the control information including the cancellation indication. In some examples, the sidelink cancellation circuitry 2046 may further be configured to generate the resource information identifying at least the portion of the resources allocated to the AGC symbol of the sidelink transmission and to include the resource information in the control information. In addition, the sidelink cancellation circuitry 2046 may further be configured to generate cancellation behavior associated with the cancellation indication and to transmit the cancellation behavior in the control information (e.g., as the cancellation behavior information) and/or via RRC signaling to at least the transmitting wireless communication device. The sidelink cancellation circuitry 2046 may further be configured to execute sidelink cancellation instructions (software) 2056 stored in the computer-readable medium 2006 to implement one or more of the functions described herein.

The processes shown in FIGS. 16-19 may include additional aspects, such as any single aspect or any combination of aspects described below and/or in connection with one or more other processes described elsewhere herein.

Aspect 1: A method for wireless communication at a transmitting wireless communication device in a wireless communication network, the method comprising: receiving sidelink scheduling information scheduling a sidelink transmission from the transmitting wireless communication device to a receiving wireless communication device from a network entity in the wireless communication network, wherein the scheduling information comprises frequency resources and time resources allocated for the sidelink transmission; receiving control information from the network entity, the control information comprising a cancellation indication indicating an overlap between an automatic gain control symbol of the time resources allocated for the sidelink transmission and an additional transmission; and selectively transmitting the sidelink transmission to the receiving wireless communication device based on the cancellation indication.

Aspect 2: The method of aspect 1, wherein the selectively transmitting the sidelink transmission further comprises: transmitting the sidelink transmission comprising the automatic gain control symbol on all of the frequency resources and all of the time resources allocated for the sidelink transmission.

Aspect 3: The method of aspect 1, wherein the overlap comprises overlapping frequency resources of the frequency resources, and wherein the selectively transmitting the sidelink transmission further comprises: cancelling the sidelink transmission in the overlapping frequency resources on all of the time resources; and transmitting the sidelink transmission via non-overlapping frequency resources on all of the time resources.

Aspect 4: The method of aspect 3, wherein the cancelling the sidelink transmission in the overlapping frequency resources further comprises: cancelling the sidelink transmission in the overlapping frequency resources based on a frequency granularity associated with the sidelink transmission.

Aspect 5: The method of aspect 3 or 4, wherein the non-overlapping frequency resources comprises discontiguous frequency resources occupying a discontiguous resource percentage of the frequency resources, and wherein the transmitting the sidelink transmission via the non-overlapping frequency resources further comprising: transmitting the sidelink transmission via the non-overlapping frequency resources on all of the time resources in response to the discontiguous resource percentage being less than a threshold.

Aspect 6: The method of aspect 5, further comprising: reducing a transmission power of the sidelink transmission based on the discontiguous frequency resources.

Aspect 7: The method of aspect 3 or 4, further comprising: cancelling the sidelink transmission in a portion of the non-overlapping frequency resources contiguous with the overlapping frequency resources.

Aspect 8: The method of aspect 3, 4, or 7, further comprising: boosting a transmission power of the sidelink transmission transmitted on the non-overlapping frequency resources.

Aspect 9: The method of any of aspects 3 through 8, further comprising: re-generating a waveform of the sidelink transmission based on the non-overlapping frequency resources.

Aspect 10: The method of aspect 1, wherein the selectively transmitting the sidelink transmission further comprises: cancelling the sidelink transmission on all of the frequency resources and all of the time resources.

Aspect 11: The method of aspect 10, wherein the cancelling the sidelink transmission on all of the frequency resources and all of the time resources further comprises: cancelling the sidelink transmission on all of the frequency resources and all of the time resources based on a time difference between a control symbol comprising the cancellation indication and the automatic gain control symbol of the sidelink transmission.

Aspect 12: The method of any of aspects 1 through 10, wherein the selectively transmitting the sidelink transmission further comprises: selectively transmitting the sidelink transmission based on at least one of a resource allocation mode of the receiving wireless communication device or a cast type of the sidelink transmission.

Aspect 13: The method of aspect 1, wherein the overlap comprises overlapping frequency resources of the frequency resources on the automatic gain control symbol, and wherein the selectively transmitting the sidelink transmission further comprises: cancelling an automatic gain control transmission of the sidelink transmission on the automatic gain control symbol of the sidelink transmission in the overlapping frequency resources; transmitting the automatic gain control transmission via non-overlapping frequency resources of the frequency resources on the automatic gain control symbol; and transmitting a remainder of the sidelink transmission via all of the frequency resources on a remainder of the time resources.

Aspect 14: The method of aspect 13, wherein the cancelling the automatic gain control transmission further comprises: puncturing the automatic gain control transmission in the overlapping frequency resources.

Aspect 15: The method of aspect 13, wherein the automatic gain control transmission comprises a preconfigured narrowband reference signal for automatic gain control training.

Aspect 16: The method of any of aspects 13 through 15, further comprising: cancelling the automatic gain control transmission in a portion of the non-overlapping frequency resources contiguous with the overlapping frequency resources.

Aspect 17: The method of any of aspects 13 through 16, further comprising: boosting a transmission power of the automatic gain control transmission transmitted on the non-overlapping frequency resources.

Aspect 18: The method of aspect 1, wherein the selectively transmitting the sidelink transmission further comprises: delaying the sidelink transmission to produce a delayed sidelink transmission; and transmitting the delayed sidelink transmission on all of the frequency resources and delayed time resources of the time resources, wherein the delayed time resources comprise all of the time resources excluding the automatic gain control symbol.

Aspect 19: The method of aspect 18, further comprising: cancelling an automatic gain control transmission of the sidelink transmission.

Aspect 20: The method of aspect 18, further comprising: aligning the sidelink transmission with other sidelink transmissions transmitted via the delayed time resources.

Aspect 21: The method of aspect 18 or 20, wherein the delayed sidelink transmission comprises a reference signal generated based on an original symbol index of the reference signal in the time resources, and further comprising: transmitting a notification message to the receiving wireless communication device notifying the receiving wireless communication of the original symbol index associated with the reference signal.

Aspect 22: The method of aspect 18 or 20, further comprising: re-generating a reference signal for the sidelink transmission based on a new symbol index of the reference signal in the delayed time resources, and further comprising: transmitting a notification message to the receiving wireless communication device notifying the receiving wireless communication of the new symbol index associated with the reference signal.

Aspect 23: The method of any of aspects 18, 21, or 22, wherein the delaying the sidelink transmission further comprises: puncturing a portion of the sidelink transmission to produce the delayed sidelink transmission.

Aspect 24: The method of any of aspects 1 through 23, wherein the control information further comprises cancellation behavior information associated with the cancellation indication, and further comprising: applying a cancellation behavior to at least the automatic gain control symbol based on the cancellation behavior information.

Aspect 25: An apparatus in a wireless communication network comprising a transceiver, a memory, and a processor coupled to the transceiver and the memory, the processor and the memory configured to perform a method of any one of examples 1 through 24.

Aspect 26: An apparatus configured for wireless communication comprising means for performing a method of any one of examples 1 through 24.

Aspect 27: An article of manufacture comprising a non-transitory computer-readable medium having stored therein instructions executable by one or more processors of a wireless communication device in a wireless communication network to perform a method of any one of examples 1 through 24.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-20 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1, 3, 6, 7, 15, and/or 20 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A transmitting wireless communication device, comprising:
one or more memories; and
one or more processors coupled to the one or more memories, wherein the one or more processors are configured to:
receive sidelink scheduling information scheduling a sidelink transmission from the transmitting wireless communication device to a receiving wireless communication device from a network entity, wherein the sidelink scheduling information comprises frequency resources and time resources allocated for the sidelink transmission;
receive control information from the network entity, the control information comprising a cancellation indication indicating an overlap between an automatic gain control symbol of the time resources allocated for the sidelink transmission and an additional transmission, wherein the automatic gain control symbol is a first symbol of a plurality of symbols of the time resources and comprises a copy of a second symbol of the plurality of symbols; and
selectively transmit the sidelink transmission to the receiving wireless communication device based on the cancellation indication.

2. The transmitting wireless communication device of claim 1, wherein the one or more processors are further configured to:
transmit the sidelink transmission comprising the automatic gain control symbol on all of the frequency resources and all of the time resources allocated for the sidelink transmission.

3. The transmitting wireless communication device of claim 1, wherein the overlap comprises overlapping frequency resources of the frequency resources, and wherein the one or more processors are further configured to:
cancel the sidelink transmission in the overlapping frequency resources on all of the time resources; and
transmit the sidelink transmission via non-overlapping frequency resources on all of the time resources.

4. The transmitting wireless communication device of claim 3, wherein the one or more processors are further configured to:
  cancel the sidelink transmission in the overlapping frequency resources based on a frequency granularity associated with the sidelink transmission.

5. The transmitting wireless communication device of claim 3, wherein the non-overlapping frequency resources comprises discontiguous frequency resources occupying a discontiguous resource percentage of the frequency resources, and wherein the one or more processors are further configured to:
  transmit the sidelink transmission via the non-overlapping frequency resources on all of the time resources in response to the discontiguous resource percentage being less than a threshold.

6. The transmitting wireless communication device of claim 5, wherein the one or more processors are further configured to:
  reduce a transmission power of the sidelink transmission based on the discontiguous frequency resources.

7. The transmitting wireless communication device of claim 3, wherein the one or more processors are further configured to:
  cancel the sidelink transmission in a portion of the non-overlapping frequency resources contiguous with the overlapping frequency resources.

8. The transmitting wireless communication device of claim 3, wherein the one or more processors are further configured to:
  boost a transmission power of the sidelink transmission transmitted on the non-overlapping frequency resources.

9. The transmitting wireless communication device of claim 3, wherein the one or more processors are further configured to:
  re-generate a waveform of the sidelink transmission based on the non-overlapping frequency resources.

10. The transmitting wireless communication device of claim 1, wherein the one or more processors are further configured to:
  cancel the sidelink transmission on all of the frequency resources and all of the time resources.

11. The transmitting wireless communication device of claim 10, wherein the one or more processors are further configured to:
  cancel the sidelink transmission on all of the frequency resources and all of the time resources based on a time difference between a control symbol comprising the cancellation indication and the automatic gain control symbol of the sidelink transmission.

12. The transmitting wireless communication device of claim 1, wherein the one or more processors are further configured to:
  selectively transmit the sidelink transmission based on at least one of a resource allocation mode of the receiving wireless communication device or a cast type of the sidelink transmission.

13. The transmitting wireless communication device of claim 1, wherein the overlap comprises overlapping frequency resources of the frequency resources on the automatic gain control symbol, and wherein the one or more processors are further configured to:
  cancel an automatic gain control transmission of the sidelink transmission on the automatic gain control symbol of the sidelink transmission in the overlapping frequency resources;
  transmit the automatic gain control transmission via non-overlapping frequency resources of the frequency resources on the automatic gain control symbol; and
  transmit a remainder of the sidelink transmission via all of the frequency resources on a remainder of the time resources.

14. The transmitting wireless communication device of claim 13, wherein the one or more processors are further configured to:
  puncture the automatic gain control transmission in the overlapping frequency resources.

15. The transmitting wireless communication device of claim 13, wherein the automatic gain control transmission comprises a preconfigured narrowband reference signal for automatic gain control training.

16. The transmitting wireless communication device of claim 13, wherein the one or more processors are further configured to:
  cancel the automatic gain control transmission in a portion of the non-overlapping frequency resources contiguous with the overlapping frequency resources.

17. The transmitting wireless communication device of claim 13, wherein the one or more processors are further configured to:
  boost a transmission power of the automatic gain control transmission transmitted on the non-overlapping frequency resources.

18. The transmitting wireless communication device of claim 1, wherein the one or more processors are further configured to:
  delay the sidelink transmission to produce a delayed sidelink transmission; and
  transmit the delayed sidelink transmission on all of the frequency resources and delayed time resources of the time resources, wherein the delayed time resources comprise all of the time resources excluding the automatic gain control symbol.

19. The transmitting wireless communication device of claim 18, wherein the one or more processors are further configured to:
  cancel an automatic gain control transmission of the sidelink transmission.

20. The transmitting wireless communication device of claim 18, wherein the one or more processors are further configured to:
  align the sidelink transmission with other sidelink transmissions transmitted via the delayed time resources.

21. The transmitting wireless communication device of claim 18, wherein the delayed sidelink transmission comprises a reference signal generated based on an original symbol index of the reference signal in the time resources, and wherein the one or more processors are further configured to:
  transmit a notification message to the receiving wireless communication device notifying the receiving wireless communication device of the original symbol index associated with the reference signal.

22. The transmitting wireless communication device of claim 18, wherein the one or more processors are further configured to:
  re-generate a reference signal for the delayed sidelink transmission based on a new symbol index of the reference signal in the delayed time resources; and
  transmit a notification message to the receiving wireless communication device notifying the receiving wireless communication device of the new symbol index associated with the reference signal.

23. The transmitting wireless communication device of claim 18, wherein the one or more processors are further configured to:
    puncture a portion of the sidelink transmission to produce the delayed sidelink transmission.

24. The transmitting wireless communication device of claim 1, wherein the control information further comprises cancellation behavior information associated with the cancellation indication, and wherein the one or more processors are further configured to:
    apply a cancellation behavior to at least the automatic gain control symbol based on the cancellation behavior information.

25. A method for wireless communication at a transmitting wireless communication device in a wireless communication network, the method comprising:
    receiving sidelink scheduling information scheduling a sidelink transmission from the transmitting wireless communication device to a receiving wireless communication device from a network entity in the wireless communication network, wherein the sidelink sidelink scheduling information comprises frequency resources and time resources allocated for the sidelink transmission;
    receiving control information from the network entity, the control information comprising a cancellation indication indicating an overlap between an automatic gain control symbol of the time resources allocated for the sidelink transmission and an additional transmission, wherein the automatic gain control symbol is a first symbol of a plurality of symbols of the time resources and comprises a copy of a second symbol of the plurality of symbols; and
    selectively transmitting the sidelink transmission to the receiving wireless communication device based on the cancellation indication.

26. The method of claim 25, wherein the overlap comprises overlapping frequency resources of the frequency resources, and wherein the selectively transmitting the sidelink transmission further comprises:
    cancelling the sidelink transmission in the overlapping frequency resources on all of the time resources; and
    transmitting the sidelink transmission via non-overlapping frequency resources on all of the time resources.

27. The method of claim 25, wherein the selectively transmitting the sidelink transmission further comprises:
    cancelling the sidelink transmission on all of the frequency resources and all of the time resources based on a time difference between a control symbol comprising the cancellation indication and the automatic gain control symbol of the sidelink transmission.

28. The method of claim 25, wherein the overlap comprises overlapping frequency resources of the frequency resources on the automatic gain control symbol, and wherein the selectively transmitting the sidelink transmission further comprises:
    cancelling an automatic gain control transmission of the sidelink transmission on the automatic gain control symbol of the sidelink transmission in the overlapping frequency resources;
    transmitting the automatic gain control transmission via non-overlapping frequency resources of the frequency resources on the automatic gain control symbol; and
    transmitting a remainder of the sidelink transmission via all of the frequency resources on a remainder of the time resources.

29. The method of claim 25, wherein the selectively transmitting the sidelink transmission further comprises:
    delaying the sidelink transmission to produce a delayed sidelink transmission; and
    transmitting the delayed sidelink transmission on all of the frequency resources and delayed time resources of the time resources, wherein the delayed time resources comprise all of the time resources excluding the automatic gain control symbol.

30. A transmitting wireless communication device in a wireless communication network, comprising:
    means for receiving sidelink scheduling information scheduling a sidelink transmission from the transmitting wireless communication device to a receiving wireless communication device from a network entity in the wireless communication network, wherein the sidelink scheduling information comprises frequency resources and time resources allocated for the sidelink transmission;
    means for receiving control information from the network entity, the control information comprising a cancellation indication indicating an overlap between an automatic gain control symbol of the time resources allocated for the sidelink transmission and an additional transmission, wherein the automatic gain control symbol is a first symbol of a plurality of symbols of the time resources and comprises a copy of a second symbol of the plurality of symbols; and
    means for selectively transmitting the sidelink transmission to the receiving wireless communication device based on the cancellation indication.

* * * * *